(12) United States Patent
Itonaga

(10) Patent No.: US 8,878,116 B2
(45) Date of Patent: Nov. 4, 2014

(54) METHOD OF MANUFACTURING SOLID-STATE IMAGING ELEMENT, SOLID-STATE IMAGING ELEMENT AND ELECTRONIC APPARATUS

(75) Inventor: Kazuichiro Itonaga, Tokyo (JP)

(73) Assignee: Sony Corporation (JP)

( * ) Notice: Subject to any disclaimer, the term of this patent is extended or adjusted under 35 U.S.C. 154(b) by 351 days.

(21) Appl. No.: 13/399,113

(22) Filed: Feb. 17, 2012

(65) Prior Publication Data

US 2012/0217606 A1 Aug. 30, 2012

(30) Foreign Application Priority Data

Feb. 28, 2011 (JP) .................. 2011-042447
Feb. 28, 2011 (JP) .................. 2011-043014
Feb. 28, 2011 (JP) .................. 2011-043015

(51) Int. Cl.
*H01L 27/00* (2006.01)
*H01L 21/00* (2006.01)
*H01L 31/0203* (2014.01)
*H01L 27/146* (2006.01)

(52) U.S. Cl.
CPC ....... *H01L 31/0203* (2013.01); *H01L 27/14618* (2013.01)
USPC .............. 250/208.1; 438/64; 438/69; 438/71

(58) Field of Classification Search
CPC .................. H01L 27/14601; H01L 27/14687; H01L 27/1469; H01L 27/14683
USPC .............................. 250/208.1; 438/64, 69, 71
See application file for complete search history.

(56) References Cited

U.S. PATENT DOCUMENTS 7,390,687 B2 * 6/2008 Boettiger et al. ............... 438/64

FOREIGN PATENT DOCUMENTS

| JP | 2003-243635 | 8/2003 |
| JP | 2004-146633 | 5/2004 |

* cited by examiner

*Primary Examiner* — Thanh Luu
(74) *Attorney, Agent, or Firm* — Sheridan Ross P.C.

(57) ABSTRACT

A method of manufacturing a solid-state imaging element includes: manufacturing an element chip in which photoelectric conversion units are arranged on a main surface side; preparing a base configured using a material with an expansion coefficient greater than the element chip and having an opening of which the periphery of the opening is shaped as a flat surface; expanding the base by heating, mounting the element chip on the flat surface of the base in a state where the opening of the base is covered; and three-dimensionally curving a portion corresponding to the opening in the element chip by cooling and contracting the base in a state where the element chip is fixed to the flat surface of the expanded base.

10 Claims, 36 Drawing Sheets

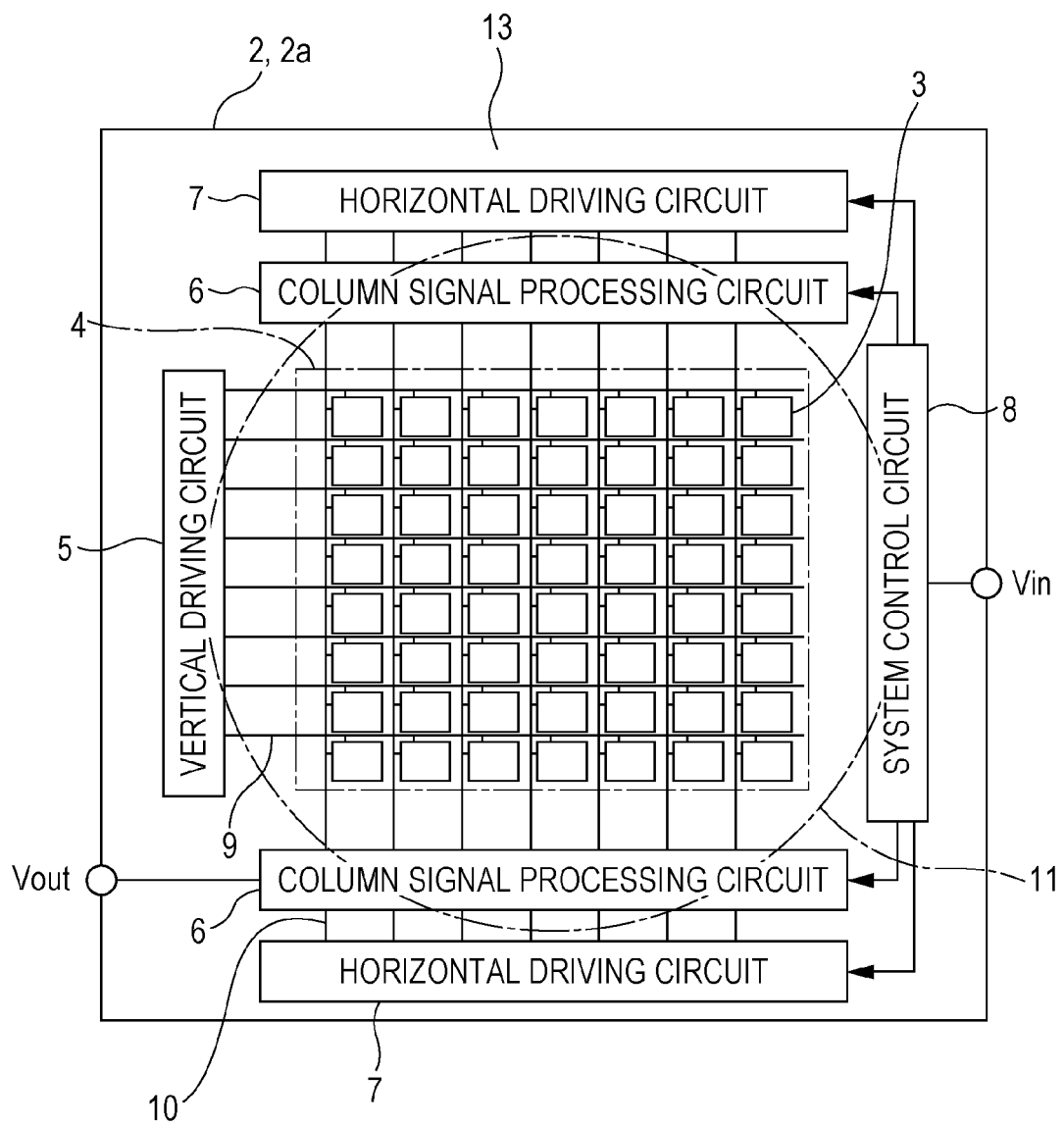

METHOD OF MANUFACTURING SOLID-STATE IMAGING ELEMENT, SOLID-STATE IMAGING ELEMENT AND ELECTRONIC APPARATUS

BACKGROUND

The present disclosure relates to a method of manufacturing a solid-state imaging element in which photoelectric conversion units are arranged on a curved surface curved three-dimensionally, a solid-state imaging element obtained by such a method of manufacturing, and electronic apparatus provided with such a solid-state imaging element.

Further, the present technique relates to a solid-state imaging apparatus and an electronic apparatus such as a camera provided with the solid-state imaging apparatus.

In imaging devices such as cameras in which a solid-state imaging element and an imaging lens are combined, the imaging lens is configured so as to be arranged on the light-receiving surface side of the solid-state imaging element. In such an imaging device, when a subject is imaged by the imaging lens, focus position deviation is generated in the center and peripheral parts of the imaging surface due to lens aberration called field curvature. Thus, a configuration has been proposed in which, depending on the field curvature of the imaging lens, a curved surface curved three-dimensionally is formed and photoelectric conversion units are arranged with this curved surface as the imaging surface (light-receiving surface) of the solid-state imaging element. In this manner, the importance of the correction of the field curvature (lens aberration) is eliminated by the combination of a plurality of lenses. As a method of manufacturing a solid-state imaging element in which photoelectric conversion units are arranged on a curved surface in such a manner, the following two methods have been disclosed, for example.

The first method has a curved surface in an element distribution region and uses a package main body in which suction holes are formed at a bottom portion. In such a case, solid-state imaging elements are arranged to face each other on a curved surface coated with a fixing agent, attached to the curved surface by reducing the pressure of the interval portion between the solid-state imaging elements and the curved surface through the suction holes, and fixed with the fixing agent (for further details, refer to Japanese Unexamined Patent Application Publication No. 2003-243635 (in particular, paragraphs 0013 to 0014 and FIG. 2) described below).

The second method has an opening portion and uses a wiring substrate formed using a material having a thermal expansion coefficient greater than the solid-state imaging elements. In this case, first, the wiring substrate and the solid-state imaging elements are bonded through protrusion electrodes. Then, the contraction coefficient of the wiring substrate becomes greater than the contraction coefficient of the solid-state imaging elements due to the cooling action after heating and cooling, whereby compressive force is applied to the solid-state imaging elements due to the difference in the contraction coefficient and the solid-state imaging elements are caused to curve (for further details, refer to Japanese Unexamined Patent Application Publication No. 2004-146633 (in particular, paragraphs 0017 to 0020 and FIG. 1) described below).

The electronic apparatus having an imaging function such as a camera combining a solid-state imaging apparatus (image sensor) and an imaging lens is configured with the imaging lens arranged on the light receiving surface of the solid-state imaging apparatus. In this kind of imaging apparatus, when a subject is imaged by the imaging lens, deviation of the focus position is generated at the center portion and peripheral portion of the imaging surface due to imaging surface curvature called lens aberration. Here, configurations in which a curved surface curved three-dimensionally according to the imaging surface curvature of the imaging lens is formed, and this curved surface is set as an imaging surface (light receiving surface) of the solid-state imaging apparatus, and a photoelectric conversion unit is arranged have been proposed (for example, refer to Japanese Unexamined Patent Application Publication No. 2003-188366, Japanese Unexamined Patent Application Publication No. 2003-243635, and Japanese Unexamined Patent Application Publication No. 2004-146633). In this manner, correction of the imaging surface curvature using a combination of several lenses may be avoided.

On the other hand, there are imaging apparatuses provided with a zoom lens and capable of zoom imaging. Hitherto, imaging apparatuses capable of zoom imaging have been configured provided with a solid-state imaging apparatus having a flat imaging surface and a zoom lens formed of a plurality of lens groups.

SUMMARY

However, in either of the above-described first and second methods, the entire chip configuring the solid-state imaging elements is curved. Therefore, in these methods, stress is applied to the peripheral edge of the chip which is made to have a rough surface as a result of being divided by dicing, whereby cracks are easily generated in the chip from the peripheral edge portion side.

Thus, it is desirable to provide a method of manufacturing solid-state imaging elements in which it is possible to leave flat portions in the periphery of the curved portion in which the imaging region is curved three-dimensionally, whereby damage such as cracks is not easily generated. It is further desirable to provide a solid-state imaging element obtained by such a method of manufacturing, which is a highly reliable solid-state imaging element in which the generation of damage such as cracks is prevented even when a three-dimensional curved portion is provided, and electronic apparatus using this solid-state imaging element.

A method of manufacturing a solid-state imaging element according to an embodiment of the present disclosure includes the following processes. First, an element chip in which photoelectric conversion units are arranged on one main side is manufactured. Further, a base, which is configured using a material having an expansion coefficient greater than the element chip and which has an opening of which the periphery is shaped as a flat portion, is prepared. Here, the base is heated and expanded and the element chip is mounted on a flat surface of the base in a state where the opening of the base is covered. Thereafter, in a state where the element chip is fixed on the flat surface of the expanded base, the portion facing the opening in the element chip is made to curve three-dimensionally due to the cooling and contraction of the base.

According to the method of manufacturing described above, in the base, only the central portion of the element chip arranged to cover the opening is curved three-dimensionally in a state in which the border of the element chip on the flat surface of the periphery of the opening is fixed. For this reason, the border portion of the element chip continuing from the peripheral edge of the curved portion becomes a flat portion fixed to the flat surface of the base. Accordingly, the border portion of the element chip is left as a flat portion to which the curve does not apply stress.

Furthermore, a solid-state imaging element of another embodiment of the present disclosure is provided with: an element chip having a curved portion curved three-dimensionally and a flat portion extended from the peripheral edge of the curved portion; and photoelectric conversion units arranged on a concave surface side in the element chip.

In addition, an electronic apparatus of still another embodiment of the present disclosure may be provided with the solid-state imaging elements configured in such a manner and is provided with an optical system which guides incident light to the photoelectric conversion units of the solid-state imaging elements.

According to embodiments of the present disclosure as described above, it is possible to cause only the central portion of the element chip, which is left as the flat portion to which the curve of the peripheral edge portion of the element chip does not apply stress, to curve three-dimensionally. Therefore, it is possible to manufacture a solid-state imaging element provided with a three-dimensional curved portion at the central portion of the element chip without generating damage such as cracks. As a result, it is possible to promote an improvement in the reliability of solid-state imaging elements provided with a three-dimensional curved portion and the electronic apparatus using the solid-state imaging element.

The method of manufacturing the solid-state imaging element of the present disclosure includes the following processes. First, an element chip in which a photoelectric conversion unit is arranged on a primary surface side is manufactured. Further, a base having an opening and with the periphery of the opening shaped as a flat surface is prepared. Here, in a state in which the opening of the base is covered and the primary surface side where the photoelectric conversion unit is arranged faces upwards, the element chip is mounted on the flat surface of the base. Thereafter, in a state where the element chip is fixed to the flat surface of the base, the volume of the inside of the opening of the base covered by the element chip is made to contract. In this manner, the element chip is three-dimensionally curved toward the opening side.

According to the above manufacturing method, in the base, in a state in which the peripheral edge of the element chip is fixed on the flat surface of the periphery of the opening, only the central portion of the element chip arranged to cover the opening is three-dimensionally curved. For this reason, the peripheral edge portion of the element chip continuing from the peripheral edge of the curved portion becomes a flat portion fixed to the flat surface of the base. Accordingly, the peripheral edge portion of the element chip remains as a flat portion to which stress due to the curvature is not applied.

Further, the solid-state imaging element of the present disclosure is provided with a base, an element chip supported by the base, and a photoelectric conversion unit provided in the element chip. The base has an opening and the periphery of the opening is shaped as a flat surface. The element chip has a curved portion in which a portion corresponding to the opening of the base is three-dimensionally curved toward the opening side and a flat portion which extends from the peripheral edge of the curved portion and is supported by the flat surface of the base. The photoelectric conversion unit is arranged on the concave curved surface side of the curved portion in the element chip.

Further, the electronic apparatus of the present disclosure is an electronic apparatus provided with a solid-state imaging element having such a configuration and is provided with an optical system guiding incident light to the photoelectric conversion unit of the solid-state imaging element.

According to embodiments of the present disclosure as described above, it is possible to leave the peripheral edge portion of the element chip as a flat portion to which no stress is applied by the curvature and cause only the central portion to curve three-dimensionally. For this reason, it is possible to manufacture a solid-state imaging element provided with a three-dimensional curved portion at the central portion of the element chip without causing damage such as cracking. As a result, it is possible to obtain an improvement in the reliability of the solid-state imaging element provided with the three-dimensional curved portion and the electronic apparatus using the solid-state imaging element.

Here, in an imaging apparatus such as a camera provided with a solid-state imaging apparatus with a reduced number of imaging lenses causing an imaging surface to curve according to the imaging surface curvature, it is preferable to include a zoom function. When imaging a wide angle subject on a curved imaging surface, since the zoom lens is moved to the imaging surface side and the incident angle of the off-axis light beam of the subject light incident to the lens is increased, the focus at the periphery of the image is deviated. Accordingly, even in wide angle imaging, it is preferable to be able to perform imaging with an appropriate focus including the image periphery. Further, in zoom imaging, it is desirable to be able to perform variable control of the imaging surface in the curved state according to the imaging surface curvature from the flat state.

It is desirable to provide a solid-state imaging apparatus suitable for zoom imaging and an electronic apparatus such as a camera provided with the solid-state imaging apparatus.

The solid-state imaging apparatus relating to the present technique is provided with a curved portion having a curve; a solid-state imaging chip having an imaging surface of a concave curved surface present inside the curved portion and a fixed flat portion extending from the peripheral edge of the curved portion; and a control unit variably controlling the curvature of the imaging surface.

In the solid-state imaging apparatus, since the curvature of the imaging surface is variably controlled by the control unit, it is possible to set the curvature of the imaging surface according to the position of the lens from the imaging surface.

The solid-state imaging apparatus relating to the present technique is provided with: a solid-state imaging chip having an imaging region which has an imaging surface that is controlled to be curved and in which a photoelectric conversion unit is arranged, and a fixed flat portion extending from the peripheral edge of a region becoming the curved portion which is controlled to be curved; and a control unit performing variable control of the curvature (including an infinitesimal amount) of the imaging region. Thus, the imaging region according to the control unit is configured to be variably controlled from the flat state to the curved state having the target curvature.

In the solid-state imaging apparatus, since the curvature (including an infinitesimal amount) of the imaging surface is variably controlled by the control unit, it is possible to set the curvature of the imaging surface according to the position of the lens from the imaging surface.

The electronic apparatus relating to the present technique is provided with a solid-state imaging apparatus, an optical lens system guiding incident light to the photoelectric conversion unit of the solid-state imaging apparatus, and a signal processing circuit processing an output signal of the solid-state imaging apparatus. The solid-state imaging apparatus is configured as a solid-state imaging apparatus provided with a curved portion having a curve; a solid-state imaging chip having an imaging surface of a concave curved surface present inside the curved portion and a flat portion extending from the peripheral edge of the curved portion; and a control unit variably controlling the curvature of the image surface. Thus, a configuration is adopted such that variable control of the curvature of the imaging surface is performed together with the variable movement of the desired optical lens in the optical lens system.

In the electronic apparatus, since the curvature (including an infinitesimal amount) of the imaging surface of the solid-state imaging apparatus is variably controlled by the control unit together with the variable movement of the desired lens in the optical lens system, it is possible to set the curvature of the imaging surface according to the position of the lens from the imaging surface. Thus, zoom imaging becomes possible.

The electronic apparatus relating to the present technique is provided with a solid-state imaging apparatus, an optical lens system guiding incident light to the photoelectric conversion unit of the solid-state imaging apparatus, and a signal processing circuit processing an output signal of the solid-state imaging apparatus. The solid-state imaging apparatus is configured as shown below.

That is, the solid-state imaging apparatus is provided with a solid-state imaging chip having an imaging region which has an imaging surface that is controlled to be curved and in which a photoelectric conversion unit is arranged, and a fixed flat portion extending from the peripheral edge of a region becoming the curved portion which is controlled to be curved; and a control unit performing variable control of the curvature (including an infinitesimal amount) of the imaging region. Thus, the imaging region according to the control unit is configured to be variably controlled from the flat state to the curved state having the target curvature.

The present electronic apparatus is provided with the above-described solid-state imaging apparatus and is configured such that the curvature of the imaging surface is variably controlled together with the variable movement of the desired optical lens in the optical lens system.

In the electronic apparatus, since the curvature of the imaging surface of the solid-state imaging apparatus is variably controlled by the control unit together with the variable movement of the desired lens in the optical lens system, it is possible to set the imaging surface to a target curvature state from the flat state according to the position of the lens from the imaging surface. Thus, zoom imaging becomes possible.

According to the solid-state imaging apparatus relating to the present technique, it is possible to provide a solid-state imaging apparatus suitable for zoom imaging.

According to the electronic apparatus relating to the present technique, since the above-described solid-state imaging apparatus is provided, it is possible to provide an electronic apparatus having an imaging function such as a camera capable of zoom imaging.

BRIEF DESCRIPTION OF THE DRAWINGS

FIG. 1 is a schematic configuration diagram of main parts in a solid-state imaging element obtained by application of the present disclosure.

DETAILED DESCRIPTION OF EMBODIMENTS

Figure 2A:
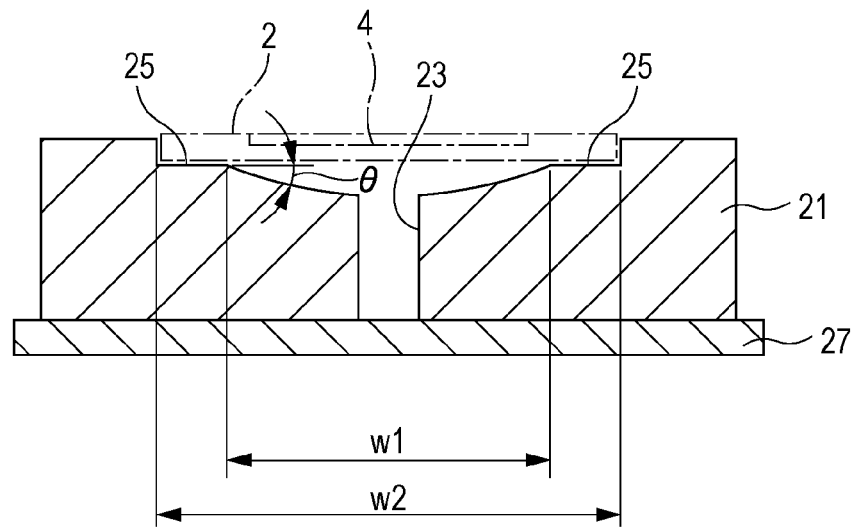
FIGS. 2A and 2B are a cross-sectional view and a plan view of the base using the method of manufacturing of embodiment 1-1 and embodiment 2-5.

Hereafter, embodiments of the present disclosure will be described in the order shown below based on the drawings.
1. Schematic Configuration Example of a Solid-State Imaging Element of the Present Disclosure
2. Embodiment 1-1 (example of curving the element chip in combination with curing contraction of a resin)
3. Embodiment 1-2 (example of curving the element chip in combination with gas volume contraction)
4. Embodiment 1-3 (example of using the base as a package)
5. Embodiment 1-4 (example of fixing the element chip to the base by vacuum adsorption)
6. Embodiment 2-1 (example of curving the element chip by curing contraction of the resin)
7. Embodiment 2-2 (example of curving the element chip by negative pressure)
8. Embodiment 2-3 (example of using the base as a package)
9. Embodiment 2-4 (example of fixing the element chip to the base by vacuum adsorption)
10. Embodiment 2-5 (example of controlling the shape of the curved portion according to the shape of the base)
11. Schematic configuration example of the solid-state imaging chip applied in the present technique
12. Embodiment 3-1 (configuration example of the solid-state imaging apparatus)
13. Embodiment 3-2 (configuration example of the solid-state imaging apparatus)
14. Embodiment 3-3 (configuration example of the solid-state imaging apparatus)
15. Embodiment 3-4 (configuration example of the solid-state imaging apparatus)
16. Embodiment 3-5 (configuration example of the solid-state imaging apparatus)
17. Embodiment 3-6 (configuration example of the solid-state imaging apparatus)
18. Embodiment 3-7 (configuration example of the solid-state imaging apparatus)
19. Embodiment 3-8 (configuration example of the solid-state imaging apparatus)
20. Embodiment 3-9 (configuration example of the solid-state imaging apparatus)
21. Embodiment 3-10 (configuration example of the solid-state imaging apparatus)
22. Embodiment (embodiment of electronic apparatus)

In addition, in each of the embodiments and modifications, common constituent elements are denoted by the same reference numerals and overlapping description thereof is omitted.
<<Schematic Configuration Example of a Solid-State Imaging Element>>

FIG. 1 shows a schematic configuration of a MOS type solid-state imaging element as an example of the solid-state imaging element manufactured by application of the method of manufacturing of each embodiment of the present disclosure.

The solid-state imaging element shown in this figure has an imaging region 4 in which a plurality of pixels 3 including photoelectric conversion units is arranged two-dimensionally in the center of the main surface side of the element chip 2. In each of the pixels 3 arranged in the imaging region 4, pixel circuits configured of photoelectric conversion units, a plurality of transistors (commonly called MOS transistors), capacitive elements and the like are connected. Here, a part of the pixel circuits may sometimes be shared by the plurality of photoelectric conversion units. In such a case, it is possible to have a configuration in which, as the pixel 3, a shared pixel structure, which includes a plurality of photoelectric conversion units, a plurality of transmissive transistors, one shared floating diffusion, and other pixel transistors shared one by one, is set as one unit. In addition, in the pixels 3, the pixel circuits arranged in conjunction with the photoelectric conversion units may be provided on the back surface of the opposite side to the surface on which the photoelectric conversion units are provided.

The solid-state imaging chip (hereafter, abbreviated as an imaging chip) 2 is configured by forming a solid-state imaging element on a silicon semiconductor substrate, for example. The solid-state imaging element has an imaging region 4 in which a plurality of pixels 3 including a photoelectric conversion unit are two-dimensionally arranged in the center of the main surface side of the semiconductor substrate. Each pixel 3 arranged in the imaging region 4 is configured to have a photoelectric conversion unit, for example, a photodiode, and a plurality of pixel transistors (MOS transistors). The plurality of pixel transistors may be configured by, for example, four transistors of a transfer transistor, a reset transistor, an amplifying transistor and a select transistor. Further, the configuration may use 3 transistors and omit the select transistor. As the pixels 3, a shared pixel structure formed of a plurality of photoelectric conversion units, a plurality of transfer transistors, one shared floating diffusion, and other pixel transistors shared one by one may be configured as a single unit.

In the peripheral portion of the above imaging region 4, peripheral circuits such as a vertical driving circuit 5, a column signal processing circuit 6, a horizontal driving circuit 7, a system control circuit 8, and the like are provided.

For example, the vertical driving circuit 5 is configured by a shift register, selects a pixel driving line 9 wired to the imaging region 4, supplies pulses for driving the pixels 3 to the selected pixel driving line 9, and drives the pixels 3 arranged in the imaging region 4 in units of rows. That is, the vertical driving circuit 5 selects and scans each pixel 3 arranged in the imaging region 4 sequentially in the vertical direction in units of rows. Then, a pixel signal based on the signal charge generated according to the received light amount in each pixel 3 is supplied to the column signal processing circuit 6 through the vertical signal line 10 wired perpendicularly to the pixel driving line 9.

The column signal processing circuit 6 is, for example, arranged at each column of the pixels 3 and performs signal processing such as noise reduction on the signal output from one row of the pixels 3 for each pixel column. That is, the column signal processing circuit 6 performs signal processing such as Correlated Double Sampling (CDS), signal amplification, or analog/digital conversion (AD) in order to remove a fixed pattern noise characteristic of the pixels.

For example, the horizontal driving circuit 7 is configured by a shift register, respectively selects each of the column signal processing circuits 6 in order, and outputs a pixel signal from each of the column signal processing circuits 6 by sequentially outputting a horizontal scanning pulse.

The output circuit performs signal processing on signals sequentially supplied from each column signal processing circuit 6 and performs output thereof. For example, in some cases, only buffering may be performed, in other cases, blackness level adjustment, row variation compensation, various types of digital signal processing and the like may be performed.

The system control circuit 8 receives data for instructing the input clock, the operation mode, and the like and outputs data such as information about the interior of the solid-state imaging element 1. In other words, in the system control circuit 8, a clock signal and a control signal are generated that become a reference for the operation of the vertical driving circuit 5, the column signal processing circuit 6, the horizontal driving circuit 7, and the like based on the vertical synchronization signal, the horizontal synchronization signal, and the master clock. Then, these signals are input to the vertical driving circuit 5, the column signal processing circuit 6, the horizontal driving circuit 7, and the like.

The driving circuit for driving each pixel is configured by each of the above peripheral circuits 5 to 8 and the pixel circuits provided in the imaging regions 4.

Further, in solid-state imaging elements manufactured by applying the method of manufacturing of each embodiment of the present disclosure as described below, as described in detail in each embodiment, the central portion of the element chip 2 is configured as a curved portion 11 which is three-dimensionally curved. The periphery of the curved portion 11 is configured as a flat portion 13 with a flat surface. The above-described imaging regions 4 are arranged in a concave surface side in the curved portion 11. Meanwhile, the peripheral circuits 5 to 8 are arranged at the curved portion 11 and the flat portion 13 of the periphery of the imaging area 4. Here, a portion of the peripheral circuits 5 to 8 may be arranged in a laminated position on the imaging region 4.

Further, as a modification of the element chip 2, an element chip 2a provided with terminal electrodes (chip side electrodes) derived from the pixel circuits of each pixel 3 and the peripheral circuits 5 to 8 may be set on the back surface of the opposite side to the photoelectric conversion units arranged at each pixel 3 of the imaging region 4. In this case, terminals connected to these driving circuits are derived from the opposite side to the surface provided with photoelectric conversion units through through-chip vias (Through Silicon Via: TSV, Through Chip Via: TCV). In addition, the solid-state imaging element of the present disclosure may also be applied to any configuration of a surface illuminated type or a back surface illuminated type. That is, if the solid-state imaging element is a surface illuminated type, as illustrated, an imaging region 4, in which pixels formed of photoelectric conversion units and pixel transistors are arranged on the concave surface side of the element chip 2 configured by the semiconductor substrate, is formed. On the concave surface side, the peripheral circuits 5 to 8 are also formed, on top of which a multi-layer wiring layer, in which a plurality of wiring layers are arranged with an insulating film between the layers, is formed, upon which a color filter and an on-chip lens are further formed. On the other hand, if the solid-state imaging element is a back surface illuminated type, an imaging region 4 is formed having photoelectric conversion units on the concave surface side of the element chip 2 configured by the semiconductor substrate made to be a thin film, and a color filter and an on-chip lens are formed on this concave surface side. In addition, on the convex surface side opposite to the concave surface, pixel transistors and peripheral circuits 5 to 8 are formed, on top of which a multi-layer wiring layer in which a plurality of wiring layers are arranged with an insulating film between the layers, is formed.

The solid-state imaging element of the example may adopt a back surface illuminated type configuration. In the back surface illuminated type solid-state imaging element, an imaging surface having a photoelectric conversion unit on the main surface (back surface) of a semiconductor substrate made to be a thin film is formed, and a color filter and an on-chip lens are formed on the main surface side. On the other main surface side, a pixel transistor and a peripheral circuit MOS transistor are formed, upon which multilayer wiring layers in which a plurality of layers of wiring is arranged using an interlayer insulating film are formed, and a support substrate is also bonded.

Further, the solid-state imaging element of the example may adopt a surface illuminated type configuration. In the surface illuminated type solid-state imaging element, an imaging surface, in which pixels formed of photoelectric conversion units and pixel transistors on the main surface of the semiconductor substrate are arranged, is formed. Peripheral circuits are also formed on the main surface. On the main surface, multilayer wiring layers in which a plurality of layers of wiring is arranged using an interlayer insulating film are formed, and a color filter and an on-chip lens are also formed thereon.

As described in each of the embodiments, the solid-state imaging apparatus according to embodiments of the present technique adopts a configuration in which the center of the imaging chip 2 forming the solid-state imaging element is set as a curved portion 11 which is curved three-dimensionally. In the curved portion 11, there is an imaging region 4. In other words, there is a picture angle region in the curved portion 11. Here, the curved portion 11 also includes cases of being in a non-curved flat surface state, depending on the method of driving the solid-state imaging apparatus. The periphery of the curved portion 11 is configured as a flat portion 13 with a flat surface. That is, the flat portion 13 has a coplanar configuration. The flat portion 13 extending from the peripheral edge of the curved portion 11 is fixed to a support portion. The imaging surface of the above-described imaging region 4 is formed on the concave curved surface side in the curved portion 11. The peripheral circuits 5 to 8 are arranged at the curved portion 11 and the flat portion 13 of the periphery of the imaging region 4. Meanwhile, as will become clear below, a control unit (not shown) performing variable control of the curvature (or the curvature radius) of the imaging surface of the curved portion 11 is provided. That is, the solid-state imaging apparatus according to embodiments of the present technique is configured to be provided with an imaging chip 2, and a control unit performing variable control of the curvature (including a flat surface with infinitesimal curvature) of the curved region of the imaging chip.

As the control unit performing variable control of the curvature, as shown in the embodiments below, there are a type using variation of magnetic force, a type using volumetric contraction according to heat, a type using the degree of vacuum according to suction power, and the like.

In each of the following embodiments, the method of manufacturing and detailed configuration of a solid-state imaging element provided with the above element chip 2 and 2a will be described.

Embodiment 1-1

Example of Curving the Element Chip in Combination with Curing Contraction of a Resin

[Configuration of the Base Used in the Method of Manufacturing of Embodiment 1-1]

Figure 2B:
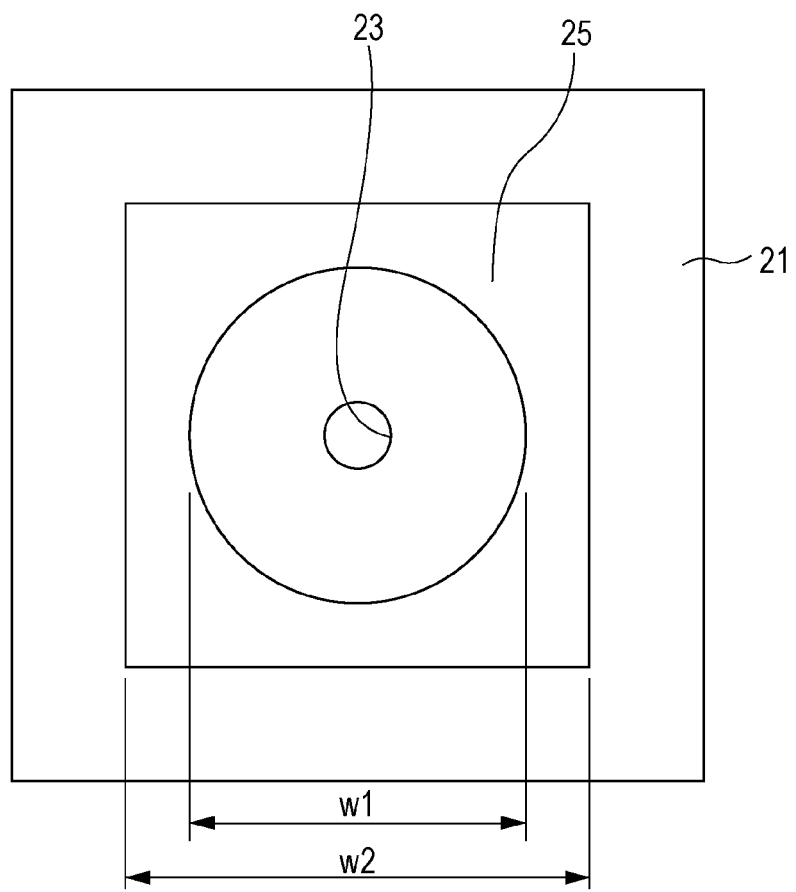

FIGS. 2A and 2B are a cross-sectional view and a plan view of the base 21 using the method of manufacturing of embodiment 1-1. The base 21 shown in the figure has an opening 23 in the center. Regarding the opening 23, on one surface of the base 21 provided with the opening 23, the periphery of the opening 23 is shaped as a flat surface 25.

The opening 23 is set to have a lens used in combination with the solid-state imaging elements manufactured in this manner and an external shape matched with the field curvature (lens aberration) of the optical system combined with the plurality of lenses. When a circular lens is used as the normal outer shape, the opening shape of the opening 23 viewed in a plan view is preferably a circle (a precise circle) and may be a shape in which the four corners of a square are curved. Further, the inner wall portion of the opening 23 in the flat surface 25 side has a tapered shape in which the diameter of the opening is widened toward the flat surface 25. The angle θ made by the inner wall of the opening 23 and the expanded surface of the flat surface 25 is less than θ=90°, as an example, it is preferably about θ=45°. In this opening 23, the portion in which the opening diameter is widened particularly preferably has a shape curved to form a concave shape with respect to the flat surface 25. The curvature of the curve is set to match the field curvature of the optical system such as the lens used in combination with the element chip (2) described using FIG. 1. In addition, the boundary portion from the portion where the opening diameter in the opening 23 is widened to the flat surface 25, that is, the edge portion of the opening 23, is particularly preferably configured as a convex surface. In addition, the opening width w1 of the opening 23 in the flat surface 25 side (including the portion where the opening diameter is widened) is set so that the imaging region (4) of the element chip (2) described using FIG. 1 falls within the range of the opening 23.

The flat surface 25 is provided all around the opening 23. This flat surface 25 has a width w2 supporting the border of the element chip (2) at a position where at least the imaging region (4) of the element chip (2) described using FIG. 1 falls within the range of the opening 23. The entirety or a part of the circumference of the flat surface 25 may be configured as a higher surface than the flat surface 25 in order to facilitate position matching when mounting the element chip (2). Here, in a case where such position matching is unnecessary, the entire surface of one surface of the base 21 may be set as a flat surface 25 having the same height throughout.

The base 21 above is set to be provided with a bottom plate 27, which covers the opening 23, on the surface of the opposite side to the side provided with the flat surface 25. The bottom plate 27 may be formed integrally with the base 21 or may also be formed separately from the base 21 as long as it is possible to cover the opening 23 in a sealed state. Furthermore, the bottom plate 27 may also be configured as a package in which wiring and terminals are formed.

In particular, the base 21 is configured using a material with an expansion coefficient (coefficient of thermal expansion: CTE) greater than that of the element chip (2) as a main constituent member. For example, if the element chip (2) is configured mainly using single crystal silicon (CTE=2.4), the base 21 is configured using stainless steel (SUS410: CTE=10.4, SUS304: CTE=17.3) or aluminum (CTE=23).

The material of the configuration of the base 21 is not particularly limited.

[Method of Manufacturing of Embodiment 1-1]

FIGS. 3A to 3D are cross-sectional process diagrams illustrating the method of manufacturing the solid-state imaging element of embodiment 1-1. The method of manufacturing of embodiment 1-1 shown in FIGS. 3A to 3D are for manufacturing a solid-state imaging element using the base 21 with the above-described configuration. The method of manufacturing of embodiment 1-1 is described below based on the figure.

Figure 3A:
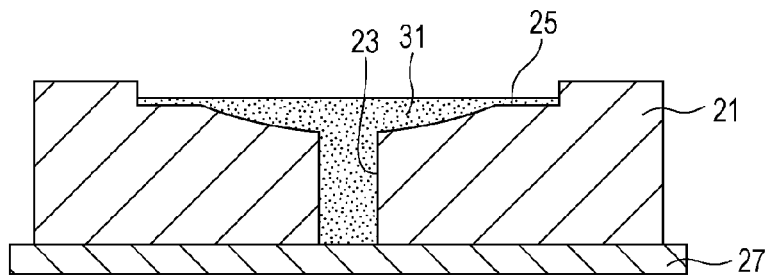
FIGS. 3A to 3D are cross-sectional process diagrams showing the method of manufacturing of embodiment 1-1.

First, as shown in FIG. 3A, uncured resin 31 is filled in an opening 23 of the base 21 in which the bottom portion is covered by the bottom plate 27. This resin 31 is made of a thermosetting resin, for example, and preferably uses a material of which the curing contraction coefficient is higher than the contraction coefficient of the base 21 due to cooling. Further, the uncured resin 31 used here is set to act as an adhesive agent for the base 21 and the element chip after curing. For instance, when the above-described stainless steel and aluminum are used as the material constituting the base 21, epoxy resins may be used as the resin 31 for example. For example, by adjusting the filler content, the resin material may be used with a curing contraction of around 1 to 8% or higher.

The filling amount of the resin 31 into the opening 23 is set to an amount that may act as an adhesive agent between the element chip, which is to be mounted next on the upper portion of the base 21, and the base 21 and to an amount to be supplied onto the flat surface 25 of the base 21 in advance. Further, when the base 21 and the resin 31 are subsequently heated, the filling amount of the resin 31 into the opening 23 may be such that, when the uncured resin 31 expands, the resin 31 is also supplied to the flat surface 25 of the base 21.

Figure 3B:
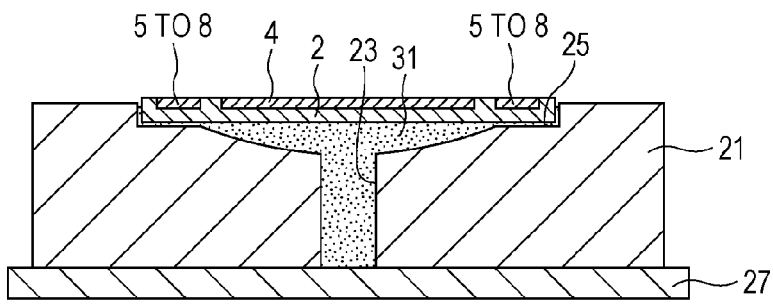

Next, as shown in FIG. 3B, the element chip 2 is mounted on the flat surface 25 of the base 21 in a state where the opening 23 of the base 21 is covered. At this point, the forming surface of the imaging region 4 in the element chip 2 (that is, the forming surface of the photoelectric conversion units) faces upward, and the imaging regions 4 fit within the range of the opening 23. Further, the periphery of the imaging region 4 is supported by the flat surface 25 of the base 21 over the entire outer circumference thereof. In this state, the peripheral circuits 5 to 8 arranged at the periphery of the imaging region 4 are arranged to correspond to the flat surface 25 and may be partially arranged within the range of the opening 23. Further, when the uncured resin 31 is supplied onto the flat surface 25 of the base 21, the uncured resin 31 is interposed over the entire area between the flat surface 25 of the base 21 and the element chip 2 and acts as an adhesive agent.

Figure 3C:
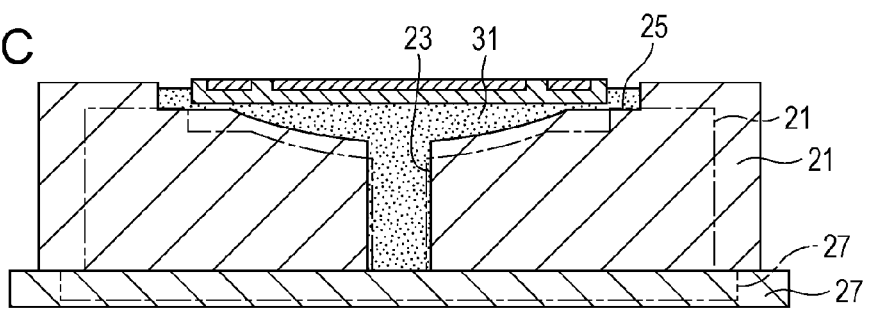

Next, as shown in FIG. 3C, the base 21 is heated and expanded. Furthermore, by also heating the bottom plate 27 as necessary, the bottom plate 27 is also caused to expand to the same extent as the base 21. In this manner, the base 21 is caused to expand, whereby the diameter of the opening 23 increases and the flat surface 25 is widened to the outside. Additionally, the uncured resin 31 filled in the opening 23 is also heated and expanded by thermal conduction from the base 21 and the bottom plate 27. Here, if the element chip 2 is mounted directly on the flat surface 25 of the base 21, the resin 31 is supplied to between the flat surface 25 of the base 21 and the element chip 2 by this expansion of the uncured resin 31, and the uncured resin 31 is interposed over the entire area between the flat surface 25 of the base 21 and the element chip 2 and acts as an adhesive agent.

In this state, the resin 31 is heated up to a temperature of a range that does not influence the element chip 2 and at which the resin 31 starts to be cured and the curing of the resin 31 proceeds. For example, in a case where the above-described epoxy resins are used as the resin 31, heating is performed for approximately one hour at 160° C. By curing the resin 31, the element chip 2 is fixed to the flat surface 25 of the base 21. At this point, it is important that the whole border of the element chip 2 be fixed to the flat surface 25.

Furthermore, as long as the adhesive action of the resin 31 is obtained in a period before the curing of the resin 31 is complete, it may be a process in which the element chip 2 is mounted on the base 21 after the heating of the base 21. In such a case, first, the resin 31 is filled in the opening 23 of the base 21, after which the base 21 is heated to make the base 21 and the resin 31 expand. Next, the element chip 2 is mounted on the base 21 before the resin 31 is cured, after which, the resin 31 is heated up to a temperature of a range that does not influence the element chip 2 and at which the resin 31 starts to be cured and the curing of the resin 31 proceeds.

Figure 3D:
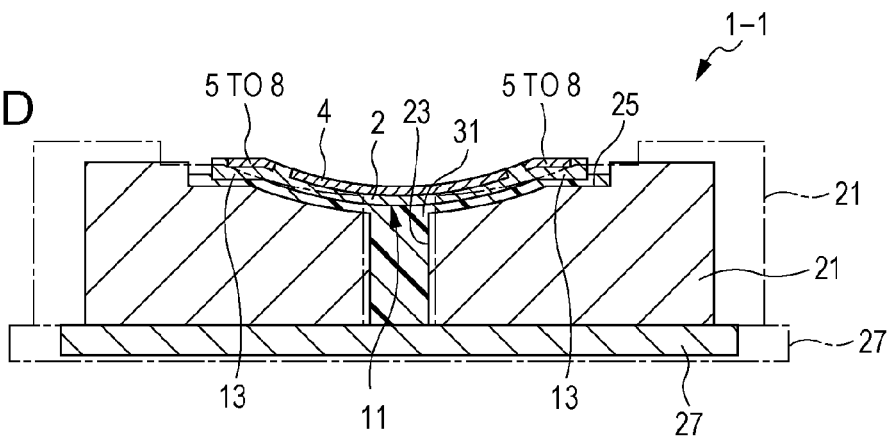

After the above, as shown in FIG. 3D, in a state where the element chip 2 is fixed on the flat surface 25 of the base 21, the base 21 and the bottom plate 27 are cooled from the heated state to room temperature. In this manner, the resin 31 filled in the opening 23 of the base 21 is also cooled to room temperature. In the cooling process, the base 21, the bottom plate 27, and the cured resin 31 contract. At this point, the base 21 and the bottom plate 27 contract to the size before heating. Further, the curing-contraction of the cured resin 31 proceeds beyond the uncured state before heating.

Due to this contraction of the base 21 and the resin 31, the central portion of the element chip 2 arranged to correspond with the opening 23 of the base 21 is pulled toward the inside of the opening 23 filled with the resin 31 and shaped as a curved portion 11 curved three-dimensionally. The curve shape of the curved portion 11 follows the inner wall shape of the opening 23 in the flat surface 25 side of the base 21. Thus, for example, the shape is formed to have a circular bottom portion, similarly to the planar shape of the opening 23 of the base 21. Further, if the shape of the opening 23 is one in which the four corners of a square are curved, a three-dimensional curve is formed with a circle as the bottom portion at a portion near the apex of the curved portion 11. At this point, by fixing the whole border of the element chip 2 to the flat surface 25, it is possible to evenly apply stress due to the curing and contraction of the resin 31 and stress due to the contraction of the base 21 with respect to the central portion of the element chip 2 corresponding to the opening 23. In this manner, it is possible to form a curved portion 11 three-dimensionally curved without generating "wrinkles".

Furthermore, in order to sufficiently fix the whole border of the element chip 2 with respect to the flat surface 25, it is important to adjust the width w1 of the opening 23 with respect to the outer shape of the element chip 2 so that a certain degree of width or more is preserved in the flat portion 13. As an example of the shape of the element chip 2, when the outer shape is 4 mm×4 mm and the thickness approximately 15 μm, the flat portion 13 is set so as to be left with a width of 0.3 mm or more over the entire circumference of the element chip 2.

In addition, since the inner wall of the opening 23 of the base 21 is set to have a tapered shape and the edge portion of the opening 23 is further set to have a convex surface, it is possible to prevent stress from being concentrated at the time of curving in the element chip 2 portion corresponding to the edge of the opening 23 and to thereby prevent cracks in this portion of the element chip 2.

Meanwhile, in the element chip 2, the periphery of the curved portion 11 is left as the flat portion 13 without being fixed to the flat surface 25 of the base 21 and curved. The flat section 13 is left over the entire circumference of the curved portion 11.

The curved portion 11 formed on the element chip 2 preferably has a curvature set to match the field curvature of the optical system such as the lens used in combination with the element chip 2, for example, approximately 10% to 200, and, as an example, may be set as a curvature of approximately 17%. The shape of the curved portion 11 is mainly controlled according to the inner wall shape of the opening 23 in the flat surface 25 side. Further, the adjustment of the curvature of the curved portion 11 is performed according to the inner wall shape of the opening 23 in the flat surface 25 side, the expansion coefficient of the base 21, the volume contraction coefficient (curing contraction coefficient) during curing of the resin 31, and the volume of the resin 31 to be filled in the opening 23. In a case where it is desired to make the curvature of the curved portion 11 large, the base 21 may be configured by a material having a large expansion coefficient, or a resin 31 having a large curing coefficient may be used, or the capacity of the opening 23 may be increased and the volume of the resin 31 to be filled in the opening 23 increased. Further, a combination of these may be appropriately employed.

Moreover, in order to obtain a three-dimensional curve having the target curvature without difficulty for the element chip 2, the thickness of the element chip 2 may be adjusted. Accordingly, in comparison with a case where the bottom area of the curved portion 11 is large, it is preferable that as the curved portion 11 becomes smaller, the thickness of the element chip 2 be made smaller.

As mentioned above, a solid-state imaging element 1-1 having a curved portion 11 is formed. After the formation of the solid-state imaging element 1, the base 21 and the resin 31 may be made thinner from the back surface side as necessary. Further, in a case of preserving the shape of the curved portion 11, the solid-state imaging element 1-1 may be set so that the element chip 2 is separated from the base 21 and the resin 31. In order to easily separate the element chip 2 in this manner, the back surface (surface facing the base 21) of the element chip 2 may be coated with a separating agent before the element chip 2 is mounted on the base 21. Moreover, in the fixing of the base 21 and the element chip 2, a thermosetting resin 31 which is filled in the opening 23 is used as an adhesive agent. However, in the fixing of the base 21 and the element chip 2, other than the resin 31 in the opening 23, a resin having a photocuring property may also be used as the adhesive agent. In this case, the element chip 2 is mounted on the flat surface 25 of the expanded base 21 by interposing an adhesive agent formed of photocuring resin to be cured by the irradiation of long wavelength light. In such a state, the above fixing is performed by curing the adhesive agent using wavelength light irradiation passing through the element chip 2. As an example, in a case where the element chip 2 is configured of single crystal silicon, light irradiation is performed using long wavelength light with a wavelength of 700 nm or more. In this manner, the adhesive agent is cured by long wavelength light passing through the element chip 2 and reaching the photocuring resin.

[Solid-State Imaging Element of Embodiment 1-1]

As shown in FIG. 1, the solid-state imaging element 1-1 obtained in the above process is configured such that the central portion of the element chip 2 is set as the curved portion 11 three-dimensionally curved. Further, a flat portion 13 is provided so as to be extended from the border portion of such a curved portion 11. The flat portion 13 is arranged over the entire circumference of the curved portion 11 and has a coplanar configuration.

On the concave surface side of the curved portion 11, an imaging region 4 in which photoelectric conversion units are arranged is arranged. The curved portion 11 is set so as to match the field curvature of the optical system such as the lens used in combination with the solid-state imaging elements 1-1 and so as to have a curvature in which the photoelectric conversion units are arranged along the image surface plane. For this reason, the bottom surface of the curved portion 11 is preferably circular.

Further, the flat portion 13 is provided with peripheral circuits 5 to 8 arranged at the periphery of the imaging region 4. The peripheral circuits 5 to 8 are arranged in the flat portion 13 and may be partially arranged in the curved portion 11. In addition, the flat portion 13 is provided with terminals derived from the peripheral circuits 5 to 8, and may use these terminals to acquire a connection with an external circuit. At this point, since the terminals are provided at the flat portion 13, favorable operability is secured for acquiring a bonded connection with external circuits. However, the terminals derived from the peripheral circuits 5 to 8 may be arranged in the curved portion 11 without being limited to being provided in the flat portion 13, or may also be derived at the convex surface side in the curved portion 11.

In addition, in a state where the curved portion 11 of the element chip 2 is inserted into the opening 23 of the above-described base 21, the base 21 is attached to this solid-state imaging element 1-1 at the convex surface side of the curved portion 11 in the element chip 2. The element chip 2 and the base 21 are fixed along the entire circumference surrounding the curved portion 11 with the resin 31 interposed between the flat surface 25 and the element chip 2 as an adhesive agent. In addition, the opening 23 of the base 21 is filled with the resin 31 and the shape of the curved portion 11 is secured by the resin 31.

[Effect of Embodiment 1-1]

According to embodiment 1-1 described above, in the base 21, in a state where the border of the element chip 2 is fixed to the flat surface 25 of the periphery of the opening 23, only the central portion of the element chip 2, which is arranged to cover the opening 23, is curved three-dimensionally. The border portion of the element chip 2 continuing from the peripheral edge of the curved portion 11 formed by the curve is left as a flat portion 13 fixed to the flat surface 25 of the base 21. Accordingly, it is possible to leave the border portion of the element chip 2 as a flat portion 13 to which no stress is applied by the curve.

Further, when the element chip 2 is made to curve, compressive stress is applied to the element chip 2 fixed to the base 21 by the contraction of the base 21. Along with this, tensile stress is applied to the central portion of the element chip 2 by the curing and contraction of the resin 31 filled in the opening 23 of the base 21. In this manner, the compressive stress and the tensile stress applied to the element chip 2 cancel each other out and it is possible to curve the element chip 2 in a stress-free manner.

Further, the curvature of the curved portion 11 may be adjusted by the inner wall shape of the opening 23 in the flat surface 25 side of the base 21, the expansion coefficient of the base 21, the curing contraction coefficient of the resin 31 filled in the opening 23, and the volume of the resin 31 (capacity of the opening 23). For this reason, the shape and curvature of the curved portion 11 may be controlled with high precision and in a wide range.

According to embodiment 1-1 described above, the border portion of the element chip 2 is left as the flat portion 13 to which stress due to the curve is not applied, and it is possible to form only the central portion as a three-dimensional curved portion 11. For this reason, it is possible to manufacture the solid-state imaging element 1-1 provided with a three-dimensional curved portion 11 without generating damage such as cracks. As a result, it is possible to promote an improvement in the reliability of the solid-state imaging element 1-1 provided with the three-dimensional curved portion 11.

Embodiment 1-2

Example of Curving the Element Chip in Combination with Gas Volume Contraction

[Configuration of the Base Used in the Method of Manufacturing of Embodiment 1-2]

The base used in the method of manufacturing of embodiment 1-2 is the same as the base 21 described using FIGS. 2A and 2B in embodiment 1-1.

[Method of Manufacturing of Embodiment 1-2]

FIGS. 4A to 4D are cross-sectional process diagrams describing the method of manufacturing the solid-state imaging element of embodiment 1-2. The method of manufacturing of embodiment 1-2 shown in FIGS. 4A to 4D is for manufacturing a solid-state imaging element using the base 21 with the above-described configuration and this method of manufacturing will be described below based on the figure.

Figure 4A:
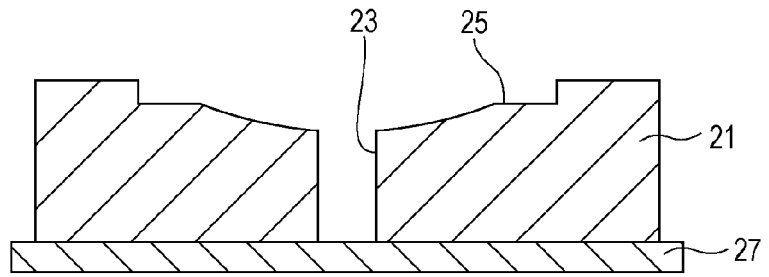
FIGS. 4A to 4D are cross-sectional process diagrams showing the method of manufacturing of embodiment 1-2.

First, as shown in FIG. 4A, in the base 21, the bottom plate 27 is arranged on the opposite side to the side provided with the flat surface 25 and covers the opening 23 of the base 21 from one side.

Figure 4B:
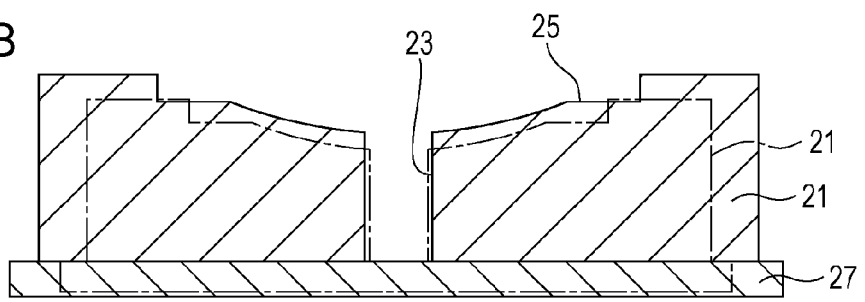

Next, as shown in FIG. 4B, the base 21 is heated and expanded. Furthermore, by also heating the bottom plate 27 as necessary, the bottom plate 27 is also caused to expand to the same extent as the base 21. In this manner, the base 21 is caused to expand, whereby the diameter of the opening 23 increases and the flat surface 25 is widened to the outside. The heating temperature at this point is equal to or higher than the curing temperature of the adhesive agent provided on the back surface of the element chip (2) described below, and is within a range which does not influence the element chip (2).

Figure 4C:
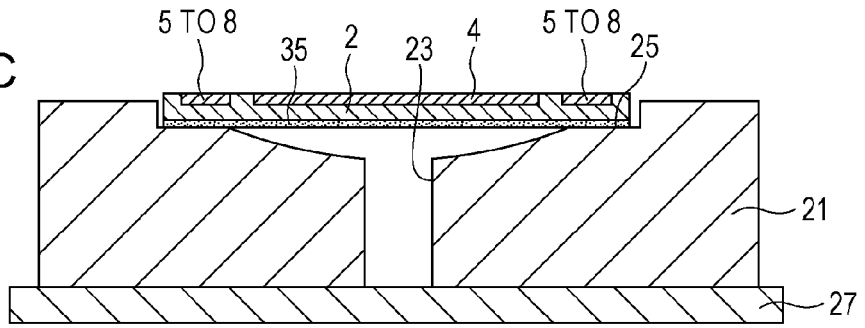

Next, as shown in FIG. 4C, the forming surface (that is, the forming surface of the photoelectric conversion units) of the imaging region 4 in the element chip 2 faces upward and the element chip 2 is mounted on the flat surface 25 of the base 21 in a state where the opening 23 of the base 21 is covered. On the mounting surface side toward the base 21 in the element chip 2, an adhesive agent 35 including a thermosetting resin is arranged. As illustrated, the adhesive agent 35 may be arranged all over the mounting surface side toward the base 21 in the element chip 2, or may be arranged only on the border of the element chip 2 made to correspond to the flat surface 25 of the base 21. However, along the entire circumference surrounding the opening 23, it is important to interpose the adhesive agent 35 between the flat surface 25 of the base 21 and the element chip 2.

At this point, the imaging regions 4 fit within the range of the opening 23 and the periphery of the imaging region 4 is supported by the flat surface 25 of the base 21 across the entire surface thereof through the adhesive agent 35. Further, the fact that, in this state, the peripheral circuits 5 to 8 arranged at the periphery of the imaging region 4 are arranged to correspond with the flat surface 25, and may be partially arranged in the range of the opening 23 is the same as embodiment 1-1 described above.

In this state, the adhesive agent 35 interposed between the flat surface 25 of the base 21 and the element chip 2 is held until it is cured, whereby the element chip 2 is fixed on the flat surface 25 of the base 21. At this point, it is important to fix the whole peripheral edge of the element chip 2 to the flat surface 25, for example, in a case where an epoxy resin is used as the adhesive agent 35, at 160° C. for approximately 15 minutes. In this manner, the opening 23 of the heated base 21 is sealed by the element chip 2 and the bottom plate 27.

Figure 4D:
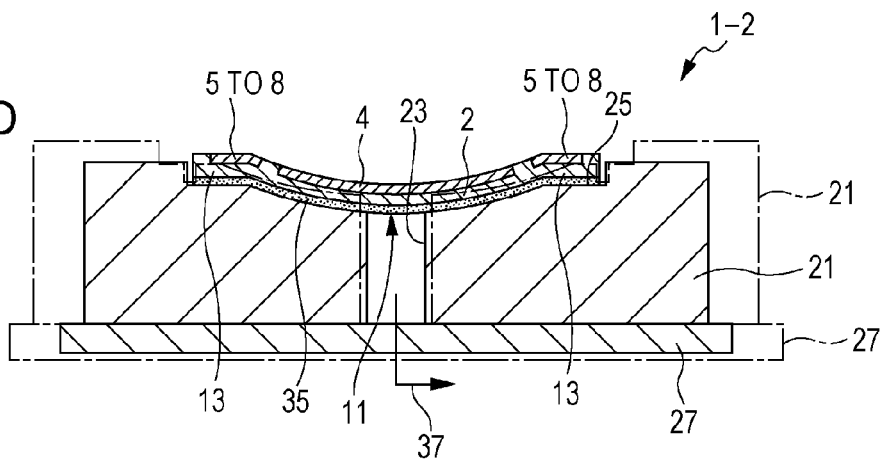

Next, as shown in FIG. 4D, the base 21 and the bottom plate 27 are cooled to room temperature from the heated state and the gas in the opening 23 of the base 21 sealed by the element chip 2 and the bottom plate 27 is also cooled to room temperature. In this cooling process, the base 21, the bottom plate 27, and the gas in the opening 23 contract. At this point, the base 21 and the bottom plate 27 contract to the size before heating.

As a result of such a volumetric contraction of the gas in the base 21 and opening 23, the central portion arranged to correspond to the opening 23 of the base 21 in the element chip 2 is pulled toward the inner part of the opening 23 and shaped as a curved portion 11 curved three-dimensionally. The curve shape of the curved portion 11 becomes a shape following the inner wall shape of the opening 23 in the flat surface 25 side in the base 21. Thus, for example, the shape is formed to have a circular bottom portion, similarly to the planar shape of the opening 23 of the base 21. Further, if the shape of the opening 23 is one in which the four corners of a square are curved, a three-dimensional curve is formed with a circle as the bottom portion at a portion near the apex of the curved portion 11. At this point, by fixing the whole border of the element chip 2 to the flat surface 25, it is possible to evenly apply stress due to the curing and contraction of the resin 31 and stress due to the contraction of the base 21 with respect to the central portion of the element chip 2 corresponding to the opening 23. In this manner, it is possible to form a curved portion 11 three-dimensionally curved without generating "wrinkles". For this reason, the fact that it is important to sufficiently fix the whole border of the element chip 2 with respect to the flat surface 25 by adjusting the width w1 of the opening 23 with respect to the outer shape of the element chip 2 is the same as in embodiment 1-1.

In addition, the fact that since the inner wall of the opening 23 of the base 21 is set to have a tapered shape and the edge portion of the opening 23 is further set to have a convex surface, it is possible to prevent force at the time of curving from being concentrated in the element chip 2 portion corresponding to the edge of the opening 23 and to thereby prevent cracks in this portion of the element chip 2 is the same as in embodiment 1-1.

In addition, the peripheral portion of the curved portion 11 in the element chip 2 is fixed to the flat surface 25 of the base 21 without curving and left as the flat portion 13. The fact that this flat portion 13 is left over the entire circumference of the curved portion 11 is the same as in embodiment 1-1.

The fact that the curved portion 11 formed on the element chip 2 has a curvature set to match the field curvature of the optical system such as the lens used in combination with the element chip 2 is the same as in embodiment 1-1. The shape of the curved portion 11 is mainly controlled by the shape of the inner wall of the opening 23 in the flat surface 25 side. Further, the adjustment of the curvature of the curved portion 11 is performed according to the inner wall shape of the opening 23 in the flat surface 25 side, and the expansion coefficient of the base 21, and also in accordance with the capacity of the opening 23. In a case where it is desired to make the curvature of the curved portion 11 large, the base 21 may be configured by a material having a large expansion coefficient, or the capacity of the opening 23 may be increased and the volume of the gas to be sealed in the opening 23 increased. Further, a combination of these may be appropriately employed.

In addition, in a case where the adjustment of the curvature of the curved portion 11 is insufficient using only the expansion coefficient of the base 21 and the capacity of the opening 23, a discharge system 37 discharging from inside the opening 23 is provided and the gas inside the opening 23 when the base 21 is cooled to room temperature may be discharged by the discharge system 37. Moreover, there is also another method of using a vacuum chamber. In this case, the element chip 2 is put into a state of being mounted on the base 21 in the vacuum chamber and the pressure is reduced in the opening 23 of the base 21 by reducing the pressure inside the vacuum chamber. In this state, the inside of the opening 23 is put into a sealed state together with the element chip 2 with respect to the expanded base 21. Subsequently, the element chip 2 is curved toward the inside of the opening 23 of the base 21 due to the atmospheric discharge of the base 21 and the element chip 2. Here, the fact that, in order to curve the element chip 2 three-dimensionally with the target curvature without difficulty, the thickness of the element chip 2 may be adjusted is the same as in embodiment 1-1.

As mentioned above, a solid-state imaging element 1-2 having a curved portion 11 is formed. After the forming of the solid-state imaging element 1-2, the base 21 may be thinned from the back surface as necessary. Further, since the shape of the curved portion 11 is stabilized, resin may be filled and cured inside the opening 23 after the bottom plate 27 is detached. Meanwhile, in a case of preserving the shape of the curved portion 11, the element chip 2 may be separated from the base 21. In order to easily separate the element chip 2 in this manner, the back surface (surface facing the base 21) of the element chip 2 may be coated with a separating agent before the element chip 2 is mounted on the base 21. Moreover, the fact that, in the fixing of the base 21 and the element chip 2, a photocuring resin may be used as an adhesive agent is the same as in embodiment 1-1.

[Solid-State Imaging Element of Embodiment 1-2]

The solid-state imaging element 1-2 obtained by the above processes is one in which, in the solid-state imaging element of embodiment 1-1, the inside of the opening 23 of the base 21 is made to be a space portion. Moreover, the solid-state imaging element 1-2 in which the inside of the opening 23 is discharged or reduced in pressure in the manufacturing processing and the bottom plate 27 is left unchanged as a package is one in which the space portion inside the opening 23 is preserved by a reduced pressure atmosphere. However, in a case where resin is filled into the opening 23 of the base 21, the solid-state imaging element becomes the same as that of embodiment 1-1.

[Effect of Embodiment 1-2]

According to the above embodiment 1-2, similarly to embodiment 1-1, in the base 21, in a state where the border of the element chip 2 is fixed to the flat surface 25 of the periphery of the opening 23, only the central portion of the element chip 2, which is arranged to cover the opening 23, is curved three-dimensionally. The border portion continuing from the peripheral edge of the curved portion 11 formed by this curve is left as a flat portion 13 fixed to the flat surface 25 of the base 21. Accordingly, it is possible to leave the border portion of the element chip 2 as a flat portion 13 to which no stress is applied by the curve.

Further, when the element chip 2 is curved, compressive stress is applied to the element chip 2 fixed to the base 21 by the contraction of the base 21. Along with this, tensile stress is applied to the central portion of the element chip 2 by the volumetric contraction of the gas in the opening 23 of the base 21. In this manner, similarly to embodiment 1-1, the compressive stress and the tensile stress applied to the element chip 2 by the curve cancel each other out and it is possible to curve the element chip 2 in a stress-free manner.

Further, the curvature (shape) of the curved portion 11 may be adjusted by the inner wall shape of the opening 23 in the flat surface 25 side of the base 21, the expansion coefficient of the base 21, the volume of gas sealed in the opening 23 (capacity of the opening 23), and the discharge of the gas inside the opening 23 from the discharge system 37. For this reason, the curvature of the curved portion 11 may be controlled with high precision and in a wide range.

According to embodiment 1-2 described above, the border portion of the element chip 2 is left as the flat portion 13 to which stress due to the curve is not applied, and it is possible to form only the central portion as a three-dimensional curved portion 11. For this reason, it is possible to manufacture the solid-state imaging element 1-2 provided with a three-dimensional curved portion 11 without generating damage such as cracks. As a result, similarly to embodiment 1-1, it is possible to promote an improvement in the reliability of the solid-state imaging element 1-2 provided with the three-dimensional curved portion 11.

Embodiment 1-3

Example of Using the Base as a Package

[Configuration of the Base Used in the Method of Manufacturing of Embodiment 1-3]

Figure 5A:
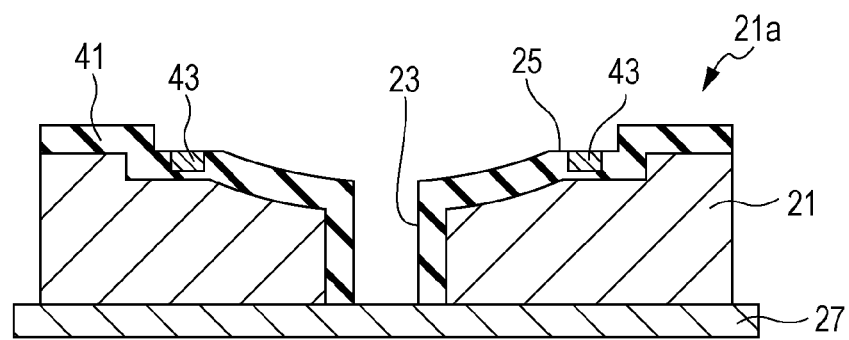
FIGS. 5A and 5B are a cross-sectional view and a plan view of the base using the method of manufacturing of embodiment 1-3.
Figure 5B:
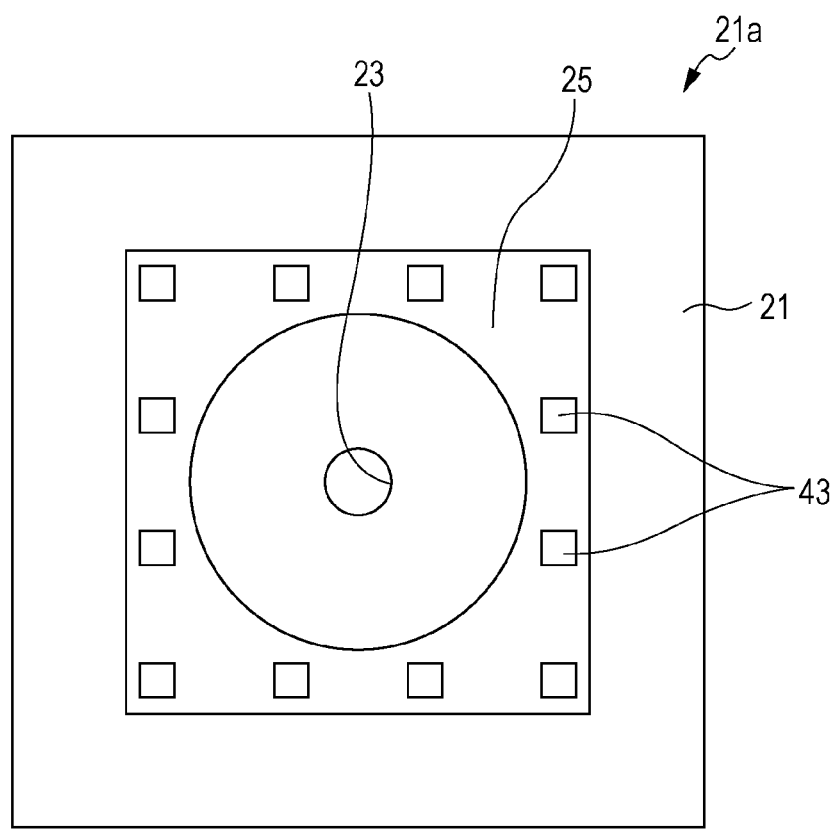

FIGS. 5A and 5B are a cross-sectional view and a plan view of the base using the method of manufacturing of embodiment 1-3. The base 21a shown in this figure is different from the bases used in the methods of manufacturing of embodiment 1-1 and embodiment 1-2 in the following respects: the base 21a is configured to function as a package; the flat surface 25 is covered with an insulating film 41; and a base side electrode 43 is further provided.

That is, the base 21a has a configuration in which the base 21 used in the methods of manufacturing of embodiment 1-1 and embodiment 1-2 is set as a base main body 21, the flat surface 25 side thereof is covered with an insulating film 41, and, further, a base side electrode 43 is arranged on the flat surface 25 covered with the insulating film 41. The base side electrode 43 is arranged with respect to the chip side electrode provided at the element chip to be described next and is arranged in a state of being embedded in the insulating film 41. In other words, the surface of the base side electrode 43 is configured by the insulating film 41 and a part of the flat surface 25. The base side electrode 43 is derived from the flat surface 25 of the base 21a and is also configured to be connected to an external member. Here, the base side electrode 43 may be provided at the inner wall of the opening 13 in the flat surface 25 side.

[Method of Manufacturing of Embodiment 1-3]

Figure 6A:
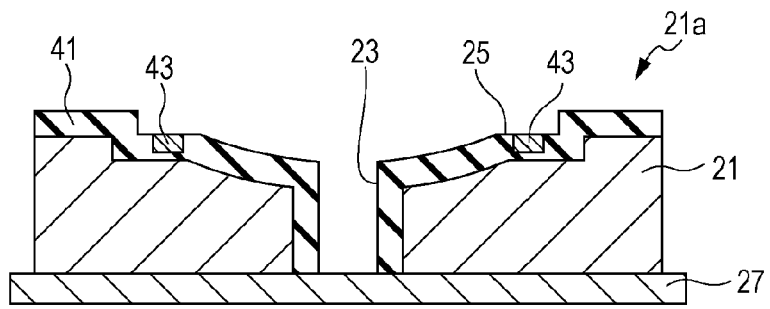
FIGS. 6A to 6D are cross-sectional process diagrams showing the method of manufacturing of embodiment 1-3.
Figure 6B:
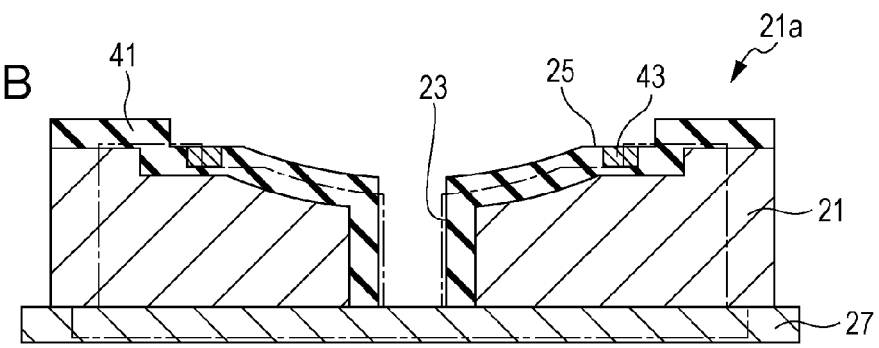
Figure 6C:
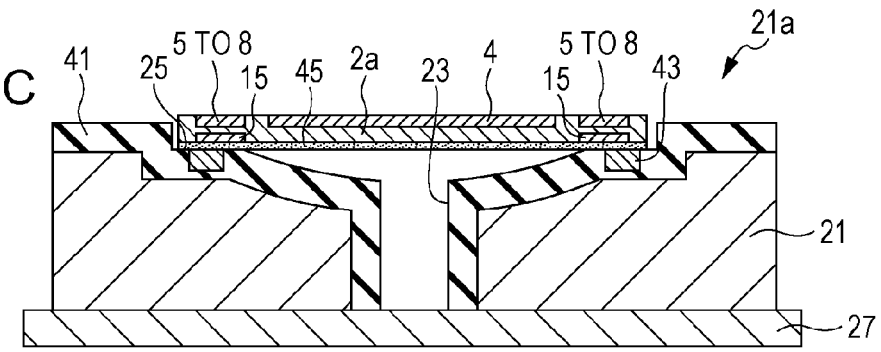
Figure 6D:
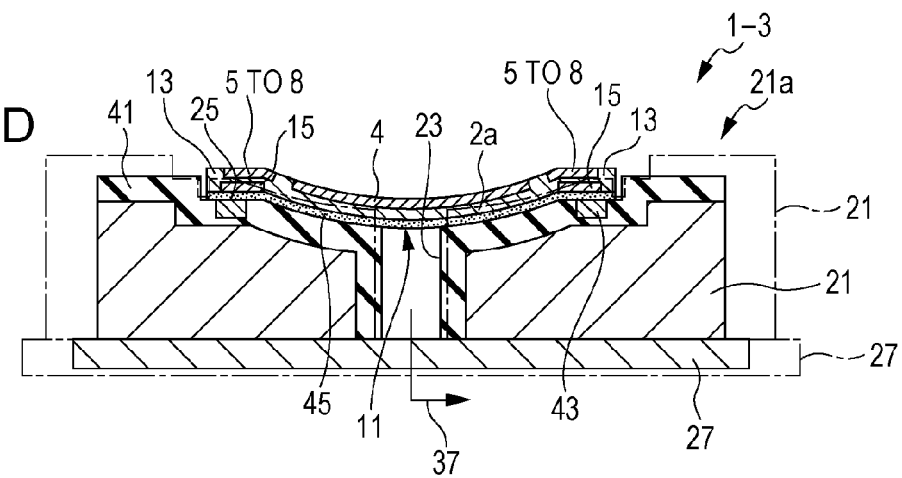

FIGS. 6A and 6D are cross-sectional process diagrams illustrating the method of manufacturing the solid-state imaging element of embodiment 1-3. The method of manufacturing of embodiment 1-3 shown in FIGS. 6A to 6D is for manufacturing a solid-state imaging element using the base 21a with the above-described configuration and this method of manufacturing will be described below based on the figure.

First, as shown in FIG. 6A, the bottom plate 27 is arranged on the opposite side to the side provided with the flat surface 25 in the base 21a and covers the opening 23 of the base 21a from one side.

Next, as shown in FIG. 6B, the base 21a is heated and expanded. Furthermore, by also heating the bottom plate 27 as necessary, the bottom plate 27 is also caused to expand to the same extent as the base 21a. In this manner, the base 21a is caused to expand, whereby the diameter of the opening 23 increases and the flat surface 25 is widened to the outside. The heating temperature at this point is equal to or higher than the curing temperature of the adhesive agent provided on the back surface of the element chip (2a) to be described next, and is within a range which does not influence the element chip (2a).

Next, as shown in FIG. 6C, the element chip 2a is mounted on the base 21a expanded by heating. The element chip 2a used here is provided with a chip side electrode 15 on the back surface side opposite to the surface provided with the imaging region 4 and the peripheral circuits 5 to 8. These chip side electrodes 15 are derived from the imaging region 4 and the peripheral circuits 5 to 8, and are arranged at positions corresponding to the base side electrode 43, for example, at a border portion in the element chip 2a. Further, at the surface side where the chip side electrodes 15 are arranged in the element chip 2a, an anisotropic conductive adhesive agent 45 is arranged. As illustrated, the anisotropic conductive adhesive agent 45 may be arranged all over the surface where the chip side electrodes 15 are arranged in the element chip 2a, or may be arranged only on the border of the element chip 2a made to correspond to the flat surface 25 of the base 21a. However, along the entire circumference surrounding the opening 23, it is important to interpose the anisotropic conductive adhesive agent 45 between the flat surface 25 of the base 21a and the element chip 2a.

With the forming surface (that is, the forming surface of the photoelectric conversion units) of the imaging region 4 in the element chip 2a facing upward, the above element chip 2a is mounted on the flat surface 25 of the base 21a in a state where the opening 23 of the base 21a is covered. In this manner, the anisotropic conductive adhesive agent 45 is interposed between the flat surface 25 of the base 21a and the element chip 2a.

At this point, the position of the element chip 2a corresponding to the base 21a is aligned so that the chip side electrode 15 provided at the element chip 2a and the base side electrode 43 provided at the flat surface 25 of the base 21a expanded by heating are arranged oppositely one for one. Further, the imaging regions 4 of the element chip 2a fit within the range of the opening 23 of the base 21a and the border portion of the imaging region 4 is supported by the flat surface 25 of the base 21a through the anisotropic conductive adhesive agent 45. Further, the fact that, in this state, the peripheral circuits 5 to 8 arranged at the periphery of the imaging region 4 are arranged at the flat surface 25, and may be partially arranged in the range of the opening 23 is the same as in each of the above-described embodiments.

In a case where an anisotropic conductive adhesive agent 45 is, for example, one in which fine conductive particles are dispersed in a thermosetting resin, a state in which the anisotropic conductive adhesive agent 45 is interposed between the flat surface 25 of the base 21a and the element chip 2a is maintained, and the element chip 2a is fixed on the flat surface 25 of the base 21a. At this point, it is important to fix the whole border of the element chip 2a to the flat surface 25, for example, in a case where an epoxy resin is used as the anisotropic conductive adhesive agent 45, at 160° C. for approximately 15 minutes. In this manner, the opening 23 of the heated base 21a is sealed by the element chip 2a and the bottom plate 27. In addition, the base side electrode 43 and the chip-side electrode 15 are connected by the anisotropic conductive adhesive agent 45.

Next, as shown in FIG. 6D, the base 21a and the bottom plate 27 are cooled to room temperature from the heated state and the gas in the opening 23 of the base 21a sealed by the bottom plate 27 and the element chip 2a is also cooled to room temperature. In this cooling process, the base 21a, the bottom plate 27, and the gas in the opening 23 contract. At this point, the base 21a and the bottom plate 27 contract to the size before heating.

As a result of such a volumetric contraction of the gas in the base 21a and opening 23, the central portion arranged to correspond to the opening 23 of the base 21a in the element chip 2a is pulled toward the inner part of the opening 23 and shaped as a curved portion 11 curved three-dimensionally. The curve shape of the curved portion 11 becomes a shape following the inner wall shape of the opening 23 in the flat surface 25 side of the base 21a. Thus, for example, the shape is formed to have a circular bottom portion, similarly to the planar shape of the opening 23 of the base 21a. Further, if the shape of the opening 23 is one in which the four corners of a square are curved, a three-dimensional curve is formed with a circle as the bottom portion at a portion near the apex of the curved portion 11. Moreover, the fact that, in the fixing of the base 21a and the element chip 2a, a photocuring resin may be used as an adhesive agent (anisotropic conductive adhesive agent) is the same as in the other embodiments. In this case, an anisotropic conductive adhesive agent 45 in which fine conductive particles are dispersed in the photocuring resin is used.

In addition, the fact that since the inner wall of the opening 23 of the base 21a is set to have a tapered shape and the edge portion of the opening 23 is further set to have a convex surface, it is possible to prevent force at the time of curving from being concentrated in the element chip 2a portion with respect to the edge of the opening 23 and to thereby prevent cracks in this portion of the element chip 2a is the same as in the other embodiments.

In addition, the peripheral portion of the curved portion 11 in the element chip 2a is fixed to the flat surface 25 of the base 21a without curving and left as the flat portion 13. The fact that this flat portion 13 is left over the entire circumference of the curved portion 11 is the same as in the other embodiments.

The fact that the curved portion 11 formed on the element chip 2a has a curvature set to match the field curvature of the optical system such as the lens used in combination with the element chip 2a is the same as in the other embodiments. Further, similarly to embodiment 1-2, the adjustment of the curvature is mainly performed according to the inner wall shape of the opening 23 in the flat surface 25 side, and the expansion coefficient of the base 21a, and also in accordance with the capacity of the opening 23. Further, the fact that, in order to perform the curvature adjustment sufficiently, the gas inside the opening 23 when the base 21a is cooled to room temperature may be discharged by the discharge system 37, and that this may be combined with a method of performing atmospheric discharge after the mutual adhesion has taken place in a state of reduced pressure is the same as in embodiment 1-2. Further, the fact that, in order to curve the element chip 2a three-dimensionally with the target curvature without difficulty, the thickness of the element chip 2a may be adjusted is the same as in the other embodiments.

As mentioned above, a solid-state imaging element 1-3 having a curved portion 11 is formed. After the forming of the solid-state imaging element 1-3, the base 21a may be thinned from the back surface as necessary. Further, since the shape of the curved portion 11 is stabilized, resin may be filled and cured inside the opening 23 after the bottom plate 27 is detached.

[Solid-State Imaging Element of Embodiment 1-3]

The solid-state imaging element 1-3 obtained by the above processes is one in which the above-described base 21a is adhered as a package to the convex surface side of the curved portion 11 in the element chip 2a. The element chip 2a is provided with a chip side electrode 15 corresponding to the element chip (2) of the solid-state imaging element (1-1) of embodiment 1-1. Such chip side electrodes 15 are arranged on the back surface side opposite to the surface provided with the imaging region 4 and the peripheral circuits 5 to 8 in the flat portion 13 and are connected one for one with respect to base side electrodes 43 arranged at the base 21a configured as a package. The connection between the chip side electrodes 15 and the base side electrodes 43 is realized by the anisotropic conductive adhesive agent 45 interposed between the flat surface 25 of the base 21a and the element chip 2a. Moreover, the solid-state imaging element 1-3 in which the inside of the opening 23 is discharged or reduced in pressure in the manufacturing processing and the bottom plate 27 is left unchanged as a package is one in which the space portion inside the opening 23 is preserved by a reduced pressure atmosphere.

[Effect of the Embodiment 1-3]

Even in the above embodiment 1-3, similarly to the other embodiments, in the base 21a, in a state where the border of the element chip 2a is fixed to the flat surface 25 of the periphery of the opening 23, only the central portion of the element chip 2a, which is arranged to cover the opening 23, is curved three-dimensionally. The border portion continuing from the peripheral edge of the curved portion 11 formed by this curve is left as a flat portion 13 fixed to the flat surface 25 of the base 21a. Accordingly, it is possible to leave the border portion of the element chip 2a as a flat portion 13 to which no stress is applied by the curve.

Further, when the element chip 2a is curved, compressive stress is applied to the element chip 2a fixed to the base 21a by the contraction of the base 21a. Along with this, tensile stress is applied to the central portion of the element chip 2a by the volumetric contraction of the gas in the opening 23 of the base 21a. In this manner, similarly to the other embodiments, the compressive stress and the tensile stress applied to the center of the element chip 2*a* by the curve cancel each other out and it is possible to curve the element chip 2*a* in a stress-free manner.

Further, the curvature of the curved portion 11 may be adjusted by the expansion coefficient of the base 21*a*, the volume of gas sealed in the opening 23 (capacity of the opening 23), and the discharge of the gas inside the opening 23 from the discharge system 37. For this reason, the curvature of the curved portion 11 may be controlled with high precision and in a wide range.

According to embodiment 1-3 described above, the border portion of the element chip 2*a* is left as the flat portion 13 to which stress due to the curve is not applied, and it is possible to form only the central portion as a three-dimensional curved portion 11. For this reason, it is possible to manufacture the solid-state imaging element 1-3 provided with the three-dimensional curved portion 11 without generating damage such as cracks. As a result, similarly to the other embodiments, it is possible to promote an improvement in the reliability of the solid-state imaging element 1-3 provided with the three-dimensional curved portion 11.

Further, according to embodiment 1-3, by using the base 21*a* as a package, it is possible to cut out the process of assembling the element chip 2*a* and the package with the base side electrode 43 attached as an external terminal. Further, the surface side where the imaging region 4 is arranged in the flat portion 13 of the element chip 2*a* is provided with terminals derived from the peripheral circuits 5 to 8, whereby it is possible to realize a connection with external circuits using these terminals. At this point, since the terminals are provided at the flat portion 13, favorable operability is secured for acquiring a bonded connection with external circuits.

In addition, embodiment 1-3 may be combined with the method of forming a curved portion using the curing contraction of the resin described in embodiment 1-1. In this case, as the resin used in embodiment 1-1, an anisotropic conductive adhesive agent having a curing contraction property is used.

Embodiment 1-4

Example of Fixing the Element Chip to the Base by Vacuum Adsorption

[Configuration of the Base Used in the Method of Manufacturing of Embodiment 1-4]

Figure 7A:
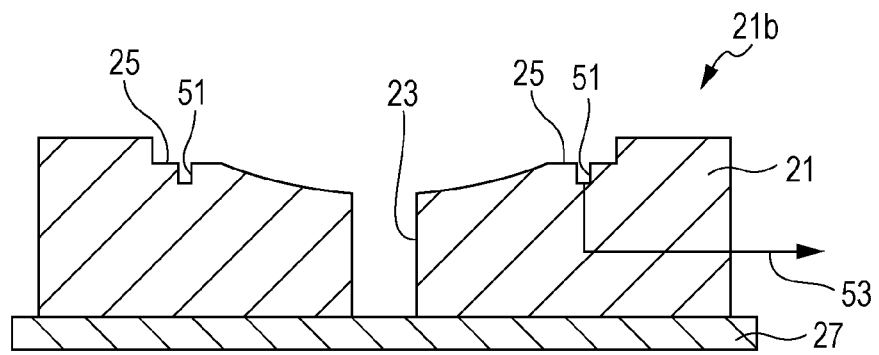
FIGS. 7A and 7B are a cross-sectional view and a plan view of the base using the method of manufacturing of embodiment 1-4.
Figure 7B:
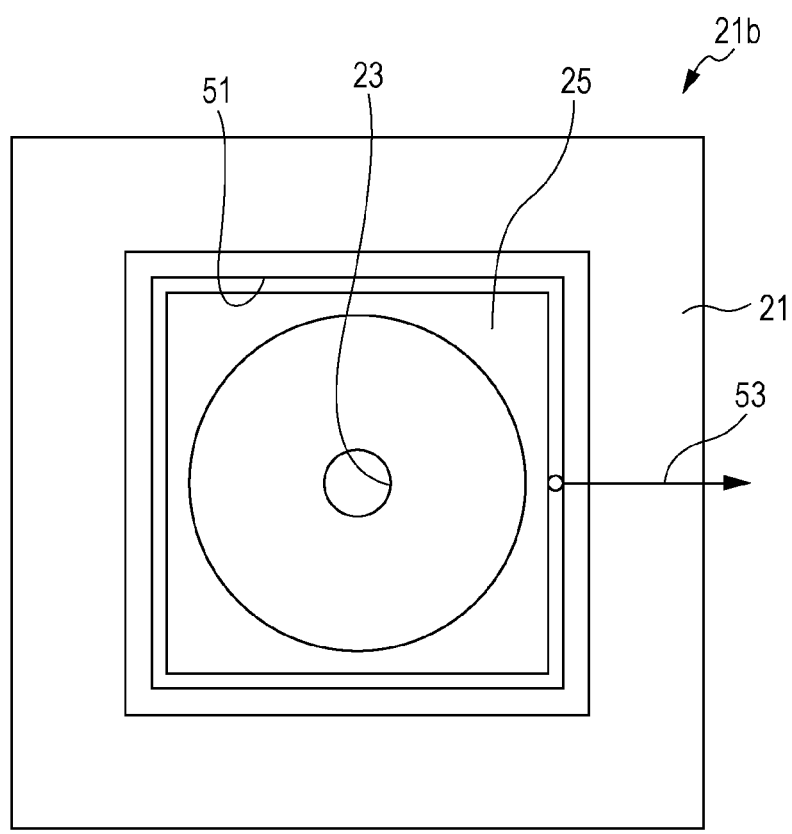

FIGS. 7A and 7B are a cross-sectional view and a plan view of the base using the method of manufacturing of embodiment 1-4. The base 21*b* shown in FIGS. 7A and 7B are different from the bases used in the methods of manufacturing of embodiment 1-1 and embodiment 1-2 in that the base 21*b* is provided with a discharge groove 51 for fixing the element chip. Otherwise the configuration is the same.

That is, for the base 21*b*, the base 21 used in the methods of manufacturing of embodiment 1-1 and embodiment 1-2 is set as a base main body 21, and a discharge groove 51 is provided on the flat surface 25 thereof. The discharge groove 51 is provided in a state of being surrounded by the entire circumference of the opening 23 in the base 21*b*. The discharge groove 51 is connected to a discharge system 53 which is configured to discharge gas from inside the discharge groove 51.

[Method of Manufacturing of Embodiment 1-4]

FIGS. 8A to 8D are cross-sectional process diagrams showing the method of manufacturing the solid-state imaging element of embodiment 1-4. The method of manufacturing of embodiment 1-4 shown in FIGS. 8A to 8D is for manufacturing a solid-state imaging element using the base 21*b* with the above-described configuration and this method of manufacturing will be described below based on the figure.

Figure 8A:
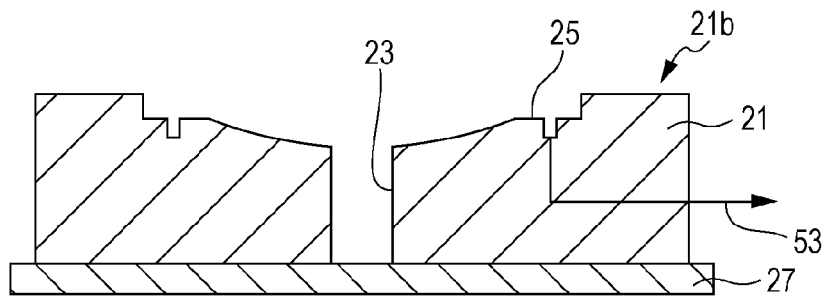
FIGS. 8A to 8D are cross-sectional process diagrams showing the method of manufacturing of embodiment 1-4.

First, as shown in FIG. 8A, the bottom plate 27 is arranged on the opposite side to the side provided with the flat surface 25 in the base 21*b* and the opening 23 of the base 21*b* is covered from one side.

Figure 8B:
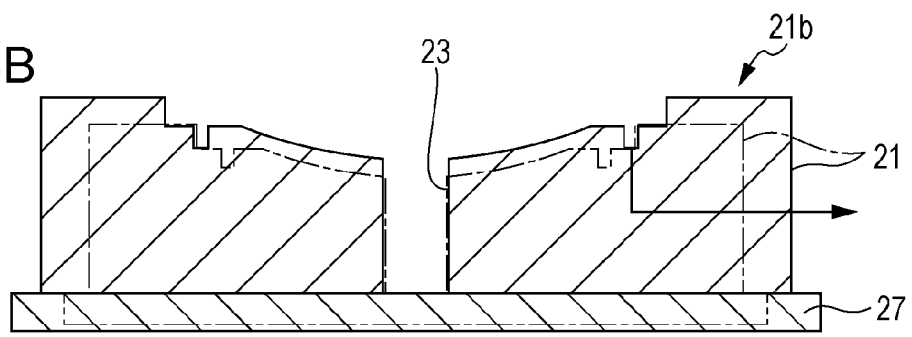

Next, as shown in FIG. 8B, the base 21*b* is heated and expanded. Furthermore, by also heating the bottom plate 27 as necessary, the bottom plate 27 is also caused to expand to the same extent as the base 21*b*. In this manner, the base 21*b* is caused to expand, whereby the diameter of the opening 23 increases and the flat surface 25 is widened to the outside. The heating temperature at this point is set within a range which does not influence the above-described element chip (2), for example, 300° C. or less.

Figure 8C:
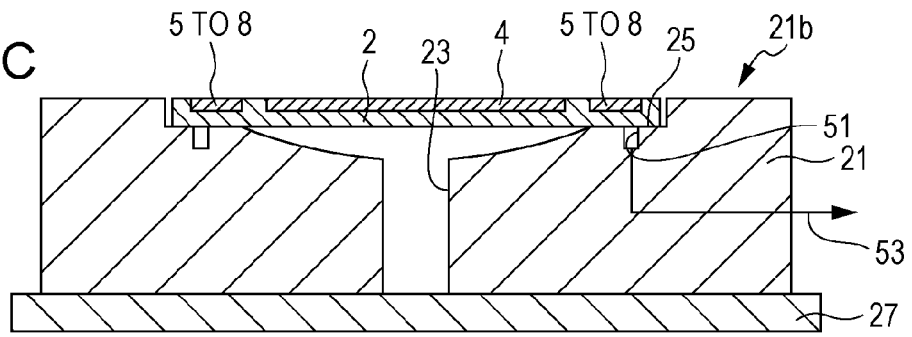

Next, as shown in FIG. 8C, the forming surface (that is, the forming surface of the photoelectric conversion units) of the imaging region 4 in the element chip 2 faces upward and the element chip 2 is mounted on the flat surface 25 of the base 21*b* in a state where the opening 23 of the base 21*b* is covered. At this point, the imaging regions 4 fit within the range of the opening 23 and the border portion of the imaging region 4 is supported by the flat surface 25 of the base 21*b*. Moreover, the entire surface of the discharge groove 51 provided on the flat surface 25 of the base 21*b* is covered by the element chip 2. Further, the fact that, in this state, the peripheral circuits 5 to 8 arranged at the periphery of the imaging region 4 are arranged at the flat surface 25, and may be partially arranged in the range of the opening 23 is the same as in the other embodiments described above.

In such a state, gas in the discharge groove 51 is discharged by the discharge system 53, the pressure in the discharge groove 51 is reduced, and the element chip 2 is fixed by vacuum adsorption to the flat surface 25 of the base 21*b* expanded by heating. At this point, it is important to fix the whole border of the element chip 2 to the flat surface 25. In this manner, the opening 23 of the heated base 21*b* is sealed by the element chip 2 and the bottom plate 27.

Figure 8D:
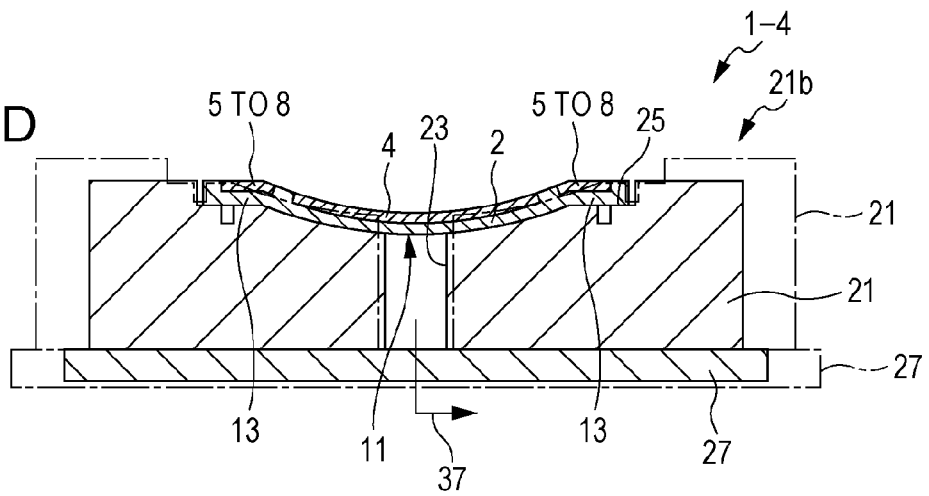

Next, as shown in FIG. 8D, while maintaining the fixing of the element chip 2 with respect to the base 21*b*, the base 21*b* and the bottom plate 27 are cooled to room temperature from the heated state and the gas in the opening 23 of the base 21*b* sealed by the element chip 2 and the bottom plate 27 is also cooled to room temperature. In this cooling process, the base 21*b*, the bottom plate 27, and the gas in the opening 23 contract. At this point, the base 21*b* and the bottom plate 27 contract to the size before heating.

As a result of such a volumetric contraction of the gas in the base 21*b* and opening 23, the central portion of the element chip 2 is pulled toward the inner part of the opening 23 and shaped as a curved portion 11 curved three-dimensionally. The curve shape of the curved portion 11 becomes a shape following the inner wall shape of the opening 23 in the flat surface 25 side of the base 21*b*. Thus, for example, the shape is formed to have a circular bottom portion, similarly to the planar shape of the opening 23 of the base 21*b*. Further, if the shape of the opening 23 is one in which the four corners of a square are curved, a three-dimensional curve is formed with a circle as the bottom portion at a portion near the apex of the curved portion 11. At this point, by fixing the whole border of the element chip 2 to the flat surface 25 by vacuum adsorption, it is possible to evenly apply stress due to the volumetric contraction of the gas inside the opening 23 and stress due to the contraction of the base 21*b* with respect to the central portion of the element chip 2 corresponding to the opening 23. In this manner, it is possible to form a curved portion 11, which is three-dimensionally curved, without generating "wrinkles". For this reason, the fact that it is important to sufficiently fix the whole border of the element chip 2 with respect to the flat surface 25 by adjusting the width w1 of the opening 23 with respect to the outer shape of the element chip 2 is the same as in the other embodiments.

In addition, the fact that, since the inner wall of the opening 23 of the base 21b is set to have a tapered shape and the edge portion of the opening 23 is further set to have a convex surface, it is possible to prevent force from being concentrated at the time of curving in the element chip 2 portion with respect to the edge of the opening 23 and to thereby prevent cracks in this portion of the element chip 2 is the same as in the other embodiments.

In addition, the peripheral portion of the curved portion 11 in the element chip 2 is fixed to the flat surface 25 of the base 21b without curving and left as the flat portion 13. The fact that this flat portion 13 is left over the entire circumference of the curved portion 11 is the same as in the other embodiments.

The fact that the curved portion 11 formed on the element chip 2 has a curvature set to match the field curvature of the optical system such as the lens used in combination with the element chip 2 is the same as in the other embodiments. Further, similarly to embodiments 1-2 and 1-3, the adjustment of the curvature is mainly performed according to the inner wall shape of the opening 23 in the flat surface 25 side, and the expansion coefficient of the base 21b, and also in accordance with the capacity of the opening 23. Further, the fact that, in order to perform the curvature adjustment sufficiently, the gas inside the opening 23 when the base 21b is cooled to room temperature may be discharged by the discharge system 37, and that this may be combined with a method of performing atmospheric discharge after the mutual adhesion has taken place in a state of reduced pressure is the same as in embodiments 1-2 and 1-3. Moreover, the fact that, in order to obtain a three-dimensional curve having the target curvature without difficulty for the element chip 2, the thickness of the element chip 2 may be adjusted is the same as in the other embodiments.

As mentioned above, a solid-state imaging element 1-4 having a curved portion 11 is formed. After the forming of the solid-state imaging element 1-4, since the shape of the curved portion 11 is further stabilized, in a state where the element chip 2 is vacuum-adsorbed to the base 21b, resin may be filled and cured inside the opening 23 after the bottom plate 27 is detached, and the base 21b and the element chip 2 may be integrated. In such a case, after the base 21b and the element chip 2 have been integrated, the base 21b may be thinned from the back surface. Meanwhile, in a case of preserving the shape of the curved portion 11, it is not necessary to integrate the element chip 2 with the base 21b and the solid-state imaging element may be used with the element chip 2 separated from the base 21b.

[Solid-State Imaging Element of Embodiment 1-4]

The solid-state imaging element 1-4 obtained by the above processes is configured such that the central portion of the element chip 2 is set as the curved portion 11 which is three-dimensionally curved. Further, a flat portion 13 is provided so as to be extended from the border portion of such a curved portion 11. The flat portion 13 is arranged over the entire circumference of the curved portion 11 and has a coplanar configuration.

On the concave surface side of the curved portion 11, an imaging region 4 in which photoelectric conversion units are arranged is arranged. The curved portion 11 is set so as to match the field curvature of the optical system such as the lens used in combination with the solid-state imaging element 1-4 and so as to have a curvature in which the photoelectric conversion units are arranged along the field curvature. For this reason, the bottom surface of the curved portion 11 is preferably circular.

Further, the flat portion 13 is provided with peripheral circuits 5 to 8 arranged at the periphery of the imaging region 4. The peripheral circuits 5 to 8 may be partially arranged in the curved portion 11. In addition, the flat portion 13 is provided with terminals derived from the peripheral circuits 5 to 8, and may use these terminals to acquire a connection with an external circuit. At this point, the fact that, since the terminals are provided at the flat portion 13, favorable operability is secured for acquiring a bonded connection with external circuits is the same as in the other embodiments.

Further, the solid-state imaging element 1-4 is configured such that the element chip 2 is supported from the convex surface side of the curved portion 11 by the base 21b and resin is filled in the opening 23 of the base 21b. In this case, the shape of the curved portion 11 is secured by the resin filled in the opening 23.

[Effect of Embodiment 1-4]

Even in the above 1-4 embodiment, similarly to the other embodiments, in the base 21b, in a state where the border of the element chip 2 is fixed to the flat surface 25 of the periphery of the opening 23, only the central portion of the element chip 2, which is arranged to cover the opening 23, is curved three-dimensionally. The border portion continuing from the peripheral edge of the curved portion 11 formed by this curve is left as a flat portion 13 fixed to the flat surface 25 of the base 21b. Accordingly, it is possible to leave the border portion of the element chip 2 as a flat portion 13 to which no stress is applied by the curve.

Further, when the element chip 2 is curved, compressive stress is applied to the element chip 2 fixed to the base 21b by the contraction of the base 21b. Along with this, tensile stress is applied to the central portion of the element chip 2 by the volumetric contraction of the gas in the opening 23 of the base 21b. In this manner, similarly to the other embodiments, the compressive stress and the tensile stress applied to the center of the element chip 2 by the curve cancel each other out and it is possible to curve the element chip 2 in a stress-free manner.

Further, the curvature of the curved portion 11 may be adjusted by the inner wall shape of the flat surface 25 side in the base 21b, the expansion coefficient of the base 21b, the volume of gas sealed in the opening 23 (capacity of the opening 23), and the discharge of the gas inside the opening 23 from the discharge system 37. For this reason, the curvature of the curved portion 11 may be controlled with high precision and in a wide range.

According to embodiment 1-4 described above, the border portion of the element chip 2 is left as the flat portion 13 to which stress due to the curve is not applied, and it is possible to form only the central portion as a three-dimensional curved portion 11. For this reason, it is possible to manufacture the solid-state imaging element 1-4 provided with a three-dimensional curved portion 11 without generating damage such as cracks. As a result, similarly to the other embodiments, it is possible to promote an improvement in the reliability of the solid-state imaging element 1-4 provided with the three-dimensional curved portion 11.

Here, in the 1-1 to 1-4 embodiments described above, an element chip having a MOS-type solid-state imaging element is applied. However, the present disclosure may also apply an element chip having a CCD-type solid-state imaging element. With either the MOS-type solid-state imaging element or the CCD-type solid-state imaging element, it is possible to apply a back surface illuminated type or a surface illuminated type.

In the forms of the embodiments of the present disclosure, when an imaging chip having a MOS-type solid-state imaging element of a back surface illuminated type is used, the light receiving surface area is increased and an improvement in sensitivity is realized, which is preferable.

Below, 1, 1-1 to 1-9 and 1-10 (1-10A to 1-10D) are solid-state imaging apparatuses, 2 and 2a are element chips (solid-state imaging chips), 3 is a pixel (photoelectric conversion unit), 4 is an imaging region, 4a is an imaging surface, 11 is a curved portion, 13 is a flat portion, 15 is a chip side electrode, 21, 21a, 21b and 21c are bases, 23 is an opening, 25 is a flat surface, 31 is resin (adhesive), w1 is an opening diameter, 35 is adhesive, 43 is a base side electrode, 45 is an anisotropic conductive adhesive, 51 is a discharge groove, 55 is a curved concave portion, 91 is an electronic apparatus, and 93 is an optical system.

[Method of Manufacturing Embodiment 2-1]

FIG. 9 is a cross-sectional process diagram describing the method of manufacturing the solid-state imaging element of embodiment 2-1. The method of manufacturing embodiment 2-1 shown in FIG. 9 is a method of manufacturing the solid-state imaging element using the base 21 with the above-described configuration, and description will be given below of the method of manufacturing embodiment 2-1 based on the drawing.

Figure 9A:
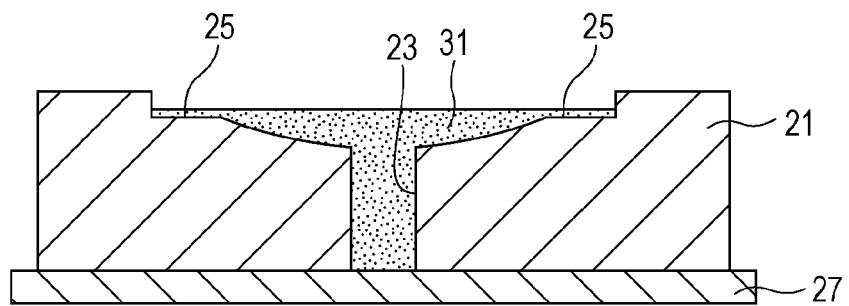
FIGS. 9A to 9C are cross-sectional process diagrams showing the method of manufacturing embodiment 2-1.

First, as shown in FIG. 9A, uncured resin 31 is filled in the opening 23 of the base 21 with the bottom portion blocked by the bottom plate 27. For example, it is preferable that the resin 31 be set to be formed of thermosetting resin using a material with a high rate of curing contraction. Further, the uncured resin 31 used here is set to function after curing as an adhesive agent for the base 21 and the element chip. As such a resin 31, epoxy resins may be used, for example. For example, by adjusting the filler content, the resin material may be used with a curing contraction of around 1 to 8% or higher.

The amount of resin 31 filled in the opening 23 is set to a degree acting as an adhesive agent of the base 21 and the element chip to be mounted next on the upper portion of the base 21 and a degree that may also be supplied to the top of the flat surface 25 of the base 21 in advance. Further, the amount of resin 31 filled in the opening 23 may be an amount at which, when the base 21 and the resin 31 are subsequently heated, the uncured resin 31 expands and the resin 31 is also supplied onto the flat surface 25 of the base 21.

Figure 9B:
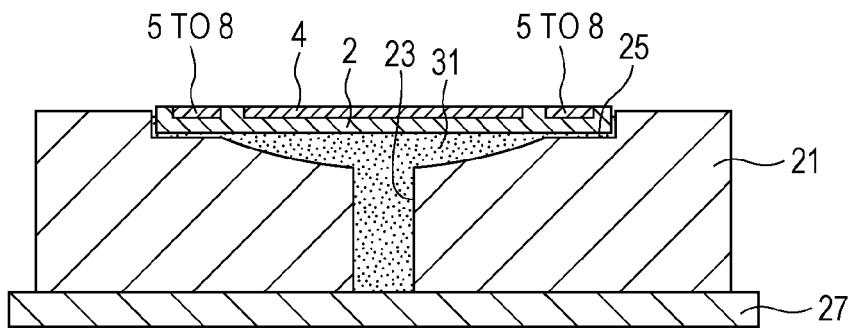

Next, as shown in FIG. 9B, in a state where the opening 23 of the base 21 is covered, the element chip 2 is mounted on the flat surface 25 of the base 21. At this time, the formed surface (that is, the formed surface of the photoelectric conversion unit) of the imaging region 4 in the element chip 2 faces upward and the imaging region 4 is put in the range of the opening 23. Further, the periphery of the imaging region 4 is supported by the flat surface 25 of the base 21 around the entire circumference. In such a state, the peripheral circuits 5 to 8 arranged at the periphery of the imaging region 4 are arranged with respect to the flat surface 25 and a part thereof may be arranged within the range of the opening 23. Here, when the uncured resin 31 is supplied onto the flat surface 25 of the base 21, the uncured resin 31 is interposed as an adhesive agent in the entire area between the flat surface 25 of the base 21 and the element chip 2.

In this state, the resin 31 is heated. For example, the resin 31 may be heated by indirectly heating the resin by heating the base 21, or, additionally, the bottom plate 27 may be heated as desired. Here, when the element chip 2 is directly mounted on the flat surface 25 of the base 21, the resin 31 may be supplied onto the flat surface 25 of the base 21 by the expansion of the uncured resin 31 during the heating process. Even in such a case, the uncured resin 31 is interposed as an adhesive agent in the entire area between the flat surface 25 of the base 21 and the element chip 2.

The heating of the above resin 31 is performed at a temperature in a range which does not influence the element chip 2 and at which the curing of the resin 31 is started, whereby the curing of the resin 31 proceeds. For example, in a case where the above-described epoxy resin is used as the resin 31, heating is performed for around one hour at 160° C. By the curing of the resin 31 in this manner, the element chip 2 is fixed to the flat surface 25 of the base 21. At this time, it is important that the entire circumference of the element chip 2 be fixed to the flat surface 25.

Here, in a period in which the adhesive effect of the resin 31 may be obtained before the curing of the resin 31 is complete, the process of mounting the element chip 2 on the base 21 may be performed during the process of heating the resin 31. In such a case, first, the resin 31 is filled in the opening 23 of the base 21, next, the base 21 is heated and the base 21 and the resin 31 are made to expand. Next, after the element chip 2 is mounted on the base 21 before the resin 31 is cured, the resin 31 is heated to a temperature in a range which does not influence the element chip 2 and at which the curing of the resin 31 is started, whereby the curing of the resin 31 proceeds.

Figure 9C:
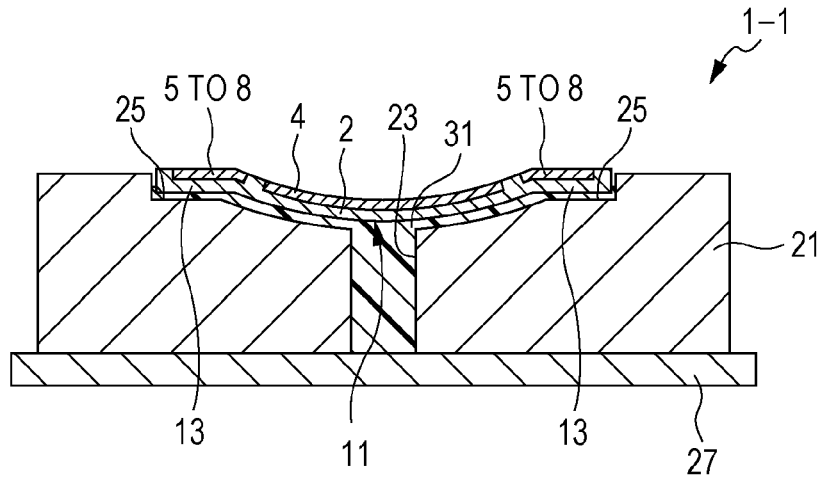

Thereafter, as shown in FIG. 9C, in a state where the element chip 2 is fixed to the flat surface 25 of the base 21, the resin 31 filled in the opening 23 of the base 21 is cooled to room temperature from the heated state. In this manner, the curing contraction of the resin 31 proceeds and the volume thereof is contracted to a greater degree than the uncured state before heating.

By such curing contraction of the resin 31, the central portion arranged with respect to the opening 23 of the base 21 in the element chip 2 is pulled toward the interior of the opening 23 filled with the resin 31 and shaped as a curved portion 11 which is curved three-dimensionally. The curved portion 11 is shaped similarly to the shape of the opening 23 of the base 21, for example, a circular shape having a bottom portion. Further, if the shape of the opening 23 is a square with four rounded corners, a three-dimensional curve is formed with a circle as the bottom portion at the portion close to the apex of the curved portion 11. At this time, by fixing the entire circumference of the peripheral edge of the element chip 2 to the flat surface 25, it is possible to evenly apply stress caused by the curing contraction of the resin 31 with respect to the central portion of the element chip 2 corresponding to the opening 23. In this manner, it is possible to form a curved portion 11 which is curved three-dimensionally without generating "wrinkles".

Here, in order to sufficiently fix the entire circumference of the peripheral edge of the element chip 2 with respect to the flat surface 25, it is important to adjust the width w1 of the opening 23 with respect to the outer shape of the element chip 2 so that the flat portion 13 is preserved with a certain width or greater. As an example, if the shape of the element chip 2 has an outer shape of 4 mm×4 mm and a thickness of approximately 15 µm, the flat portion 13 at the entire circumference of the element chip 2 is set so as to be left with a width of 0.3 mm or more.

Further, by giving the inner wall of the opening 23 of the base 21a tapered shape and making the edge portion of the opening 23 a convex curved surface, it is possible to prevent stress at the time of curving from being focused at the element chip 2 portion corresponding to the edge of the opening 23 and to prevent cracking of the element chip 2 at this portion.

Meanwhile, the periphery of the curved portion 11 in the element chip 2 is left as a flat portion 13 which is fixed to the flat surface 25 of the base 21 without curving. The flat portion 13 is left over the entire circumference of the curved portion 11.

The curved portion 11 to be formed on the element chip 2 preferably has a curvature matching the imaging surface curvature of the optical system such as a lens used in combination with the element chip 2, for example, a curvature of approximately 10% to 20%, for instance, approximately 17%. Such adjustment of the curvature may be performed by adjusting the inner wall shape of the flat surface 25 side in the opening 23, the rate of volumetric contraction (curing contraction rate) at the time of curing the resin 31, and the volume of the resin 31 filled in the opening 23. When it is desired to increase the curvature of the curved portion 11, a resin 31 with a large rate of curing contraction is used, or the capacity of the opening 23 is increased and the volume of the resin 31 to be filled in the opening 23 is made larger. Further, these may be used in combination as appropriate.

Further, in order to make the element chip 2 curve three-dimensionally so as to have the target curvature without difficulty, the thickness of the element chip 2 may be adjusted. For this reason, in contrast to a case where the bottom surface area of the curved portion 11 is large, it is preferable that the thickness of the element chip 2 be made smaller as the bottom surface area of the curved portion 11 becomes smaller.

In the above manner, a solid-state imaging element 1-1 having a curved portion 11 is formed. After the formation of the solid-state imaging element 1-1, the base 21 and the resin 31 may be thinned from the back surface as desired. Further, in a case where the shape of the curved portion 11 is preserved, the element chip 2 may be peeled off from the base 21 and the resin 31 and set as a solid-state imaging element 1-1. In order to facilitate the peeling off of the element chip 2 in this manner, the back surface (surface facing the base 21) of the element chip 2 may be coated with a peeling agent before the element chip 2 is mounted on the base 21. Further, the thermosetting resin 31 filled in the opening 23 is used as an adhesive to fix the base 21 and the element chip 2. However, in addition to the thermosetting resin 31 filled in the opening 23, a photocurable resin may also be used as an adhesive to fix the base 21 and the element chip 2. In such a case, on the flat surface 25 of the expanded base 21, the element chip 2 is mounted onto an interposed adhesive agent formed of photocurable resin cured by being illuminated with long wavelength light. In this state, the above-described fixing is performed by curing the adhesive agent using light illumination of a wavelength passing through the element chip 2. As an example, when the element chip 2 is configured of monocrystal silicon, light illumination is performed using long wavelength light having a wavelength of approximately 700 nm or greater. In this manner, the adhesive agent is cured using the long wavelength light passing through the element chip 2 and reaching the photocurable resin.

[Solid-State Imaging Element of Embodiment 2-1]

As shown in FIG. 1, the solid-state imaging element 1-1 obtained by the above processes is configured as a curved portion 11 in which the central portion of the element chip 2 is curved three-dimensionally. Further, a flat portion 13 extending from the peripheral portion of the curved portion 11 is provided. The flat portion 13 is arranged at the entire circumference of the curved portion 11 and has a coplanar configuration.

An imaging region 4 in which photoelectric conversion units are disposed is arranged on the concave curved surface side of the curved portion 11. The curved portion 11 is set with a curvature which matches the imaging surface curvature of the optical system such as a lens used in combination with the solid-state imaging element 1-1 and in which photoelectric conversion units are arranged along the imaging surface curvature. For this reason, it is preferable that the bottom surface of the curved portion 11 has a circular shape.

Further, peripheral circuits 5 to 8 arranged at the periphery of the imaging region 4 are provided in the flat portion 13. The peripheral circuits 5 to 8 are arranged on the flat portion 13, and a part thereof may be arranged on the curved portion 11. Here, terminals protruding from the peripheral circuits 5 to 8 are provided in the flat portion 13, whereby it is possible to connect with external circuits using the terminals. At this time, by providing the terminals in the flat portion 13, favorable operability is secured for obtaining a bonding-like connection to external circuits. However, the terminals protruding from the peripheral circuits 5 to 8 are not limited to being provided at the flat portion 13 and may be arranged at the curved portion 11 or may protrude to the convex curved surface side in the curved portion 11.

In addition, in the solid-state imaging element 1-1, in a state where the curved portion 11 of the element chip 2 is inserted inside the opening 23 of the above-described base 21, the base 21 is adhered to the convex curved surface side of the curved portion 11 in the element chip 2. The element chip 2 and the base 21 are set to be fixed at the entire circumference surrounding the curved portion 11 with the resin 31 interposed between the flat surface 25 and the element chip 2 as an adhesive. Further, resin 31 is filled in the opening 23 of the base 21, whereby the shape of the curved portion 11 is secured by the resin 31.

[Effect of Embodiment 2-1]

According to the above embodiment 2-1, in the base 21, in a state where the peripheral edge of the element chip 2 is fixed to the flat surface 25 of the periphery of the opening 23, only the central portion of the element chip 2 arranged to cover the opening 23 is three-dimensionally curved. The peripheral edge portion of the element chip 2 continuing from the peripheral edge of the curved portion 11 formed by this curvature is left as the flat portion 13 fixed to the flat surface 25 of the base 21. Accordingly, it is possible to leave the peripheral edge of the element chip 2 as the flat portion 13 to which stress is not applied by the curvature.

Further, the curvature of the curved portion 11 may be adjusted using the curing contraction rate of the resin 31 filled inside the opening 23 and the volume (capacity of the opening 23) of the resin 31. For this reason, it is possible to control the curvature of the curved portion 11 with high precision and within a wide range.

According to embodiment 2-1 above, the peripheral edge portion of the element chip 2 is left as the flat portion 13 to which stress is not applied by the curvature, whereby it is possible to form only the central portion as a three-dimensionally curved portion 11. For this reason, it is possible to manufacture the solid-state imaging element 1-1 provided with the three-dimensionally curved portion 11 without generating damage such as cracking. As a result, it is possible to improve the reliability of the solid-state imaging element 1-1 provided with the three-dimensionally curved portion 11.

3. Embodiment 2-2

Example of Curving the Element Chip by Negative Pressure

[Configuration of the Base Using the Method of Manufacturing Embodiment 2-2]

As the base 21 using the method of manufacturing embodiment 2-2, the same base 21 described using FIG. 2 in embodiment 2-1 is used with the addition of an attached discharge system capable of discharging from the inside of the opening 23. The discharge system may, for example, adopt a configuration of discharging gas inside the opening 23 from the bottom plate 27 side which blocks the opening 23 of the base 21 from one side. Further, a configuration may be adopted in which holes for discharging are provided in the base 21 and between the base 21 and the bottom plate 27 and gas from inside the opening 23 is discharged from the holes.

[Method of Manufacturing Embodiment 2-2]

Figure 10A:
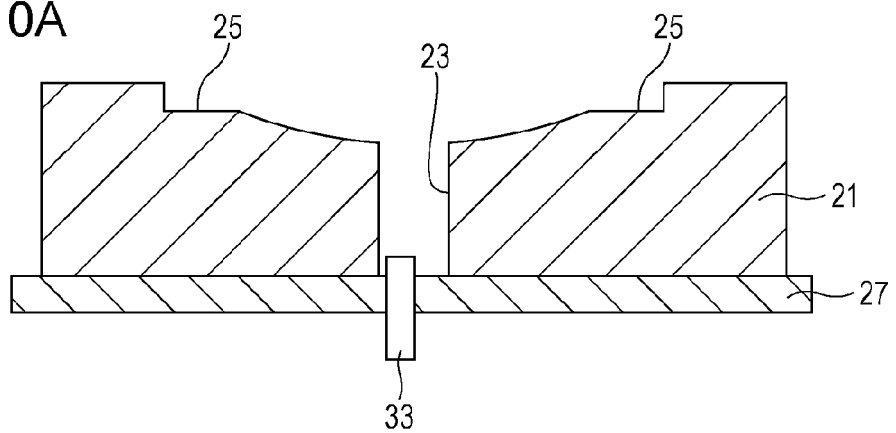
FIGS. 10A to 10C are cross-sectional process diagrams showing the method of manufacturing embodiment 2-2.
Figure 10B:
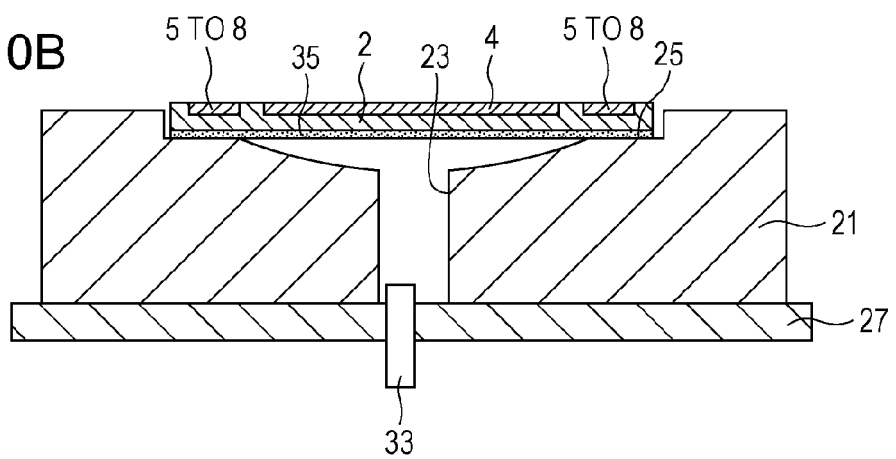
Figure 10C:
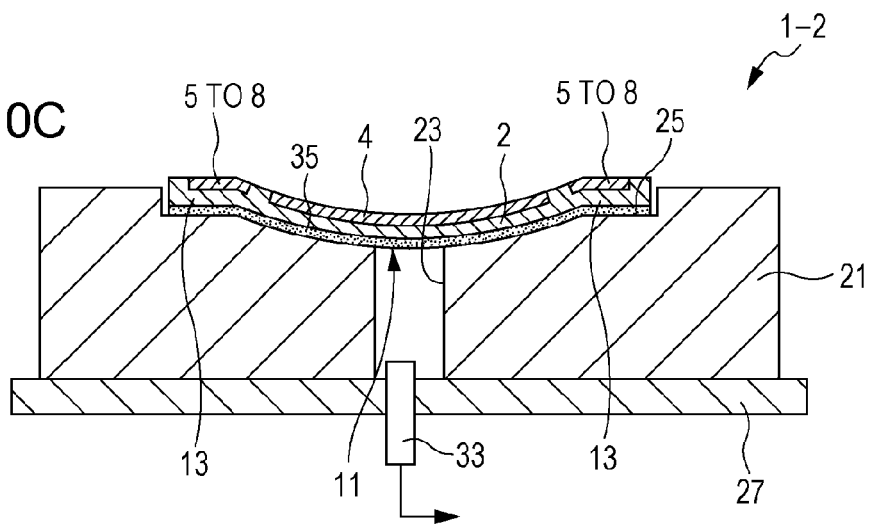

FIGS. 10A to 10C are cross-sectional views describing the method of manufacturing the solid-state imaging element of embodiment 2-2. Below, description will be given of the manufacturing method based on the drawings.

First, as shown in FIG. 10A, a bottom plate 27 is arranged at the opposite side to the side where the flat surface 25 is provided in the base 21, and the opening 23 of the base 21 is blocked in advance from one side. In such a state, a discharge system 33 discharging gas from inside the above-described opening 23 is attached to the bottom plate 27, for example.

Next, as shown in FIG. 10B, in a state where the opening 23 of the base 21 is covered, the element chip 2 is mounted on the flat surface 25 of the base 21 with the forming surface (that is, the forming surface of the photoelectric conversion units) of the imaging region 4 in the element chip 2 facing upward. An adhesive agent 35 formed of, for example, thermosetting resin or photocurable resin is arranged on the mounting surface side toward the base 21 in the element chip 2. As shown in the drawings, the adhesive agent 35 may be arranged on the entire surface of the mounting surface side toward the base 21 in the element chip 2 or may be arranged only at the peripheral edge of the element chip 2 corresponding to the flat surface 25 of the base 21. However, it is important that the adhesive agent 35 be interposed between the flat surface 25 of the base 21 and the element chip 2 at the entire circumference surrounding the opening 23.

At this time, the imaging region 4 is put in the range of the opening 23 and the periphery of the imaging region 4 is supported by the flat surface 25 of the base 21 across the entire surface using the adhesive agent 35. Further, in this state, the peripheral circuits 5 to 8 arranged at the periphery of the imaging region 4 are arranged with respect to the flat surface 25 and a part thereof may be arranged in the range of the opening 23, which is the same as the above-described embodiment 2-1.

In this state, the element chip 2 is fixed on the flat surface 25 of the base 21 by the adhesive agent 35 interposed between the flat surface 25 of the base 21 and the element chip 2. At this time, it is important that the entire circumference of the peripheral edge of the element chip 2 be fixed to the flat surface 25. For example, when a thermosetting resin is used as the adhesive agent 35, the above-described fixing is performed by curing the adhesive agent 35 using a heating process. As an example, when an epoxy resin is used, a heating process is performed at 160° C. for 15 minutes. Meanwhile, when a photocurable resin is used as the adhesive agent 35, the above-described fixing is performed by curing the adhesive agent 35 using long wave light illumination passing through the element chip 2. As an example, when the element chip 2 is configured of monocrystal silicon, light illumination is performed using long wavelength light with a wavelength of 700 nm or more. In this manner, the opening 23 of the base 21 is sealed by the element chip 2 and the bottom plate 27.

Next, as shown in FIG. 10C, the gas in the sealed opening 23 of the base 21 is discharged using the discharge system 33. In this manner, the central portion arranged corresponding to the opening 23 of the base 21 in the element chip 2 is pulled toward the interior of the opening 23 and shaped as the curved portion 11 which is curved three-dimensionally. Similarly to the shape of the opening 23 of the base 21, the curved portion 11 is shaped to have a circular bottom portion, for example.

Further, if the shape of the opening 23 is a square with four rounded corners, a three-dimensional curve is formed with a circle as the bottom portion at the portion close to the apex of the curved portion 11. At this time, by fixing the entire circumference of the peripheral edge of the element chip 2 to the flat surface 25, it is possible to evenly apply stress caused by the discharge in the opening 23 with respect to the central portion of the element chip 2 corresponding to the opening 23. In this manner, it is possible to form a curved portion 11 curved in a three-dimensional manner without generating "wrinkles". For this reason, the fact that it is important to sufficiently fix the entire circumference of the peripheral edge of the element chip 2 with respect to the flat surface 25 by adjusting the width w1 of the opening 23 with respect to the outer shape of the element chip 2 is the same as in embodiment 2-1. Further, this effect is even more reliable when the opening 23 is circular.

Further, by giving the inner wall of the opening 23 of the base 21a tapered shape and making the edge portion of the opening 23 a convex curved surface, it is possible to prevent stress at the time of curving from being focused at the element chip 2 portion corresponding to the edge of the opening 23 and to prevent cracking of the element chip 2 at this portion, which is the same as embodiment 2-1.

Further, the peripheral portion of the curved portion 11 in the element chip 2 is fixed to the flat surface 25 of the base 21 without curving and is left as a flat portion 13. The fact that the flat portion 13 is left across the entire circumference of the curved portion 11 is also the same as in embodiment 2-1.

The fact that the curved portion 11 formed on the element chip 2 has a curvature matching the imaging surface curvature of the optical system such as a lens used in combination with the element chip 2 is the same as in embodiment 2-1. Such adjustment of the curvature may be performed by adjusting the inner wall shape of the opening 23 at the flat surface 25 side and the pressure in the opening 23. When it is desired to increase the curvature of the curved portion 11, the pressure difference inside and outside the opening 23 may be increased using the element chip 2. Here, as another method, in which negative pressure is applied to the opening 23, there is a method using a vacuum chamber without providing a discharge system 33. In such a case, a state of mounting the element chip 2 on the base 21 in the vacuum chamber is set, negative pressure is applied to the inside of the opening 23 of the base 21 by applying negative pressure to the inside of the vacuum chamber, and the inside of the opening 23 is set to a sealed state by expanding the element chip 2 to match the base 21 expanded in this state. Thereafter, by discharging the base 21 and the element chip 2 into the atmosphere, a curve is created toward the inside of the opening 23 of the base 21. Further, in order to make the element chip 2 curve three-dimensionally so as to have the target curvature without difficulty, the thickness of the element chip 2 may be adjusted, which is the same as embodiment 2-1.

In the above manner, a solid-state imaging element 1-2 having a curved portion 11 is formed. After the formation of the solid-state imaging element 1-2, the base 21 may be thinned as desired from the back surface. Further, in order to stabilize the shape of the curved portion 11, the resin may be filled in the opening 23 and cured after the bottom plate 27 is removed. Meanwhile, when the shape of the curved portion 11 is to be preserved, the element chip 2 may be peeled off from the base 21. In order to facilitate the peeling off of the element chip 2 in this manner, the back surface (surface facing the base 21) of the element chip 2 may be coated with a peeling agent before the element chip 2 is mounted on the base 21.

[Solid-State Imaging Element of Embodiment 2-2]

The solid-state imaging element 1-2 obtained by the above processes is the solid-state imaging element of embodiment 2-1 with the inside of the opening 23 of the base 21 set as a space portion. Further, the inside of the opening 23 is discharged or set to a negative pressure during the manufacturing processes, and, in a state where the bottom plate 27 is left unchanged as a package, the negative pressure atmosphere inside the opening 23 is preserved. However, when resin is filled inside the opening 23 of the base 21, the inside of the opening 23 is enclosed by the resin in the same manner as the solid-state imaging element of embodiment 2-1.

[Effect of Embodiment 2-2]

According to the embodiment 2-2 described above, in the same manner as embodiment 2-1, in a state where the peripheral edge of the element chip 2 is fixed to the flat surface 25 of the periphery of the opening 23, only the central portion of the element chip 2 arranged to cover the opening 23 is curved three-dimensionally in the base 21. The peripheral edge portion of the element chip 2 continuing from the peripheral edge of the curved portion 11 formed by the curvature is left as a flat portion 13 fixed to the flat surface 25 of the base 21. Accordingly, the peripheral edge portion of the element chip 2 may be left as a flat portion 13 to which stress is not applied by the curvature.

Further, the curvature of the curved portion 11 may be adjusted by the pressure difference between the inside and the outside of the opening 23 through the element chip 2. For this reason, it is possible to control the curvature of the curved portion 11 with high precision and within a wide range.

According to the above-described embodiment 2-2, it is possible to leave the peripheral edge portion of the element chip 2 as a flat portion 13 to which stress is not applied by the curvature and to form only the central portion as the three-dimensional curved portion 11. For this reason, it is possible to manufacture a solid-state imaging element 1-2 provided with a three-dimensional curved portion 11 without generating damage such as cracking. As a result, similarly to embodiment 2-1, it is possible to improve the reliability of the solid-state imaging element 1-2 provided with the three-dimensional curved portion 11.

4. Embodiment 2-3

Example of Using the Base as a Package

[Configuration of Base Using the Method of Manufacturing Embodiment 2-3]

Figure 11A:
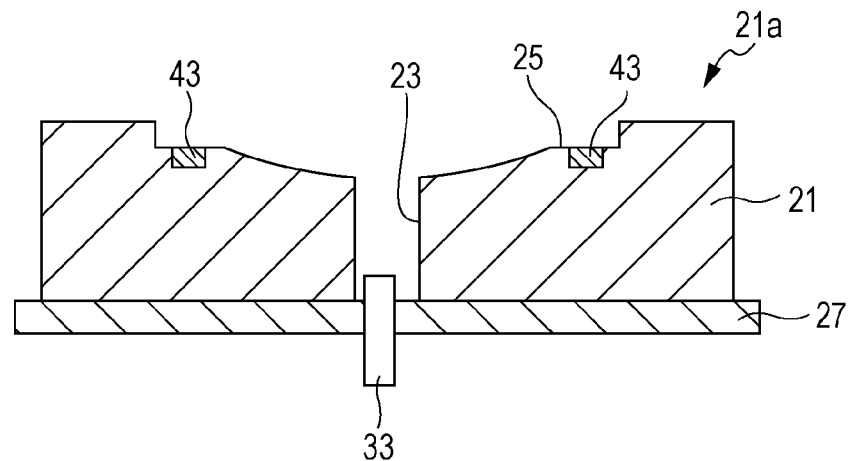
FIGS. 11A and 11B are a cross-sectional view and a plan view of a base used in the method of manufacturing embodiment 2-3.
Figure 11B:
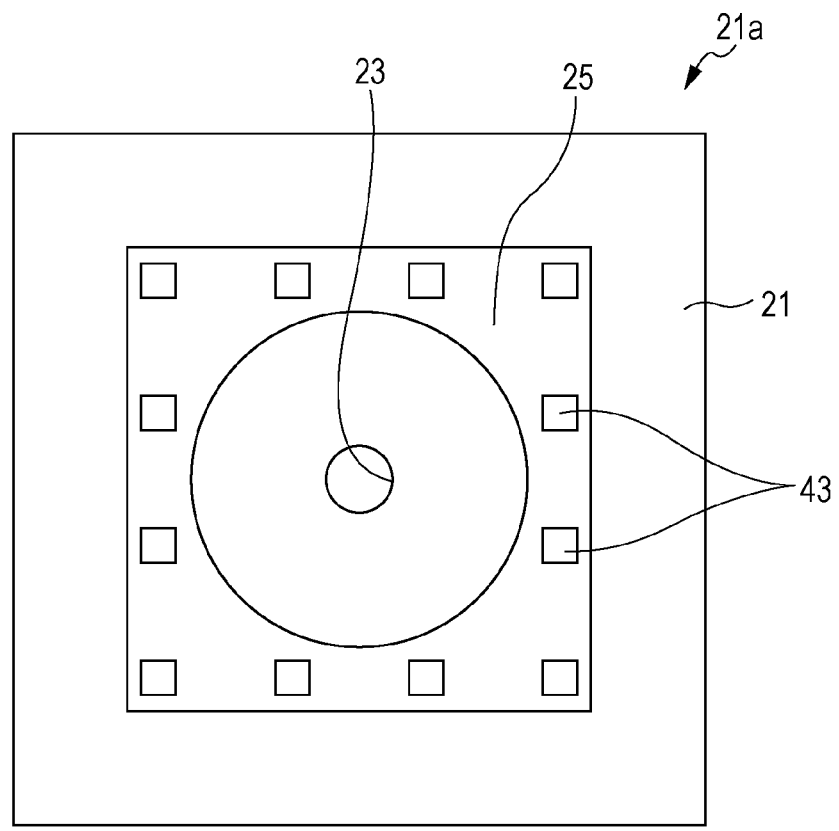

FIGS. 11A and 11B are a cross-sectional view and a plan view of a base used in the method of manufacturing embodiment 2-3. The base 21a shown in the drawings is different from the bases used in the methods of manufacturing embodiment 2-1 and embodiment 2-2 in that the base 21a has a configuration functioning as a package and a base side electrode 43 is provided on the flat surface 25.

In other words, the base 21a has a configuration in which the base 21 used in the method of manufacturing embodiment 2-1 and embodiment 2-2 is set as the base main body 21 and the base side electrode 43 is arranged on the flat surface 25 thereof. The base side electrode 43 is arranged with respect to the chip side electrode provided on the element chip described below and arranged in a state of being embedded in the flat surface 25. That is, the surface of the base side electrode 43 configures a part of the flat surface 25. The base side electrode 43 is configured to protrude from the flat surface 25 of the base 21a and to connect to external members. Here, the base 43 may be provided at the inner wall of the flat surface 25 side in the opening 23.

Here, when the base main body 21 is configured using a conductive material, it is set so that the flat surface 25 side of the base main body 21 is configured by an insulating film, the base side electrode 43 is arranged in a state of being embedded in the insulating film and the insulating property of each base side electrode 43 is preserved.

Further, a discharge system 33 capable of discharging from the inside of the opening 23 is attached to the base 21a. The discharging system 33, for example, may have a configuration discharging gas from inside the opening 23 from the side of the bottom plate 27 blocking the opening 23 of the base 21 from one side. Further, a configuration may be adopted in which holes for discharging are provided in the base 21 and between the base 21 and the bottom plate 27 and gas from inside the opening 23 is discharged from the holes.

[Method of Manufacturing Embodiment 2-3]

Figure 12A:
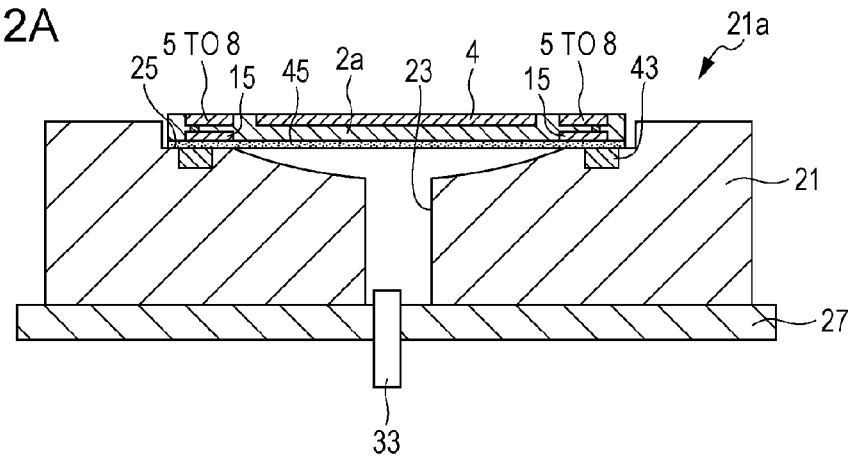
FIGS. 12A to 12C are cross-sectional process diagrams showing the method of manufacturing embodiment 2-3.
Figure 12B:
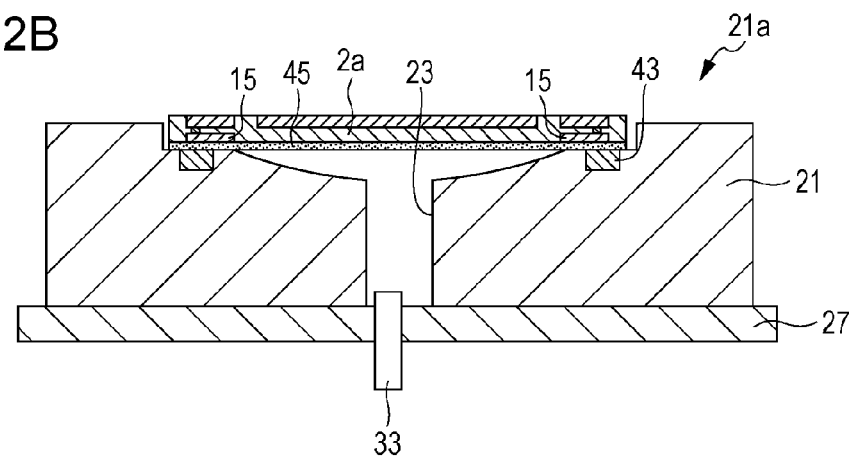
Figure 12C:
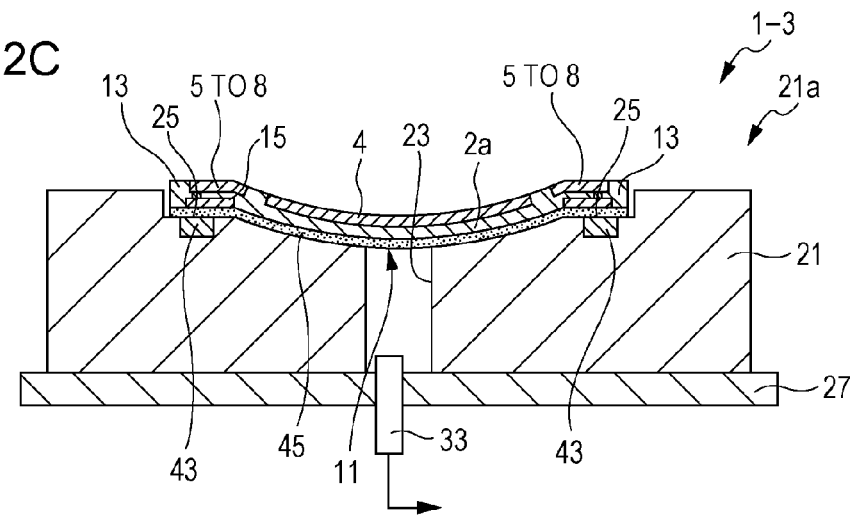

FIGS. 12A to 12C are cross-sectional process diagrams describing the method of manufacturing the solid-state imaging element of embodiment 2-3. The method of manufacturing embodiment 2-3 shown in FIG. 12 is the method of manufacturing the solid-state imaging element using the base 21a having the above-described configuration and the manufacturing method will be described below based on the drawings.

First, as shown in FIG. 12A, the bottom plate 27 is arranged on the opposite side to the side provided with the flat surface 25 in the base 21a and the opening 23 of the base 21a is blocked in advance from one side.

Next, the element chip 2a is mounted on the base 21a. The element chip 2a used here is provided with chip side electrodes 15 on the back surface opposite to the surface provided with the imaging region 4 and the peripheral circuits 5 to 8. The chip side electrodes 15 protrude from the imaging region 4 and the peripheral circuits 5 to 8 and are arranged at a position corresponding to the base side electrode 43, for example, a peripheral edge portion in the element chip 2a.

Further, an anisotropic conductive adhesive agent 45 is arranged on the surface side where the chip side electrodes 15 are arranged in this manner in the element chip 2a. The anisotropic conductive adhesive agent 45 has a configuration in which conductive fine particles are dispersed in thermosetting resin or photocurable resin. As illustrated, the anisotropic conductive adhesive agent 45 may be arranged on the entire surface of the surface where the chip side electrodes 15 are arranged in the element chip 2a, or may be arranged only at the peripheral edge of the element chip 2a with respect to the flat surface 25 of the base 21. However, it is important that the anisotropic conductive adhesive agent 45 be interposed between the flat surface 25 of the base 21a and the element chip 2a in the entire circumference surrounding the opening 23.

In this manner, in a state where the opening 23 of the base 21a is covered, the element chip 2a is mounted on the flat surface 25 of the base 21a with the forming surface (that is, the forming surface of the photoelectric conversion units) of the imaging region 4 in the element chip 2a facing upward. Accordingly, the anisotropic conductive adhesive agent 45 is interposed between the flat surface 25 of the base 21a and the element chip 2a.

At this time, the position of the element chip 2a is aligned with respect to the base 21a so that the chip side electrodes 15 provided on the element chip 2a and the base side electrodes 43 provided on the flat surface 25 of the base 21a are arranged so as to correspond one to one with each other. Further, the imaging region 4 of the element chip 2a is put in the range of the opening 23 of the base 21a and the peripheral edge portion of the imaging region 4 is supported by the flat surface 25 of the base 21a through the anisotropic conductive adhesive agent 45. Further, in this state, the peripheral circuits 5 to 8 arranged at the periphery of the imaging region 4 are arranged on the flat surface 25 and a part thereof may be arranged in the range of the opening 23, which is the same as each embodiment described above.

In this state, as shown in FIG. 12B, the element chip 2a is fixed on the flat surface 25 of the base 21a by the anisotropic conductive adhesive agent 45 interposed between the flat surface 25 of the base 21a and the element chip 2a. At this time, it is important that the entire circumference of the peripheral edge of the element chip 2a be fixed to the flat surface 25. For example, when a thermosetting resin is used as the anisotropic conductive adhesive agent 45, the above-described fixing is performed by curing the thermosetting resin using a heating process. As an example, when an epoxy resin is used, a heating process is performed at 160° C. for 15 minutes. Meanwhile, when a photocurable resin is used as the anisotropic conductive adhesive agent 45, the above-described fixing is performed by curing the photocurable resin using long wave light illumination passing through the element chip 2a. As an example, when the element chip 2a is configured of monocrystal silicon, light illumination is performed using long wavelength light with a wavelength of 700 nm or more. Above, the opening 23 of the base 21a is sealed by the element chip 2a and the bottom plate 27. Further, the base side electrodes 43 and the chip side electrodes 15 are connected by the anisotropic conductive adhesive agent 45.

Next, as shown in FIG. 12C, the gas inside the sealed opening 23 of the base 21a is discharged using the discharging system 33. In this manner, the central portion arranged with respect to the opening 23 of the base 21a in the element chip 2a is pulled toward the interior of the opening 23 and shaped as the curved portion 11 which is curved three-dimensionally. Similarly to the shape of the opening 23 of the base 21a, the curved portion 11 is shaped to have a circular bottom portion, for example. Further, if the shape of the opening 23 is a square with four rounded corners, a three-dimensional curve is formed with a circle as the bottom portion at the portion close to the apex of the curved portion 11. At this time, by fixing the entire circumference of the peripheral edge of the element chip 2a to the flat surface 25, it is possible to evenly apply stress caused by the discharge in the opening 23 with respect to the central portion of the element chip 2a corresponding to the opening 23. In this manner, it is possible to form a curved portion 11 curved in a three-dimensional manner without generating "wrinkles". For this reason, the fact that it is important to sufficiently fix the entire circumference of the peripheral edge of the element chip 2a with respect to the flat surface 25 by adjusting the width w1 of the opening 23 with respect to the outer shape of the element chip 2a is the same as in the other embodiments. Further, this effect is even more reliable when the opening 23 is circular.

Further, by giving the inner wall of the opening 23 of the base 21a a tapered shape and making the edge portion of the opening 23 a convex curved surface, it is possible to prevent stress at the time of curving from being focused at the element chip 2a portion corresponding to the edge of the opening 23 and to prevent cracking of the element chip 2a at this portion, which is the same as the other embodiments.

Further, the peripheral portion of the curved portion 11 in the element chip 2a is fixed to the flat surface 25 of the base 21a without curving and is left as a flat portion 13. The fact that the flat portion 13 is left across the entire circumference of the curved portion 11 is also the same as the other embodiments.

The fact that the curved portion 11 formed on the element chip 2a has a curvature matching the imaging surface curvature of the optical system such as a lens used in combination with the element chip 2a is the same as in the other embodiments. Similarly to embodiment 2-2, such adjustment of the curvature may be performed by adjusting the inner wall shape of the opening 23 mainly at the flat surface 25 side and the pressure in the opening 23. When it is desired to increase the curvature of the curved portion 11, the pressure difference inside and outside the opening 23 may be increased using the element chip 2a. Further, in order to make the element chip 2a curve three-dimensionally so as to have the target curvature without difficulty, the thickness of the element chip 2a may be adjusted, which is the same as the other embodiments. Here, as another method, in which negative pressure is applied inside the opening 23 to cause volumetric contraction and thereby cause the element chip 2a to curve, a method of performing atmospheric discharge after the base 21 and the element chip 2a are stuck together in the state of negative pressure may be applied, which is the same as embodiment 2-2.

In this manner, a solid-state imaging element 1-3 having a curved portion 11 is formed. After the formation of the solid-state imaging element 1-3, the base 21a may be thinned as desired from the back surface. Further, in order to stabilize the shape of the curved portion 11, the resin may be filled in the opening 23 and cured after the bottom plate 27 is removed.

[Solid-State Imaging Element of Embodiment 2-3]

The solid-state imaging element 1-3 obtained by the above processes has the above-described base 21a attached as a package to the convex curved side surface of the curved portion 11 in the element chip 2a. The element chip 2a corresponds to the element chip (2) of the solid-state imaging element (1-1) of embodiment 2-1 with a chip side electrode 15 provided thereon. The chip side electrodes 15 are arranged on the back surface side opposite the surface provided with the imaging region 4 and the peripheral circuits 5 to 8 in the flat portion 13, and are connected one to one with respect to the base side electrodes 43 arranged on the base 21a which is a package. The connection of the chip side electrodes 15 and the base side electrodes 43 is formed by the anisotropic conductive adhesive agent 45 interposed between the flat surface 25 of the base 21a and the element chip 2a. Further, in a state where the inside of the opening 23 is discharged or negative pressure is applied thereto during the manufacturing processes and the bottom plate 27 is left unchanged as a package, the negative pressure atmosphere is preserved inside the opening 23.

[Effect of Embodiment 2-3]

Even for the embodiment 2-3 described above, in the same manner as the other embodiments, in a state where the peripheral edge of the element chip 2a is fixed to the flat surface 25 of the periphery of the opening 23, only the central portion of the element chip 2a arranged to cover the opening 23 is curved three-dimensionally in the base 21a. The peripheral edge portion of the element chip 2a continuing from the peripheral edge of the curved portion 11 formed by the curvature is left as a flat portion 13 fixed to the flat surface 25 of the base 21a. Accordingly, the peripheral edge portion of the element chip 2a may be left as a flat portion 13 to which stress is not applied by the curvature.

Further, the curvature of the curved portion 11 may be adjusted by the pressure difference between the inside and the outside of the opening 23 through the element chip 2a. For this reason, it is possible to control the curvature of the curved portion 11 with high precision and within a wide range.

According to the above embodiment 2-3, the peripheral edge portion of the element chip 2a is left as the flat portion 13 to which stress is not applied by the curvature, whereby it is possible to form only the central portion as a three-dimensionally curved portion 11. For this reason, it is possible to manufacture a solid-state imaging element 1-3 provided with a three-dimensional curved portion 11 without generating damage such as cracking. As a result, similarly to the other embodiments, it is possible to improve the reliability of the solid-state imaging element 1-3 provided with the three-dimensional curved portion 11.

In addition, according to the embodiment 2-3, by using the base 21a as a package, it is possible to eliminate the process of assembling the package attached to the element chip 2a and the base side electrode 43 as an external terminal. Further, terminals protruding from the peripheral circuits 5 to 8 are provided on the surface side where the imaging region 4 is arranged on the flat portion 13 of the element chip 2a, whereby it is possible to connect to external circuits using the terminals. At this time, by providing the terminals in the flat portion 13, favorable operability is secured for obtaining a bonding-like connection to external circuits.

Here, embodiment 2-3 may be combined with the method of forming the curved portion using the curing contraction of the resin described in embodiment 2-1. In such a case, as the resin used in embodiment 2-1, an anisotropic conductive adhesive agent having a curing contraction property is used.

5. Embodiment 2-4

Example of Fixing the Element Chip to the Base by Vacuum Adsorption

[Configuration of Base Using the Method of Manufacturing Embodiment 2-4]

Figure 13A:
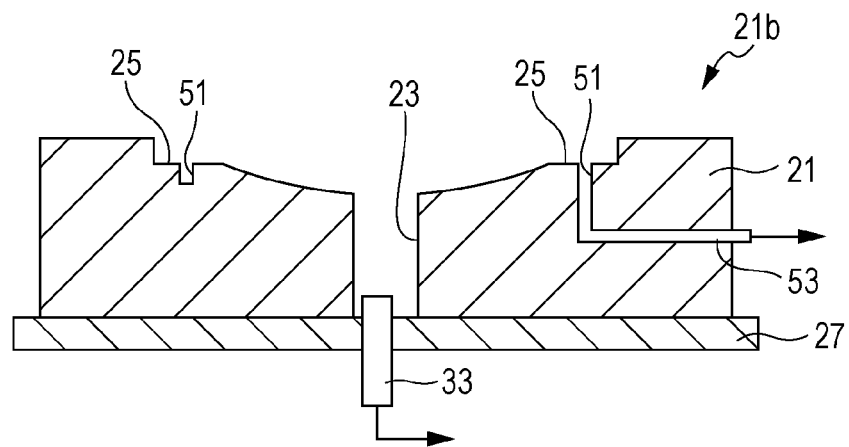
FIGS. 13A and 13B are a cross-sectional view and a plan view of a base used in the method of manufacturing embodiment 2-4.
Figure 13B:
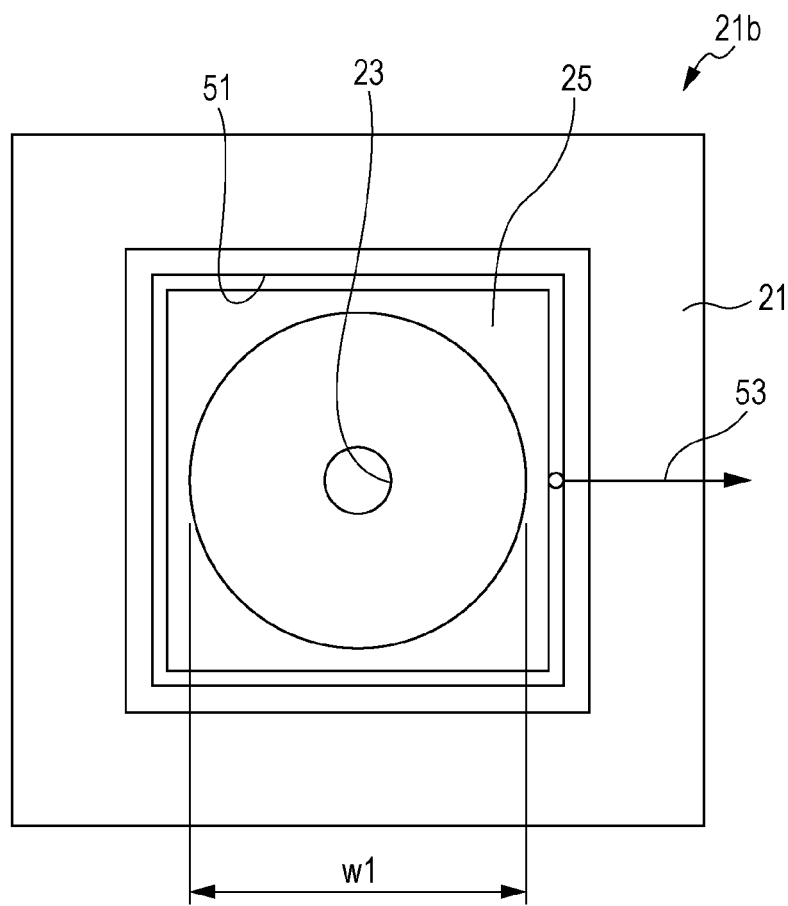

FIGS. 13A and 13B are a cross-sectional view and a planar view of a base used in the method of manufacturing embodiment 2-4. The base 21b shown in FIGS. 13A and 13B is different from the bases used in the methods of manufacturing embodiment 2-1 and embodiment 2-2 in that the base 21b is provided with a discharge groove 51 for fixing the element chip, and in other respects the configurations are the same.

That is, as the base 21b, the base 21 used in the method of manufacturing embodiment 2-1 and embodiment 2-2 is set as the base main body 21 and the discharge groove 51 is provided on the flat surface 25 thereof. The discharge groove 51 is provided in a state of surrounding the entire circumference of the opening 23 in the base 21b. The discharge system 53 is connected to the discharge groove 51 and configured to discharge gas from inside the discharge groove 51.

[Method of Manufacturing Embodiment 2-4]

Figure 14A:
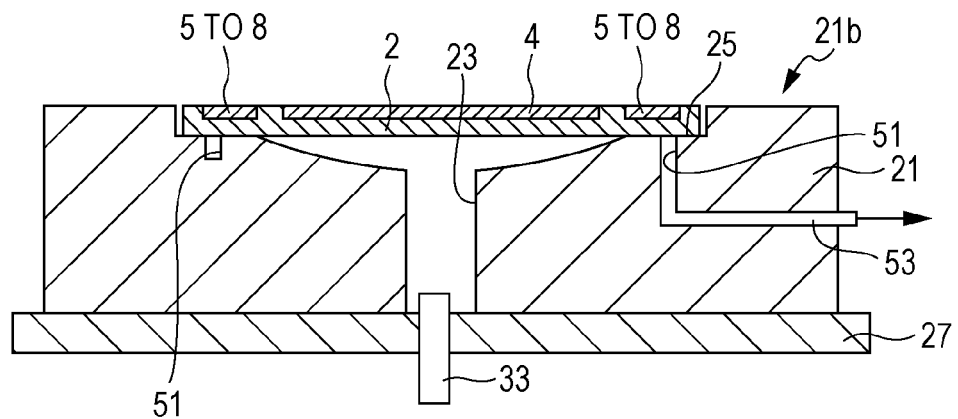
FIGS. 14A and 14B are cross-sectional process diagrams showing the method of manufacturing embodiment 2-4.
Figure 14B:
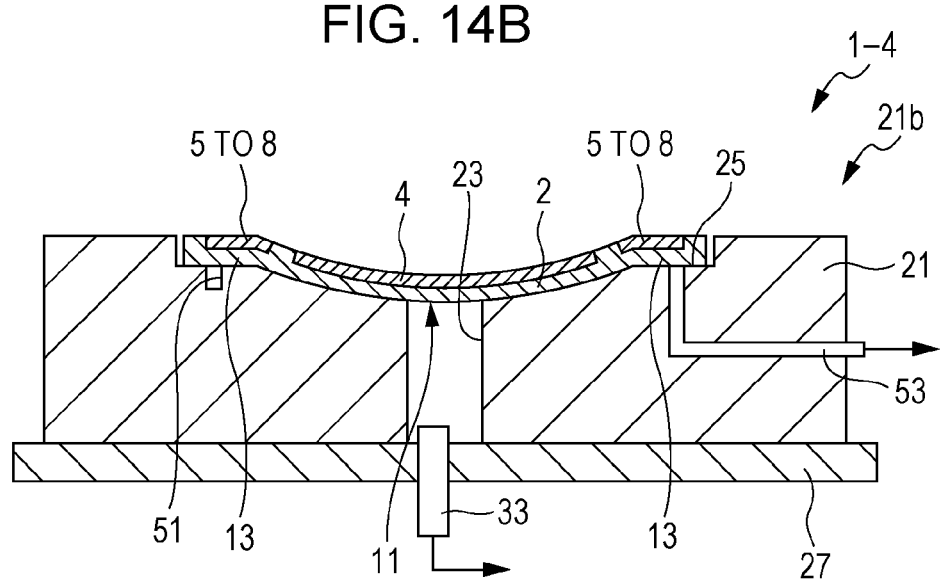

FIGS. 14A and 14B are cross-sectional process diagrams describing the method of manufacturing the solid-state imaging element of embodiment 2-4. The method of manufacturing embodiment 2-4 shown in FIGS. 14A and 14B is a method of manufacturing a solid-state imaging element using the base 21b with the above-described configuration and the manufacturing method will be described below based on the drawings.

First, as shown in FIG. 14A, the bottom plate 27 is arranged at the opposite side to the side where the flat surface 25 is provided in the base 21b, and the opening 23 of the base 21b is blocked in advance from one side.

Next, in a state where the opening 23 of the base 21b is covered, the element chip 2 is mounted on the flat surface 25 of the base 21b with the forming surface (that is, the forming surface of the photoelectric conversion units) of the imaging region 4 in the element chip 2 facing upward. At this time, the imaging region 4 is put in the range of the opening 23 and the peripheral edge portion of the imaging region 4 is supported by the flat surface 25 of the base 21b. Further, the entire surface of the discharge groove 51 provided on the flat surface 25 of the base 21b is covered by the element chip 2. Further, in this state, the peripheral circuits 5 to 8 arranged at the periphery of the imaging region 4 are arranged on the flat surface 25 and a part thereof may be arranged in the range of the opening 23, which is the same as the other embodiments described above.

In such a state, the gas inside the discharge groove 51 is discharged by the discharge system 53, negative pressure is applied inside the discharge groove 51, and the element chip 2 is fixed to the flat surface 25 of the base 21b by vacuum adsorption. At this time, it is important that the entire circumference of the element chip 2 be fixed to the flat surface 25. In this manner, the opening 23 of the base 21b is sealed by the element chip 2 and the bottom plate 27.

Next, as shown in FIG. 14B, while the fixing of the element chip 2 by vacuum adsorption with respect to the base 21b is maintained, the gas inside the sealed opening 23 of the base 21b is discharged using the discharging system 33. In this manner, the central portion of the element chip 2 arranged corresponding to the opening 23 of the base 21b is pulled toward the interior of the opening 23 and shaped as the curved portion 11 which is curved three-dimensionally. Similarly to the shape of the opening 23 of the base 21b, the curved portion 11 is shaped to have a circular bottom portion, for example. Further, if the shape of the opening 23 is a square with four rounded corners, a three-dimensional curve is formed with a circle as the bottom portion at the portion close to the apex of the curved portion 11. At this time, by fixing the entire circumference of the peripheral edge of the element chip 2 to the flat surface 25, it is possible to evenly apply stress caused by the discharge in the opening 23 with respect to the central portion of the element chip 2 corresponding to the opening 23. In this manner, it is possible to form a curved portion 11 curved in a three-dimensional manner without generating "wrinkles". For this reason, the fact that it is important to sufficiently fix the entire circumference of the peripheral edge of the element chip 2 with respect to the flat surface 25 by adjusting the width w1 of the opening 23 with respect to the outer shape of the element chip 2 is the same as in the other embodiments. Further, this effect is even more reliable when the opening 23 is circular.

Further, by giving the inner wall of the opening 23 of the base 21b a tapered shape and making the edge portion of the opening 23 a convex curved surface, it is possible to prevent stress at the time of curving from being focused at the element chip 2 portion corresponding to the edge of the opening 23 and to prevent cracking of the element chip 2 at this portion, which is the same as in the other embodiments.

Further, the peripheral portion of the curved portion 11 in the element chip 2 is fixed to the flat surface 25 of the base 21b without curving and is left as a flat portion 13. The fact that the flat portion 13 is left across the entire circumference of the curved portion 11 is also the same as the other embodiments.

The fact that the curved portion 11 formed on the element chip 2 has a curvature matching the imaging surface curvature of the optical system such as a lens used in combination with the element chip 2 is the same as in the other embodiments. Similarly to embodiment 2-2 and embodiment 2-3, such adjustment of the curvature may be performed by adjusting the inner wall shape of the opening 23 mainly at the flat surface 25 side and the pressure in the opening 23. When it is desired to increase the curvature of the curved portion 11, the pressure difference inside and outside of the opening 23 may be increased using the element chip 2. Further, in order to make the element chip 2 curve three-dimensionally so as to have the target curvature without difficulty, the thickness of the element chip 2 may be adjusted, which is the same as the other embodiments. Here, as another method, in which negative pressure is applied inside the opening 23 to cause volumetric contraction and thereby cause the element chip 2 to curve, a method of performing atmospheric discharge after the base 21b and the element chip 2 are stuck together in the state of negative pressure may be applied, which is the same as embodiment 2-2 and embodiment 2-3.

In this manner, a solid-state imaging element 1-4 having a curved portion 11 is formed. After the formation of the solid-state imaging element 1-4, in order to stabilize the shape of the curved portion 11, the base 21b and the element chip 2 may be integrated by removing the bottom plate 27 in the state where the element chip 2 is vacuum adsorbed to the base 21b, filling the resin in the opening 23, and curing the resin. In such a case, after the base 21b and the element chip 2 are integrated, the base 21b may be thinned from the back surface. Meanwhile, when the shape of the curved portion 11 is to be preserved, it is possible to use a configuration in which the element chip 2 is removed from the base 21b as a solid-state imaging element without integrating the element chip 2 and the base 21b.

[Solid-State Imaging Element of Embodiment 2-4]

The solid-state imaging element 1-4 obtained by the above processes is configured as a curved portion 11 in which the central portion of the element chip 2 is curved three-dimensionally. Further, a flat portion 13 extending from the peripheral portion of the curved portion 11 is provided. The flat portion 13 is arranged at the entire circumference of the curved portion 11 and has a coplanar configuration.

An imaging region 4 in which photoelectric conversion units are arranged is arranged in the concave curved surface side of the curved portion 11. The curved portion 11 is set with a curvature which matches the imaging surface curvature of the optical system such as a lens used in combination with the solid-state imaging element 1-4 and in which photoelectric conversion units are arranged along the imaging surface curvature. For this reason, the bottom surface of the curved portion 11 is preferably circular.

Further, peripheral circuits 5 to 8 arranged at the periphery of the imaging region 4 are provided in the flat portion 13. A part of the peripheral circuits 5 to 8 may be arranged on the curved portion 11. Here, terminals protruding from the peripheral circuits 5 to 8 are provided in the flat portion 13, whereby it is possible to connect with external circuits using the terminals. At this time, by providing the terminals in the flat portion 13, favorable operability is secured for obtaining a bonding-like connection to external circuits, which is the same as the other embodiments.

In addition, the solid-state imaging element 1-4 adopts a configuration in which the element chip 2 is supported from the convex curved surface side of the curved portion 11 by the base 21b and resin is filled inside the opening 23 of the base 21b. In such a case, the shape of the curved portion 11 is secured by the resin filled inside the opening 23.

[Effect of Embodiment 2-4]

Even for the embodiment 2-4 described above, in the same manner as the other embodiments, in a state where the peripheral edge of the element chip 2 is fixed to the flat surface 25 of the periphery of the opening 23, only the central portion of the element chip 2 arranged to cover the opening 23 is curved three-dimensionally in the base 21b. The peripheral edge portion continuing from the peripheral edge of the curved portion 11 formed by the curvature is left as a flat portion 13 fixed to the flat surface 25 of the base 21b. Accordingly, the peripheral edge portion of the element chip 2 may be left as a flat portion 13 to which stress is not applied by the curvature.

Further, the curvature of the curved portion 11 may be adjusted by the pressure difference between the inside and the outside of the opening 23 through the element chip 2. For this reason, it is possible to control the curvature of the curved portion 11 with high precision and within a wide range.

According to the above embodiment 2-4, the peripheral edge portion of the element chip 2 is left as the flat portion 13 to which stress is not applied by the curvature, whereby it is possible to form only the central portion as a three-dimensionally curved portion 11. For this reason, it is possible to manufacture a solid-state imaging element 1-4 provided with a three-dimensional curved portion 11 without generating damage such as cracking. As a result, similarly to the other embodiments, it is possible to improve the reliability of the solid-state imaging element 1-4 provided with the three-dimensional curved portion 11.

6. Embodiment 2-5

Example of Controlling the Shape of the Curved Portion According to the Shape of the Base

[Configuration of Base Used in the Method of Manufacturing Embodiment 2-5]

Figure 15A:
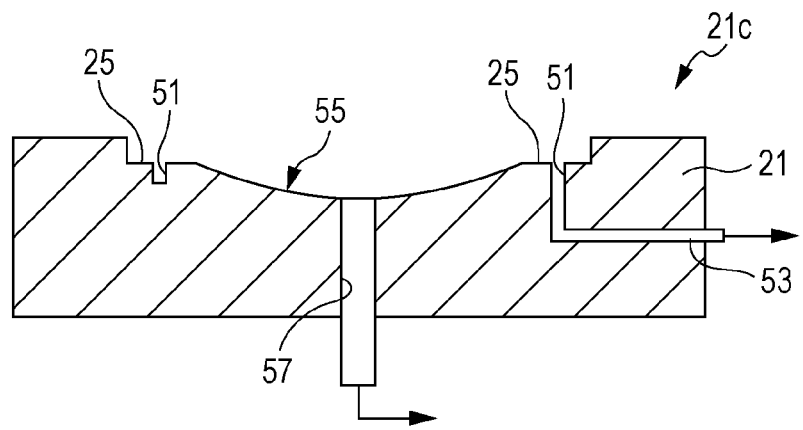
FIGS. 15A and 15B are a cross-sectional view and a plan view of a base used in the method of manufacturing embodiment 2-5.
Figure 15B:
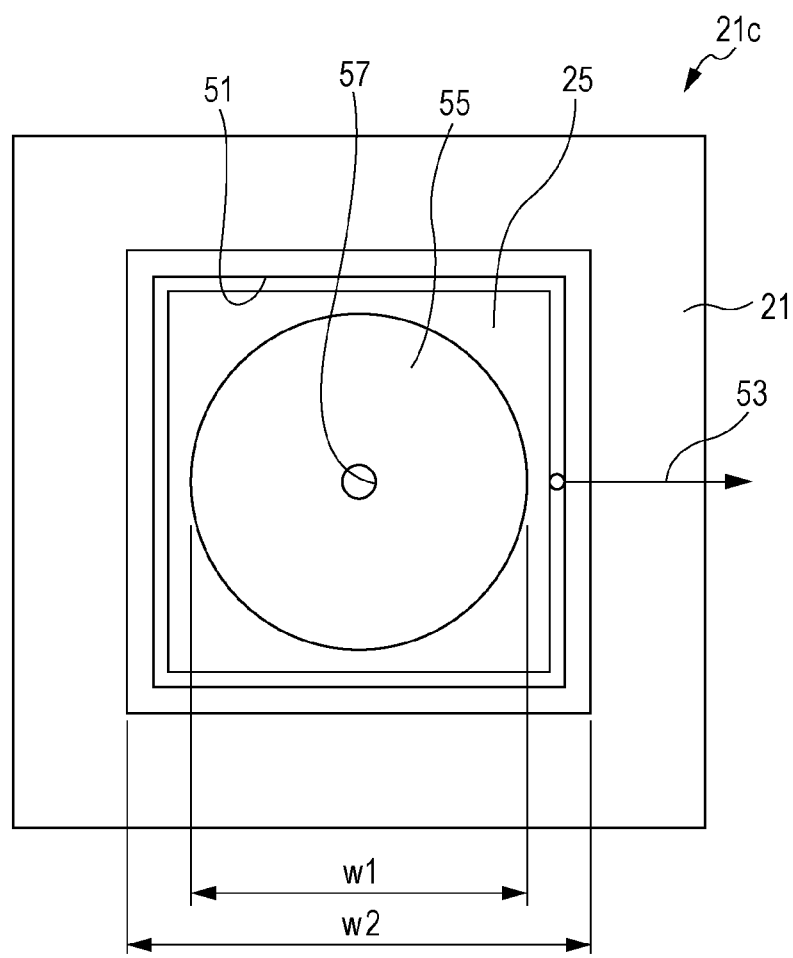

FIGS. 15A and 15B are a cross-sectional view and a planar view of a base used in the method of manufacturing embodiment 2-5. The base 21c shown in FIGS. 15A and 15B is different from the bases used in the methods of manufacturing other embodiments in the shape of the opening of the base 21c, and in other respects the configurations are the same.

That is, the base 21c has a curved concave portion 55 formed as a concave curved surface in which the inner wall of the base 21c is curved three-dimensionally. On one surface of the base 21c provided with the curved concave portion 55, the periphery of the curved concave portion 55 is shaped as a flat surface 25.

The curved concave portion 55 is set to have a shape matching the imaging surface curvature (lens aberration) of the optical system combining a lens used in combination with the solid-state imaging element manufactured here and a plurality of lenses. The curvature of the curved concave portion 55 is set to, for example, approximately 10% to 20%, for instance, approximately 17%. Further, it is preferable that the angle θ made by the concave curved surface of the curved concave portion 55 and the long side of the flat surface 25 be less than 90°, for example, approximately 45°. Further, the opening width w1 of the curved concave portion 55 is approximately set so that the imaging region (4) of the element chip (2) described using FIG. 1 fits within the range of the curved concave portion 55.

A discharge port 57 of a discharge system capable of discharging from inside the curved concave portion 55 is provided in the curved concave portion 55. The discharge port 57 is set to be provided at the central portion of the curved concave portion 55, for example. Further, the arrangement of the discharge port 57 is not limited to this; however, it is important that the arrangement state of the discharge port 57 in the curved concave portion 55 be set so that the element chip (2) described below is capable of curving along the curved concave portion 55.

Figure 16A:
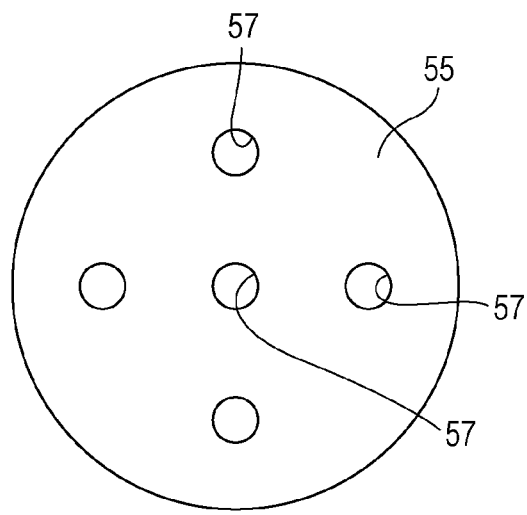
FIGS. 16A and 16B are main component plan views showing modifications of a base used in the method of manufacturing embodiment 2-5.
Figure 16B:
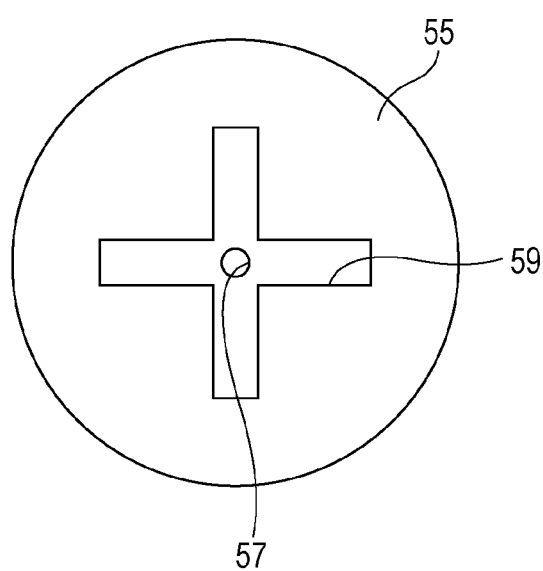

For this reason, for example, as shown in FIG. 16A, a plurality of discharge ports 57 connected to the discharge system may be dispersed and arranged in the entirety of the curved concave portion 55. Further, as shown in FIG. 16B, the discharge ports 57 connected to the discharge system are provided in the center of the curved concave portion 55, and a discharge groove 59 communicating with the discharge ports 57 may be provided in the entirety of the curved concave portion 55.

The flat surface 25 is provided across the entire circumference of the above curved concave portion 55. Similarly to the other embodiments, the flat surface 25 has a width w2 supporting the peripheral edge of the element chip (2) such that at least the imaging region 4 of the element chip (2) described above using FIG. 1 fits within the range of the curved concave portion 55 that becomes the opening. In order to facilitate positional alignment at the time of mounting the element chip (2), the entire circumference of the flat surface 25 or a part thereof may be configured as a surface higher than the flat surface 25. Here, when such positional alignment is not performed, the entire surface of the one surface of the base 21c may be set with the same height as the flat surface 25.

The flat surface is provided with the same discharge groove 51 as the base (21b) described in the previous embodiment 2-4. The discharge groove 51 is provided in a state of surrounding the entire surface of the curved concave portion 55 in the base 21c. The discharge system 53 is connected to the discharge groove 51 and configured to discharge gas from inside the discharge groove 51.

Similarly to the other embodiments, the base 21c is not particularly limited regarding the configuration material.

[Method of Manufacturing Embodiment 2-5]

Figure 17A:
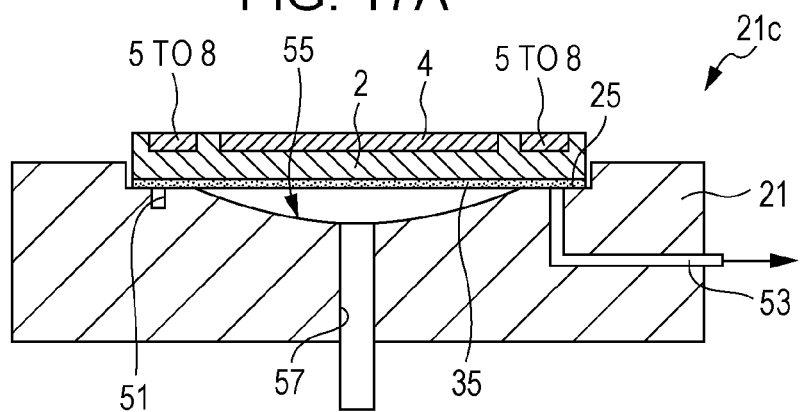
FIGS. 17A to 17C are cross-sectional process diagrams showing the method of manufacturing embodiment 2-5.
Figure 17B:
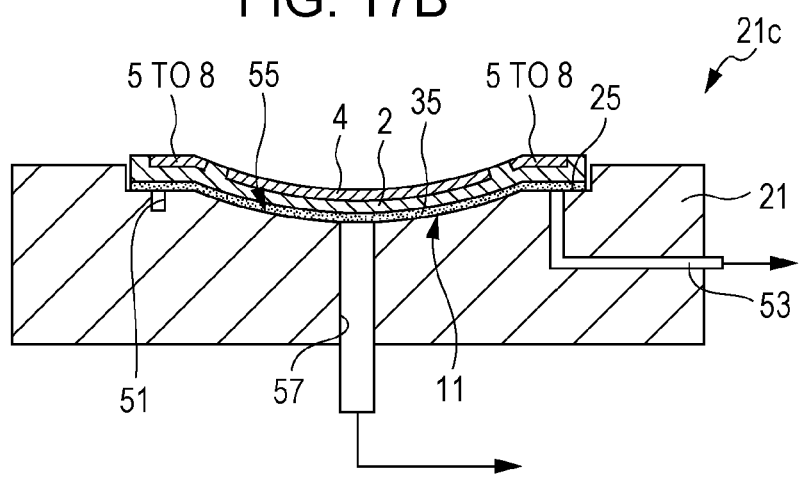
Figure 17C:
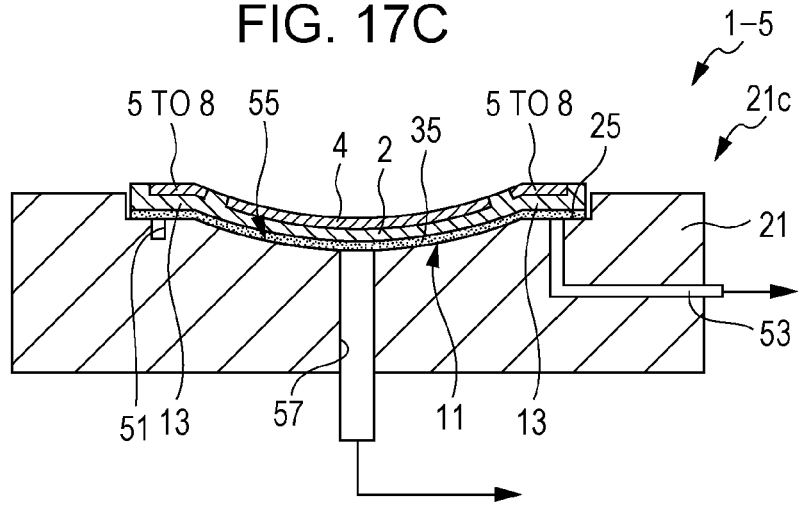

FIGS. 17A to 17C are cross-sectional process diagrams describing the method of manufacturing the solid-state imaging element of embodiment 2-5. The method of manufacturing embodiment 2-5 shown in FIGS. 17A to 17C is a method of manufacturing a solid-state imaging element using the base 21c with the above-described configuration and the manufacturing method will be described below based on the drawings.

First, as shown in FIG. 17A, in a state where the curved concave portion 55 of the base 21c is covered, the element chip 2 is mounted on the flat surface 25 of the base 21c with the forming surface (that is, the forming surface of the photoelectric conversion units) of the imaging region 4 in the element chip 2 facing upward. An adhesive agent 35 formed of, for example, thermosetting resin or photocurable resin is arranged on the mounting surface side toward the base 21c in the element chip 2. As shown in the drawings, the adhesive agent 35 is arranged on the entire surface of the mounting surface side toward the base 21c in the element chip 2.

At this time, the imaging region 4 is put in the range of the curved concave portion 55 and, using the adhesive agent 35, the periphery of the imaging region 4 is supported by the flat surface 25 of the base 21c across the entire surface. Further, in this state, the peripheral circuits 5 to 8 arranged at the periphery of the imaging region 4 are arranged with respect to the flat surface 25 and a part thereof may be arranged in the range of the curved concave portion 55, which is the same as embodiment 2-1 described above.

In this state, the gas inside the discharge groove 51 is discharged by the discharge system 53, negative pressure is applied inside the discharge groove 51 and the element chip 2 is fixed to the flat surface 25 of the base 21c by vacuum adsorption. At this time, it is important that the entire circumference of the peripheral edge of the element chip 2 be fixed to the flat surface 25. In this manner, the curved concave portion 55 of the base 21c is sealed.

Next, as shown in FIG. 17B, while the fixing of the element chip 2 by vacuum adsorption with respect to the base 21c is maintained, the gas inside the sealed curved concave portion 55 of the base 21c is discharged using the discharging port 57. In this manner, the central portion arranged with respect to the curved concave portion 55 of the base 21c in the element chip 2a is pulled toward the interior of the curved concave portion 55 and shaped as the curved portion 11 which is curved three-dimensionally. The curved portion 11 has a curved shape following the shape of the curved concave portion 55 of the base 21c. At this time, by fixing the entire circumference of the peripheral edge of the element chip 2 to the flat surface 25, it is possible to evenly apply stress caused by the discharge in the curved concave portion 55 with respect to the central portion of the element chip 2 corresponding to the curved concave portion 55. In this manner, it is possible to form a curved portion 11 curved in a three-dimensional manner without generating "wrinkles". For this reason, the fact that it is important to sufficiently fix the entire circumference of the peripheral edge of the element chip 2 with respect to the flat surface 25 by adjusting the width w1 of the curved concave portion 55 with respect to the outer shape of the element chip 2 is the same as in the other embodiments.

Here, since the inner wall of the curved concave portion 55 of the base 21c has a tapered shape corresponding to the flat surface 25, it is possible to prevent stress at the time of curving from being focused at the element chip 2 portion corresponding to the edge of the curved concave portion 55 and to prevent cracking of the element chip 2 at this portion, which is the same as in the other embodiments.

Further, the peripheral portion of the curved portion 11 in the element chip 2 is fixed to the flat surface 25 of the base 21c without curving and is left as a flat portion 13. The fact that the flat portion 13 is left across the entire circumference of the curved portion 11 is also the same as the other embodiments.

The fact that the curved portion 11 formed on the element chip 2 has a curvature matching the imaging surface curvature of the optical system such as a lens used in combination with the element chip 2 is the same as in the other embodiments. Such adjustment of the curvature is controlled according to the inner wall shape of the curved concave portion 55. Further, in order to make the element chip 2 curve three-dimensionally so as to have the target curvature without difficulty, the thickness of the element chip 2 may be adjusted, which is the same as the other embodiments. Here, as another method, in which negative pressure is applied between the curved concave portion 55 and the element chip 2 to cause volumetric contraction and thereby cause the element chip 2 to curve, a method of performing atmospheric discharge after the base 21c and the element chip 2 are stuck together in the state of negative pressure may be applied, which is the same as embodiments 2 to 2-4.

Thereafter, as shown in FIG. 17C, the element chip 2 is fixed on the base 21c by the adhesive agent 35 interposed between the flat surface 25 and the curved concave portion 55 of the base 21c and the element chip 2. At this time, for example, when a thermosetting resin is used as the adhesive agent 35, the above-described fixing is performed by curing the adhesive agent 35 using a heating process. As an example, in a case where an epoxy resin is used, heating is performed for around 15 minutes at 160° C. Meanwhile, when a photocurable resin is used as the adhesive agent 35, the above-described fixing is performed by curing the adhesive agent 35 using long wave light illumination passing through the element chip 2. As an example, when the element chip 2 is configured of monocrystalline silicon, light illumination is performed using long wavelength light with a wavelength of 700 nm or more.

In this manner, a solid-state imaging element 1-5 having a curved portion 11 is formed. After the formation of the solid-state imaging element 1-5, the base 21c may be thinned from the back surface.

[Solid-State Imaging Element of Embodiment 2-5]

As shown in FIG. 1, the solid-state imaging element 1-5 obtained by the above processes is configured as a curved portion 11 in which the central portion of the element chip 2 is curved three-dimensionally. Further, a flat portion 13 extending from the peripheral portion of the curved portion 11 is provided. The flat portion 13 is arranged at the entire circumference of the curved portion 11 and has a coplanar configuration.

An imaging region 4 in which photoelectric conversion units are arranged is arranged in the concave curved surface side of the curved portion 11. The curved portion 11 is set with a curvature which matches the imaging surface curvature of the optical system such as a lens used in combination with the solid-state imaging element 1-5 and in which photoelectric conversion units are arranged along the imaging surface curvature. For this reason, the bottom surface of the curved portion 11 is preferably circular.

Further, peripheral circuits 5 to 8 arranged at the periphery of the imaging region 4 are provided in the flat portion 13. A part of the peripheral circuits 5 to 8 may be arranged on the curved portion 11. Here, terminals protruding from the peripheral circuits 5 to 8 are provided in the flat portion 13, whereby it is possible to connect with external circuits using the terminals. At this time, by providing the terminals in the flat portion 13, favorable operability is secured for obtaining a bonding-like connection to external circuits, which is the same as the other embodiments.

In addition, the solid-state imaging element 1-5 adopts a configuration in which the element chip 2 is supported from the convex curved surface side of the curved portion 11 by the base 21c having the curved concave portion 55 and the shape of the curved portion 11 is secured by the curved concave portion 55.

[Effect of Embodiment 2-5]

In embodiment 2-5 described above, in a state where the peripheral edge of the element chip 2 is fixed to the flat surface 25 of the periphery of the curved concave portion 55, only the central portion of the element chip 2 arranged with respect to the curved concave portion 55 is curved three-dimensionally in the base 21c. The peripheral edge portion continuing from the peripheral edge of the curved portion 11 formed by the curvature is left as a flat portion 13 fixed to the flat surface 25 of the base 21c. Accordingly, similarly to the other embodiments, it is possible to leave the peripheral portion of the element chip 2 as the flat portion 13 to which stress is not applied by the curvature.

Further, the curvature of the curved portion 11 may be adjusted by the shape of the curved concave portion 55 formed in the base 21c. For this reason, it is possible to control the curvature of the curved portion 11 with high precision and within a wide range.

According to the above embodiment 2-5, the peripheral edge portion of the element chip 2 is left as the flat portion 13 to which stress is not applied by the curvature, whereby it is possible to form only the central portion as a three-dimensionally curved portion 11. For this reason, it is possible to manufacture a solid-state imaging element 1-5 provided with a three-dimensional curved portion 11 without generating damage such as cracking. As a result, similarly to the other embodiments, it is possible to improve the reliability of the solid-state imaging element 1-5 provided with the three-dimensionally curved portion 11.

Here, it is possible to combine embodiment 2-5 with a method using the base described in embodiment 2-3 as a package. In such a case, a base side electrode is formed on the base 21c used in embodiment 2-5, a chip side electrode is formed on the surface of the opposite side to the imaging region 4 in the element chip 2, and an anisotropic conductive adhesive agent is further used as the adhesive agent 35.

According to the electronic apparatus according to the above-described embodiments, as described in embodiment 2-1 to embodiment 2-5, by using a solid-state imaging element which is provided with a three-dimensional curved portion and in which cracking is not generated, it is possible to improve the reliability of the electronic apparatus using the solid-state imaging element.

Below, 131 indicates a control unit, 131-1 indicates a magnet, 131-2 indicates an electromagnet, 131-3 indicates a suction control unit, 131-5 indicates a suction device, 131-7 indicates a magnetic force control unit, 133 indicates a magnetic film, 134 indicates an adhesive layer, 65 and 66 indicate coils, 68 indicates a metallic film, 91 indicates a camera, 92 indicates a solid-state imaging apparatus, 93 indicates an optical system lens, 94 indicates a shutter device, 95 indicates a driving circuit, and 96 indicates a signal processing circuit.

Embodiment 3-1

Configuration Example of Base Applied to Solid-State Imaging Apparatus

Figure 18A:
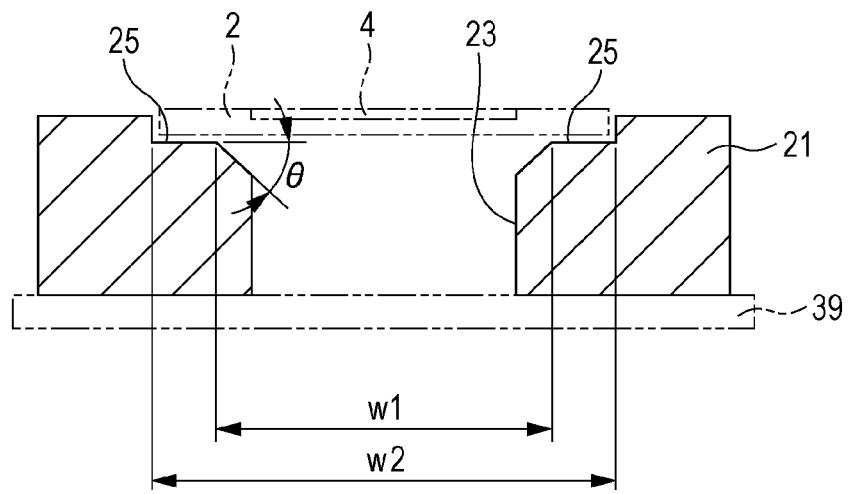
FIGS. 18A and 18B are a cross-sectional view and a plan view of a base applied to the solid-state imaging element of the present technique.
Figure 18B:
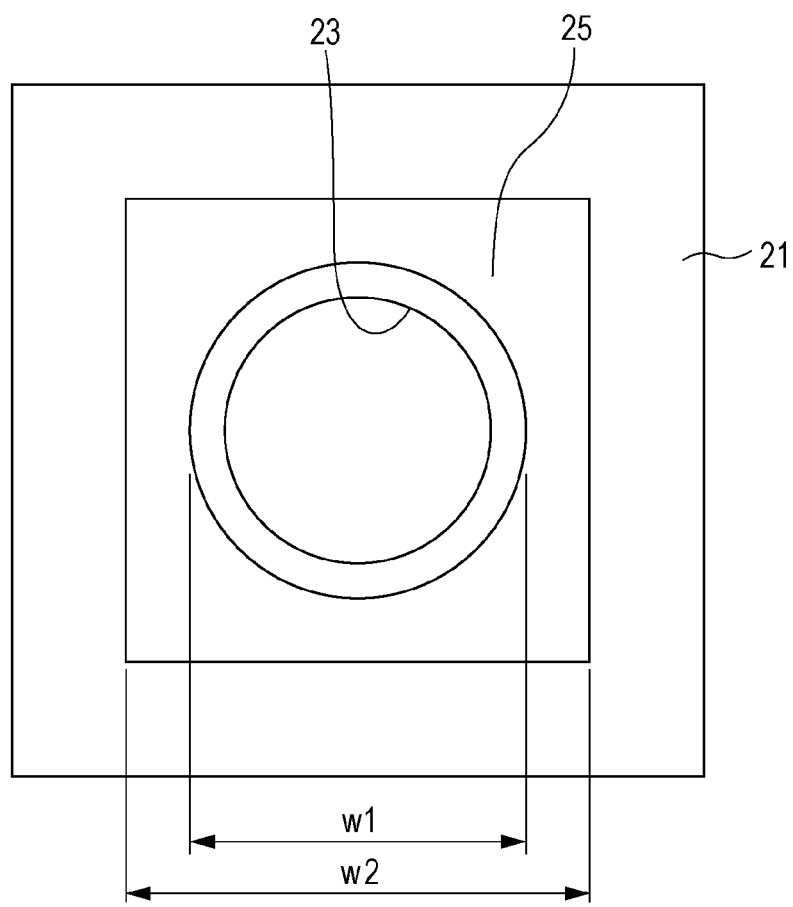

First, an example of a base that is a constituent element of a solid-state imaging apparatus will be described using FIGS. 18A and 18B. FIG. 18A is a cross-sectional view of the base and FIG. 18B is a plan view of the base. A base 21 is a base that supports an imaging chip with a solid-state imaging element and that forms a region that includes an imaging region in which photoelectric conversion units are arranged in a curved portion. The imaging surface of the imaging region is formed on the concave curved surface side of the curved portion, and the imaging surface is a concave curved surface that corresponds to the field curvature (lens aberration) of the imaging lens that is combined with the imaging chip.

That is, the base 21 includes an opening 23 in the center. One surface of the base 21 on which the opening 23 is provided is shaped so that the periphery of the opening 23 is a flat surface 25. The opening 23 has an external shape that matches the field curvature (lens aberration) of the optical lens (imaging lens) that is combined with an imaging chip 2 that is supported by the base 21. In a case when a lens of which the normal external shape is circular is used, it is preferable that the opening shape of the opening 23 when viewed in plan view be circular (precise circle), and may be a shape in which the four corners of a square are curved. Further, the opening 23 has a tapered shape in which the opening diameter widens toward the flat surface 25 on the opening edge on the flat surface 25 side. An angle θ between the tapered surface of the opening 23 and the flat surface 25 is less than 90°, and for example, is preferably approximately 45°. Further, an opening width w1 of the opening 23 on the flat surface 25 side is large enough that an imaging region 4 of the imaging chip 2 of FIG. 1 is within the range of the opening 23.

The flat surface 25 is provided over the entire circumference of the opening 23. The flat surface 25 has a width w2 that supports the peripheral edge of the imaging chip 2 so that at least the imaging region 4 of the imaging chip of FIG. 1 is within the range of the opening 23. The entire circumference or a portion of the outer circumference of such a flat surface 25 may be configured as a surface that is higher than the flat surface 25 to facilitate positional alignment in a case when the imaging chip 2 is to be mounted. Here, in a case when such positional alignment is not important, the entire surface of one of the surfaces of the base 21 may be the flat surface 25 of the same height.

The opening 23 of the base 21 described above is open on both the flat surface 25 side and the opposite side to the side on which the flat surface 25 is formed. Alternatively, as illustrated by the chain line, the base 21 may have a configuration in which a bottom plate 39 that blocks the opening 23 is provided on a surface on the opposite side to the side on which the flat surface 25 is formed. The bottom plate 39 may be formed integrally with the base 21 or may be formed separately from the base 21 as long as the opening 23 may be blocked in a sealed state.

In particular, the base 21 is configured using a material with a greater coefficient of thermal expansion (CTE) than the imaging chip 2 as the main constituent member. For example, if the imaging chip 2 is configured mainly using a single-crystal silicon (CTE=2.4), the base 21 is configured using stainless steel (SUS 410: CTE=10.4, SUS 304: CTE=17.3) or aluminum (CTE=23).

[Configuration Example of Solid-State Imaging Apparatus]

Figure 19:
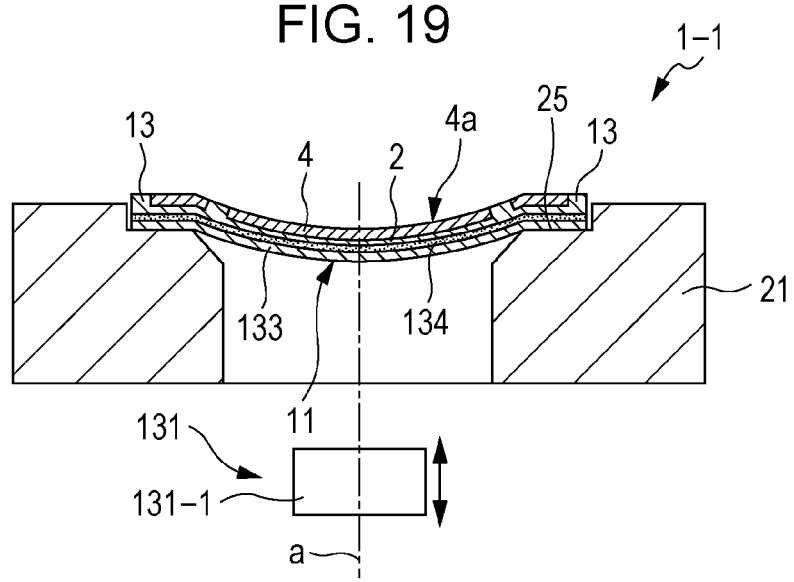
FIG. 19 is a schematic configuration diagram showing the solid-state imaging apparatus according to embodiment 3-1.

Next, an outline configuration of embodiment 3-1 of a solid-state imaging apparatus according to the embodiments of the present technology is illustrated in FIG. 19. A solid-state imaging apparatus 1-1 according to embodiment 3-1 is configured to include the base 21, the imaging chip 2 that is supported by the base 21 and that includes a solid-state imaging element in which an imaging surface 4a is curved three-dimensionally as an arc or the like, and the control unit 131 that variably controls the curvature of the imaging surface 4a.

The imaging region 4 in which photoelectric conversion units are arranged and a solid-state imaging element including peripheral circuits 5 to 8 are formed on the imaging chip 2, the magnetic film 133 is formed on the back surface on the opposite side to the imaging surface 4a of the imaging region 4, and the adhesive layer 134 is formed on the magnetic film 133. As will be made clear in the method of manufacturing of FIGS. 21A to 21D described later, a curved portion 11 of which the central portion is curved three-dimensionally as an arc or the like on the opening 23 side of the base 21 is formed on the imaging chip 2. The imaging region 4 in which photoelectric conversion units are arranged is within the curved portion 11, and the concave curved surface of the curved portion is the imaging surface 4a. The imaging chip 2 is supported by the base 21 by fixing a flat portion 13 that extends from the peripheral edge of the curved portion 11 to the flat surface 25 of the base 21 via the adhesive layer 134.

On the other hand, a control unit 131 is configured by a magnet 131-1 that is a magnetic force generating device that is movable in a vertical direction with respect to the imaging surface 4a of the imaging chip 2. The magnet 131-1 is arranged at a position that opposes the curved portion 11 of the imaging chip 2 that faces the opening 23 on the back surface side of the base 21.

[Method of Manufacturing of Curving Imaging Region of Imaging Chip]

A method of manufacturing of the curved portion 11 of the imaging region 4 and the imaging chip 2 that includes the flat portion 13 of the peripheral edge of the curved portion 11 is illustrated in FIGS. 21A to 21D. The method of manufacturing of the imaging chip 2 illustrated in FIGS. 21A to 21D uses the base 21 described above.

Figure 21A:
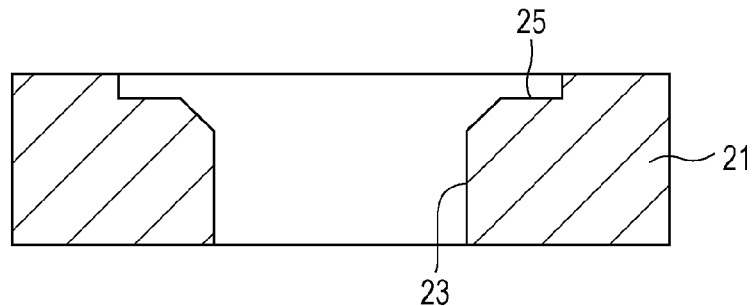
FIGS. 21A to 21D are manufacturing process diagrams showing an example of a method of manufacturing an imaging chip of the solid-state imaging apparatus according to embodiment 3-1.

First, as illustrated in FIG. 21A, a base 21 in which the opposite side to the side on what the flat surface 25 of the opening 23 is not blocked is prepared.

Figure 21B:
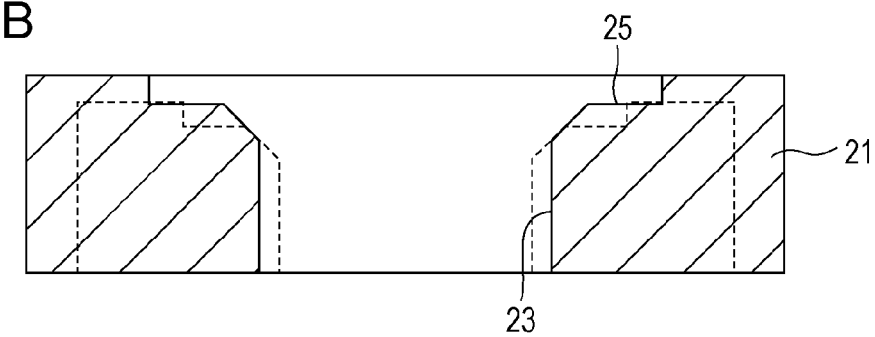

Next, as illustrated in FIG. 21B, the base 21 is expanded by heating. In so doing, the diameter of the opening 23 is expanded and spread to the outside of the flat surface 25. The heating temperature at this time is equal to or higher than the curing temperature of the adhesive layer 134 that is provided on the back surface of the imaging chip 2 described next, and is within a range which does not influence the imaging chip 2.

Figure 21C:
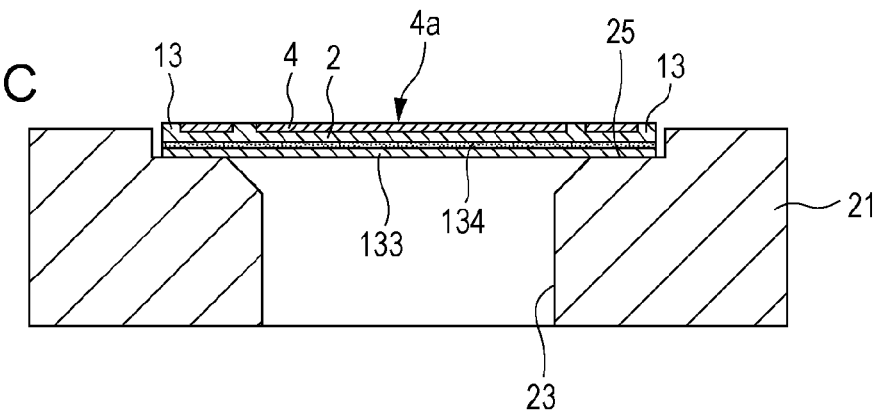

Next, as illustrated in FIG. 21C, the magnetic film 133 is formed on the back surface on the opposite side to the imaging surface 4a of the imaging chip 2 that includes a solid-state imaging element, and the adhesive layer 134 is formed thereon. An application film in which magnetic powder is mixed into a binder, a magnetic sheet in which magnetic powder is mixed, or the like, for example, may be used as the magnetic film 133. A coating film in which an adhesive agent made of a thermosetting resin, a thermosetting adhesive sheet, or the like, for example, may be used as the adhesive layer 134. As illustrated in the drawings, the adhesive layer 134 may be arranged over the entire surface on the placement surface side of the base 21 of the imaging chip 2, or may be arranged only on the peripheral edge of the imaging chip 2 by corresponding with the flat surface 25 of the base 21. However, it is important that the adhesive layer 134 be interposed between the flat surface 25 of the base 21 and the imaging chip 2 across the entire circumference that surrounds the opening 23.

Furthermore, the imaging surface 4a of the imaging region 4 of the imaging chip 2 (that is, the forming surface of the photoelectric conversion units) faces upward in a state of plugging the opening 23 of the base 21, and the imaging chip 2 is mounted on the flat surface 25 of the base 21. At this time, the imaging region 4, that is, the angle of view region is kept within the range of the opening 23, and the periphery of the imaging region 4 is supported by the flat surface 25 of the base 21 across the entire surface via the adhesive layer 134. Further, in such a state, the peripheral circuits 5 to 8 that are placed in the periphery of the imaging region 4 are placed to correspond with the flat surface 25, and a part thereof may be placed within the range of the opening 23.

The imaging chip 2 is fixed on the flat surface 25 of the base 21 by maintaining such a state until the adhesive layer 134 that is interposed between the flat surface 25 of the base 21 and the imaging chip 2 is cured. At this time, it is important that the entire circumference of the peripheral edge of the imaging chip 2 be fixed on the flat surface 25 of the base 21. For example, the curing of the adhesive layer 134 may be performed at 160° C. for 15 minutes.

Figure 21D:
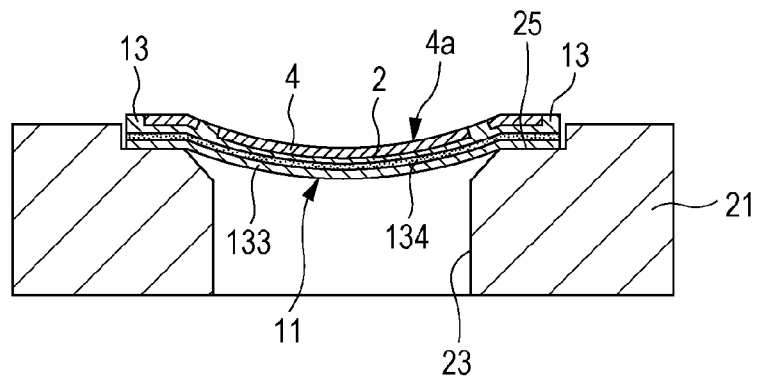

Next, as illustrated in FIG. 21D, the base 21 is cooled from a heated state to room temperature. The base 21 contracts during such a cooling process. At this time, the base 21 contracts to the size before the heating.

Due to the volumetric contraction of the base 21, the central portion that is placed to correspond to the opening 23 of the base 21 of the imaging chip 2 bulges toward the inner portion of the opening 23 and is shaped as a curved portion 11 that is three-dimensionally warped. The curved portion 11 is curved so that a portion thereof is along the tapered shape of the upper edge of the opening 23. The curved portion 11 is therefore shaped as a shape with a circular bottom portion, for example, that is, as an arc similarly to the shape of the opening 23 of the base 21. Further, if the shape of the opening 23 is a shape in which the four corners of a square are curved, a portion that is close to the apex of the curved portion 11 is formed as a three-dimensional curve with a circular bottom portion. The curved portion 11 in the present example is curved as an arc.

At this time, by fixing the entire circumference of the peripheral edge of the imaging chip 2 to the flat surface 25, a curved portion 11 that is three-dimensionally curved without causing "wrinkles" on the central portion of the imaging chip 2 that corresponds to the opening 23.

Here, in order to sufficiently fix the entire circumference of the peripheral edge of the imaging chip 2 to the flat surface 25, it is important to adjust the opening width w1 of the opening 23 with respect to the external shape of the imaging chip 2 so that the flat portion 13 maintains a certain width or greater. For example, if the shape of the imaging chip 2 has an external shape of 4 mm×4 mm with a thickness of approximately 15 μm, the opening width w1 is set so that 1 mm or more of the flat portion 13 remains across the entire circumference of the imaging chip 2.

Further, by making the upper edge of the opening 23 of the base 21a tapered shape, it is possible to prevent stress at the time of curving from being focused at the imaging chip 2 portion corresponding to the edge of the opening 23 and to prevent cracking of the imaging chip 2 at this portion.

On the other hand, the periphery of the curved portion 11 of the imaging chip 2 is fixed to the flat surface 25 of the base 21 without being curved, and remains as the flat portion 13. The flat portion 13 remains across the entire circumference of the curved portion 11.

It is preferable that the curved portion 11 that is formed on the imaging chip 2 have a curvature that matches the field curvature of the optical lens (imaging lens) that is used in combination with the imaging chip 2.

Further, in order to make the imaging chip 2 curve three-dimensionally so as to have the target curvature without difficulty, the thickness of the imaging chip 2 may be adjusted. Therefore, compared to a case when the bottom area of the curved portion 11 is large, it is preferable that the smaller the bottom area of the curved portion 11, the smaller the thickness of the imaging chip 2.

The imaging chip 2 that includes the curved portion 11 in which the imaging surface 4a is curved is formed as described above. The solid-state imaging apparatus 1-1 of the present embodiment is configured by opposing the imaging chip 2 that includes the curved portion 11 that is thus obtained and arranging a magnet 131-1 on the back surface side of the base 21.

[Description of Operation]

Figure 20:
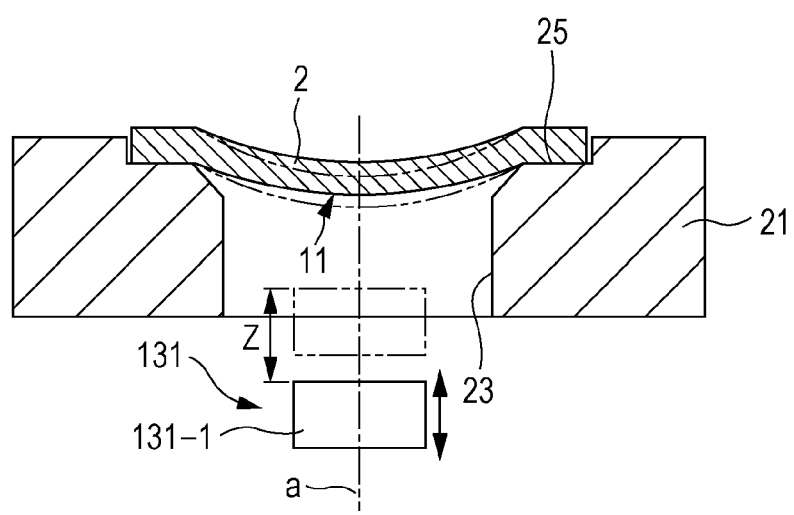
FIG. 20 is an explanatory diagram of an operation of the solid-state imaging apparatus according to embodiment 3-1.

Next, the operation of the solid-state imaging apparatus 1-1 according to embodiment 3-1 will be described. As illustrated in FIG. 20, the magnet 131-1 is arranged to pass through the center of the imaging region 4 of the curved portion 11 along an axis line a that is perpendicular to the imaging region 4 to be variably controlled within an area z from the solid line portion to the dotted line position. The curved portion 11 (therefore, the imaging surface 4a) obtains the target curvature by being further curved by the pulling force of the magnetic force according to the distance of the magnet 131-1 from the curved portion 11.

When the magnet 131-1 is at the solid line position that is furthest away from the curved portion 11 of the imaging chip 2, the magnetic force of the magnet 131-1 which acts on the magnetic film 133 on the back surface of the curved portion 11 becomes the weakest, and the curvature of the curved portion 11 (imaging surface 4a) becomes the smallest (radius of curvature is the greatest) (shown in the drawing by the solid line). The state of smallest curvature equates to the initial state. Conversely, when the magnet 131-1 is at the dotted line position that is closest to the curved portion 11 of the imaging chip 2, the magnetic force of the magnet 131-1 which acts on the magnetic film 133 of the back surface of the curved portion 11 is the strongest, and the curvature of the curved portion 11 (imaging surface 4a) becomes the greatest (radius of curvature is the smallest) (shown in the drawing by a dotted line). Therefore, by controlling the magnetic force to be changeable by variably moving the magnet 131-1 within the range z described above, the curvature of the curved portion 11 (imaging surface 4a) may be changed arbitrarily.

[Effects]

According to the solid-state imaging apparatus 1-1 according to embodiment 3-1, by moving the magnet 131-1 controllably with respect to the imaging chip 2 that is supported by the base 21 and that includes the curved portion 11, the curvature of the curved portion 11 (therefore, the imaging surface 4a) may be changed arbitrarily within a desired range.

As will be described in detail by the electronic apparatus described later, the solid-state imaging apparatus 1-1 is favorably applied to an electronic apparatus such as a camera that includes a zoom lens. Since the solid-state imaging apparatus 1-1 includes the curved portion 11 that includes the imaging surface 4a with a concave curved surface that corresponds to the field curvature (lens aberration) of the imaging lens, capturing with few lenses as the imaging lens is possible. When the imaging lens includes a zoom lens, particularly if the lens is a wide angle lens (short focus distance) that is close to the imaging surface 4a, the incidence angle of the off-axis luminous flux of the subject light that is incident on the lens becomes large, and the field curvature becomes large. That is, if the curvature of the imaging surface 4a is a curvature that is suited to when the lens is a telephotographic lens (long focus distance) by the lens being separated from the imaging surface 4a, field curvature is caused with a wide angle lens. By decreasing the curvature of the imaging surface 4a by bringing the magnet 131-1 near the curved portion 11 when such a wide angle lens is used, the focus matches across the entire surface of the imaging surface 4a, and appropriate image formation is possible.

Further, with an electronic apparatus such as a camera that includes a normal imaging lens such as a zoom lens, a fixed lens, or a telephotographic lens, imaging in which the curvature of the curved portion 11 of the imaging chip 2 is variably adjusted, the focus is fixed to the center of the image, and the surroundings are out of focus is also possible.

Here, in the present embodiment, only the central portion of the imaging chip 2 is three-dimensionally curved in a state in which the peripheral edge portion of the imaging chip 2 is fixed by keeping the flat portion 13 on which no stresses are added by the curving. It is therefore possible to obtain the imaging chip 2 that includes the three-dimensionally curved portion 11 without causing damage such as cracks.

Incidentally, with a solid-state imaging apparatus that includes the curved surface described in the patent literature, the entirety of the chip (semiconductor chip) on which the solid-state imaging apparatus is formed is curved in both cases. Therefore, there was a concern that stresses would be caused on the peripheral edge portion of the chip which becomes a rough surface by being divided through dicing, and cracks would occur in the chip from the peripheral edge portion side. The generation of cracks is prevented according to the present embodiment.

3. Embodiment 3-2

Configuration Example of Solid-State Imaging Apparatus

Figure 22:
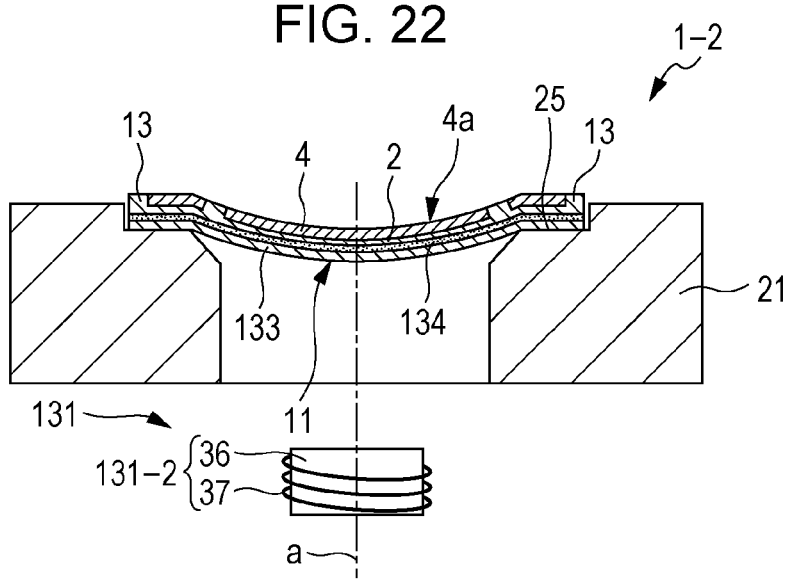
FIG. 22 is a schematic configuration diagram showing a solid-state imaging apparatus according to embodiment 3-2.

An outline configuration of embodiment 3-2 of the solid-state imaging apparatus according to the embodiments of the present technology is illustrated in FIG. 22. A solid-state imaging apparatus 1-2 according to embodiment 3-2 is configured to include the base 21, the imaging chip 2 that includes a solid-state imaging element that is supported by the base 21 and that includes the imaging surface 4a that is three-dimensionally curved as an arc or the like, and the control unit 131 that variably controls the curvature of the imaging surface 4a.

Similarly to embodiment 3-1, the imaging region 4 on which photoelectric conversion units are arranged and the solid-state imaging element that includes the peripheral circuits 5 to 8 are formed on the imaging chip 2, the magnetic film 133 is formed on the back surface on the opposite side to the imaging surface 4a of the imaging region 4, and the adhesive layer 134 is formed on the magnetic film 133. Further, similarly to the description of FIGS. 21A to 21D described above, the curved portion 11 is formed on the imaging chip 2 by the central portion of the imaging chip 2 being curved three-dimensionally as an arc or the like on the opening 23 side of the base 21. The curved portion 11 in the present example is curved as an arc. The imaging region 4 in which the photoelectric conversion units are arranged exists within the curved portion 11, and the concave curved surface of the curved portion 11 is the imaging surface 4a. The imaging chip 2 is supported by the base 21 by the flat surface 13 that extends from the peripheral edge of the curved portion 11 being fixed to the flat surface 25 of the base 21 via the adhesive layer 134.

In principle, the control unit 131 is configured by coiling a coil 37 around a magnetic core 36, and is configured by an electromagnet 131-2 that is a magnetic force generating device in which the magnetic force that is generated according to the electric current that flows through the coil 37 changes. The electromagnet 131-2 is arranged at a position that opposes the central portion of the curved portion 11 on the back surface of the base 21. That is, the electromagnet 131-2 is arranged by passing through the center of the imaging region 4 of the imaging chip 2 and being fixed to a predetermined position on an axis line that is perpendicular to the imaging region 4.

Since other configurations of the base 21 and the imaging chip 2 are the same as embodiment 3-1, the same reference numerals are given for portions of FIG. 22 that correspond to FIGS. 19 and 21 and overlapping description will be omitted. The method of manufacturing of the base 21 supporting the imaging chip 2 and curving only the imaging region 4 is the same as embodiment 3-1.

[Description of Operation]

Figure 23:
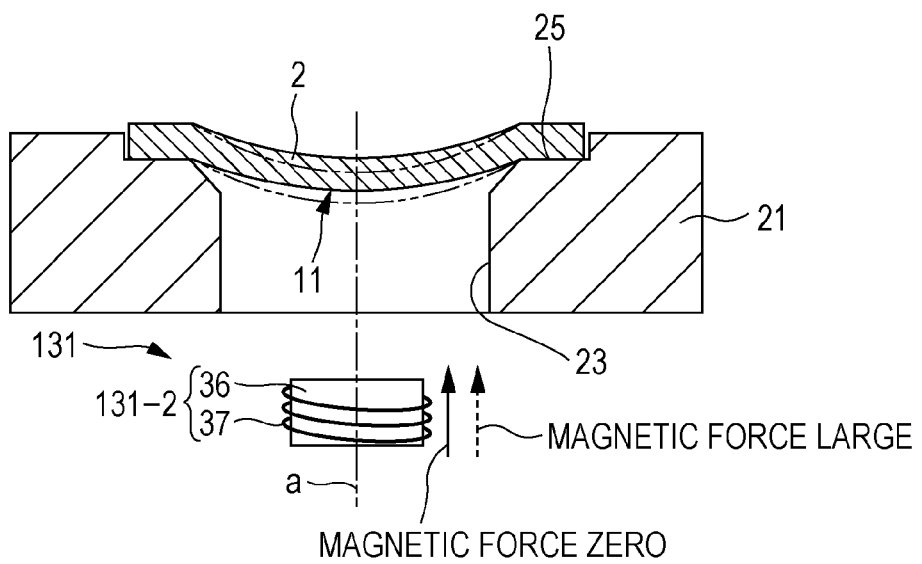
FIG. 23 is an explanatory diagram of an operation of the solid-state imaging apparatus according to embodiment 3-2.

Next, the operation of the solid-state imaging apparatus 1-2 according to embodiment 3-2 will be described. As illustrated in FIG. 23, by controlling the magnetic force of the electromagnet 131-2 that is fixed and arranged on the axis line a, the curvature of the curved portion 11 (therefore, the imaging surface 4a) is variably controlled. That is, if the magnetic force of the electromagnet 131-2 is zero, the curved portion 11 has a curvature that is obtained by the method of manufacturing described above (shown in the drawing by a solid line). The curvature of the curved portion 11 increases due to the pulling force of the magnetic force as the magnetic force of the electromagnet 131-2 increases based on the amount of electric current that flows through the coil 37. That is, the curved portion 11 (therefore, the imaging surface a) is further curved by the pulling force by the electromagnet 131-2 in addition to the curving that is obtained by the method of manufacturing described above, and has a target curvature that is greater than the initial state (shown in the drawing by a dotted line). Therefore, the curvature of the curved portion 11 (imaging surface 4a) may be changed arbitrarily by variably controlling the magnetic force of the electromagnet 131-2.

[Effects]

According to the solid-state imaging apparatus 1-2 according to embodiment 3-2, the curvature of the curved portion 11 (therefore, the imaging surface 4a) may be changed arbitrarily within a desired range by variably controlling the magnetic force that is generated by the electromagnet 131-2 with respect to the imaging chip 2 that includes the curved portion 11 and that is supported by the base 21.

Similarly to the description of embodiment 3-1, the solid-state imaging apparatus 1-2 is suited to being applied to an electronic apparatus such as a camera that includes a zoom lens. Further, control of the focus at the center and the surroundings of the image is also possible, and imaging that is suited to the purpose is possible. Furthermore, since only the central portion of the imaging chip 2 is three-dimensionally curved, an imaging chip 2 that includes a three-dimensional curved portion 11 is obtained without causing damage such as cracks.

3-3 Embodiment

Configuration Example of Solid-State Imaging Apparatus

Figure 24:
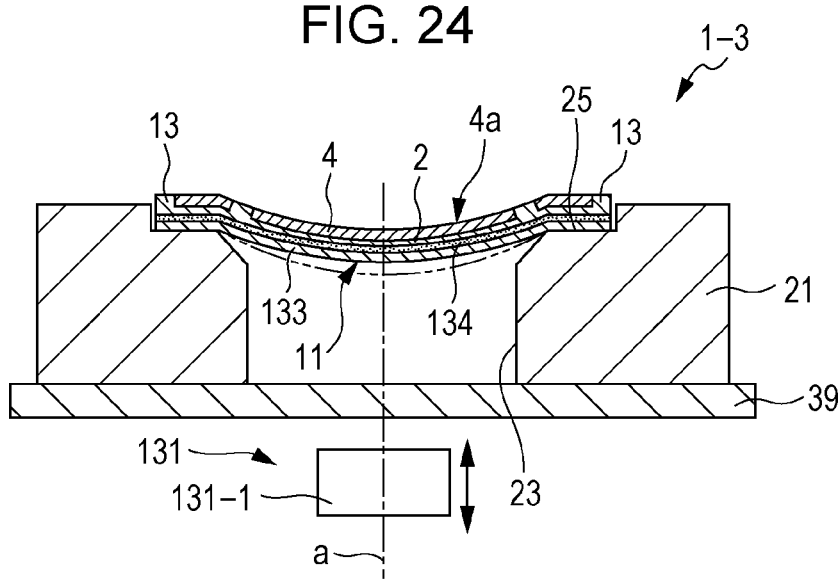
FIG. 24 is a schematic configuration diagram showing a solid-state imaging apparatus according to embodiment 3-3.

An outline configuration of a 3-3 embodiment of the solid-state imaging apparatus according to the embodiments of the present technique is illustrated in FIG. 24. A solid-state imaging apparatus 1-3 according to embodiment 3-3 is configured to include the above-described base 21, the bottom plate 39 that seals the opening 23 to the back surface of the base 21, the imaging chip 2 that is supported by the base 21, and the control unit 131 that variably controls the curvature of the imaging surface 4a. The imaging chip 2 includes the imaging region 4 on which photoelectric conversion units are arranged and the peripheral circuits 5 to 8, and the imaging surface 4a includes a solid-state imaging element that is curved three-dimensionally as an arc or the like.

Figure 26A:
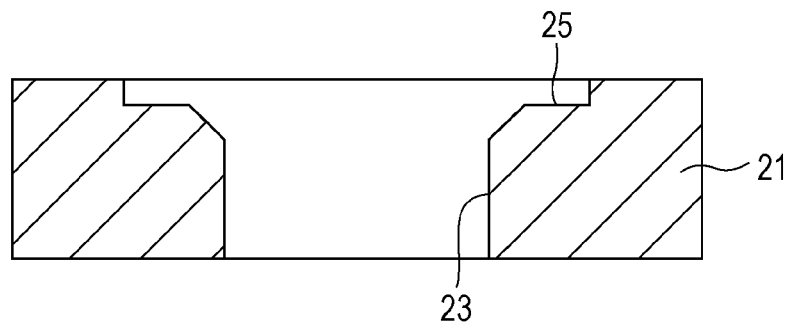
FIGS. 26A to 26C are manufacturing process diagrams (part one) showing a method of manufacturing an imaging chip of the solid-state imaging apparatus according to embodiments 3-3 and 3-4.
Figure 26B:
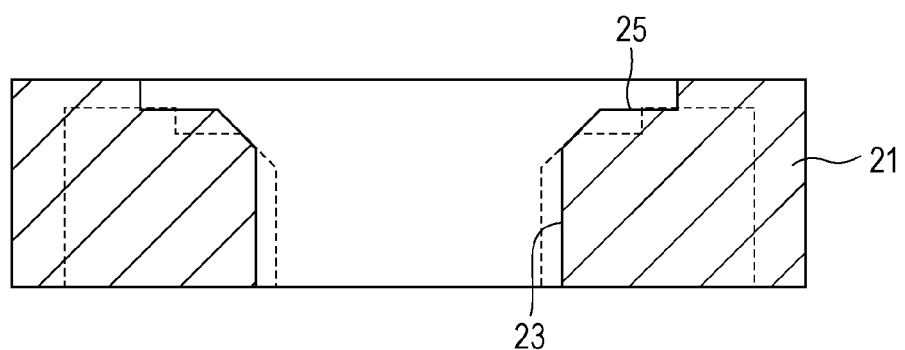
Figure 26C:
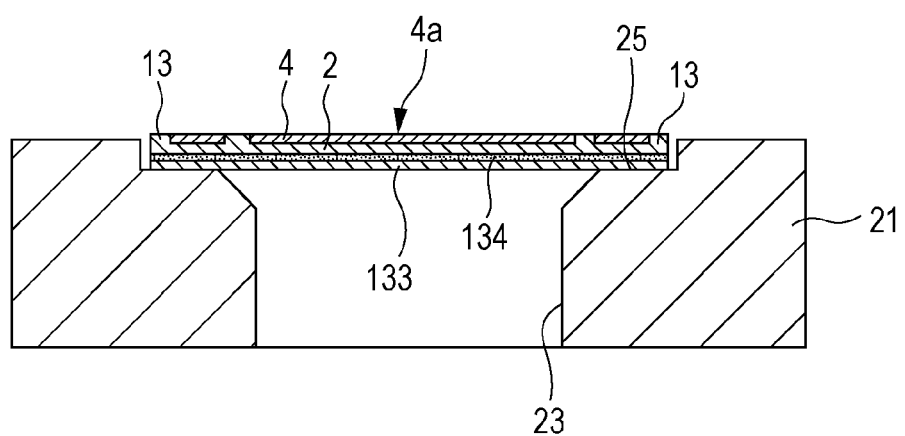

As will be made clear by the method of manufacturing of FIGS. 26A to 26C described later, the curved portion 11 is formed on the imaging chip 2 by the central portion of the imaging chip 2 being curved three-dimensionally as an arc or the like on the opening 23 side of the base 21, and the curved portion 11 is curved further by suctioning the gas within the opening 23. The curve of the curved portion 11 is maintained by the bottom plate 39 that blocks the opening 23 of the base 21 in an airtight manner.

Furthermore, similarly to embodiment 3-1, the magnetic film 133 is formed on the back surface of the imaging chip 2, and the adhesive layer 134 is formed on the magnetic film 133. Further, the imaging region 4 in which photoelectric conversion units are arranged exists within the curved portion 11 of the imaging chip 2, and the concave curved surface of the curved portion is the imaging surface 4a. The imaging chip 2 fixes the flat portion 13 that extends from the peripheral edge of the curved portion 11 to the flat surface 25 of the base 21 via the adhesive layer 134, and is supported by the base 21.

Similarly to the description above, the control unit 131 is configured by the magnet 131-1 that is moveable along the axis line a. The magnet 131-1 is arranged on the back surface of the bottom plate 39.

Since configurations other than the base 21 and the imaging chip 2 are the same as the description of embodiment 3-1, the same reference numerals are given to portions that correspond to FIGS. 19 and 21A to 21D in FIG. 24 and overlapping description will be omitted.

[Method of Manufacturing of Curving Imaging Region of Imaging Chip]

A method of manufacturing of the imaging chip 2 that includes the curved portion 11 of the imaging region 4 and the flat portion 13 of the peripheral edge of the curved portion 11 which are applied to embodiment 3-3 will be illustrated in FIGS. 26A to 26C and 27A and 27B. The method of manufacturing of the imaging chip 2 which is illustrated in FIGS. 26A to 26C and 27A and 27B uses the base 21 described above.

Figure 27A:
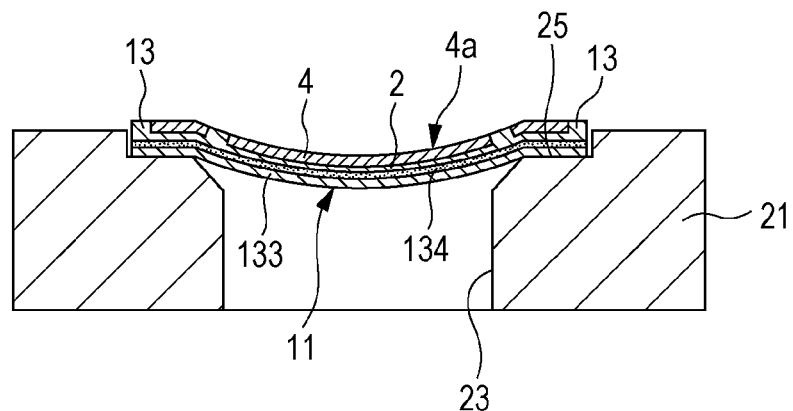
FIGS. 27A and 27B are manufacturing process diagrams (part two) showing a method of manufacturing an imaging chip of the solid-state imaging apparatus according to embodiments 3-3 and 3-4.

Since the processes from FIGS. 26A to 27A are the same as the processes of FIGS. 21A to 21D described above, overlapping description will be omitted. In the process of FIG. 27A, the volume of the base 21 is contracted by cooling the base 21 from a state in which the imaging chip 2 is fixedly attached to the base 21 in a heated state to room temperature. By such a contraction in the volume of the base 21, the central portion that is arranged to correspond to the opening 23 of the base 21 of the imaging chip 2 bulges toward the inside of the opening portion 23 and is shaped as the curved portion 11 that is three-dimensionally warped. The curved portion 11 is curved as an arc in the present example.

Figure 27B:
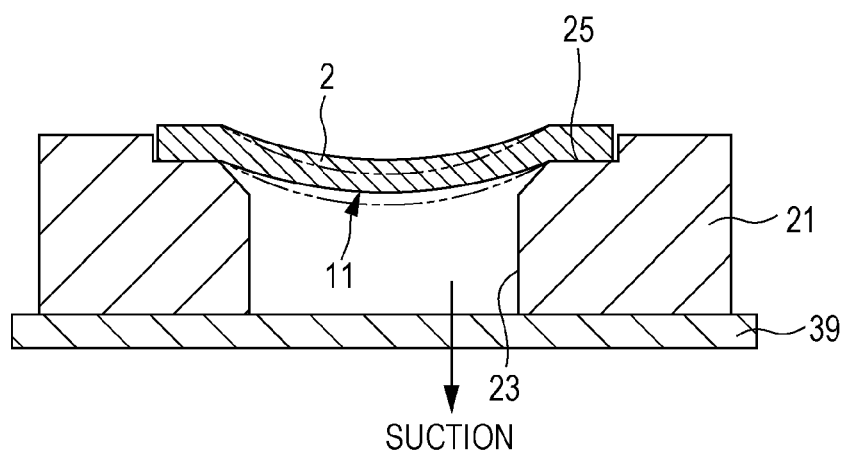

Next, as illustrated in FIG. 27B, by further curving the curved portion 11 by suctioning the gas within the opening 23 and creating a desired negative pressure, the curvature of the curved portion 11 (therefore, the imaging surface 4*a*) becomes the target curvature. In such a state, the curvature of the curved portion 11 is maintained by blocking the opening 23 with the bottom plate 39 in an airtight manner on the back surface of the base 21.

The imaging chip 2 that includes the curved portion 11 with the target curvature and that is supported by the base 21 is obtained as described above. The present embodiment 1-3 is configured by arranging the magnet 131-1 on the back surface side of the bottom plate 39 of the base 21 to oppose the imaging chip 2 that includes the curved portion 11 that is obtained in such a manner.

[Description of Operation]

The operation of the solid-state imaging apparatus 1-3 according to embodiment 3-3 is the same as in embodiment 3-1, and the magnetic force of the magnet 131-1 which acts on the magnetic film 133 of the imaging chip is variably controlled by the magnet 131-1 variably moving within the range z along the axis line a of the magnet 131-1. The curvature of the curved portion 11 (therefore, the imaging surface 4*a*) may be variably adjusted according to such a magnetic force. For example, when the magnetic force does not influence the magnetic film 133 due to the separation of the magnet 131-1 from the curved portion 11, the curvature of the curved portion 11 maintains the curvature of FIG. 27B (shown in the drawing by a solid line). When the magnetic force influences the magnetic film 133 as a result of bringing the magnet 131-1 close to the curved portion 11, the curvature of the curved portion 11 becomes greater (shown in the drawing as a dotted line).

[Effects]

According to the solid-state imaging apparatus 1-3 according to embodiment 3-3, the initial curvature of the curved portion 11 is set by a combination of the curvature by the thermal expansion and cooling of the base 21 and the curvature by the active suction within the opening 23. In so doing, the curvature of the curved portion 11 may be set with greater precision. By variably moving the magnet 131-1 from the initial state, the curvature of the curved portion 11 (therefore, the imaging surface 4*a*) may be changed arbitrarily within a desired range.

Similarly to embodiment 3-1, the solid-state imaging apparatus 1-3 is suited to being applied to an electronic apparatus such as a camera that includes a zoom lens. Further, control of the focus at the center and the surroundings of the image is also possible, and imaging that is suited to the purpose is possible. Furthermore, since only the central portion of the imaging chip 2 is three-dimensionally curved, an imaging chip 2 that includes a three-dimensional curved portion 11 is obtained without causing damage such as cracks.

5. 3-4 Embodiment

Configuration Example of Solid-State Imaging Element

Figure 25:
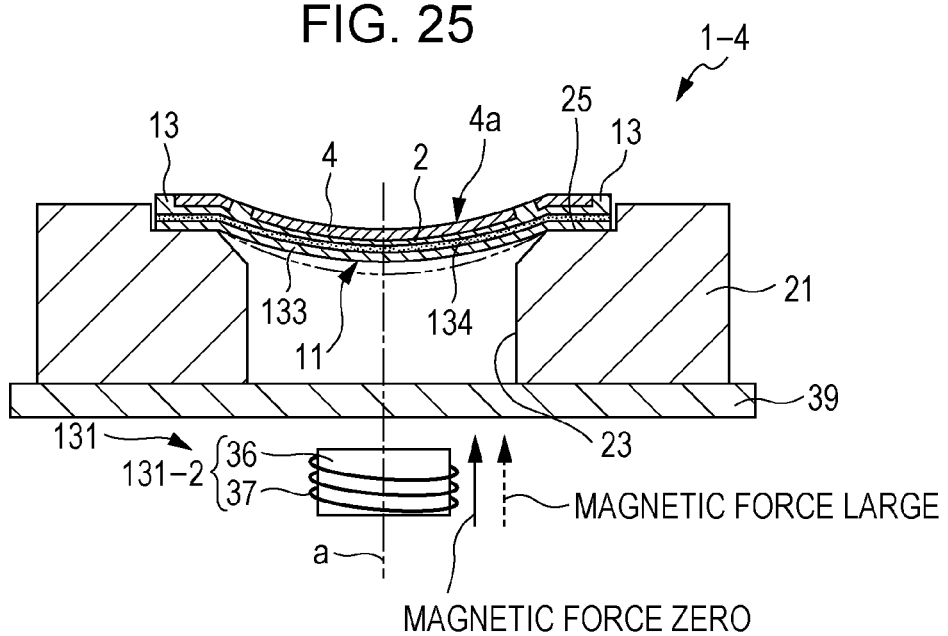
FIG. 25 is a schematic configuration diagram showing a solid-state imaging apparatus according to embodiment 3-4.

An outline configuration of a 3-4 embodiment of the solid-state imaging apparatus according to the embodiments of the present technology is illustrated in FIG. 25. A solid-state imaging apparatus 1-4 according to embodiment 3-4 is configured by replacing the magnet 131-1 according to embodiment 3-3 with the electromagnet 131-2 used in embodiment 3-2. Since other configurations are the same as embodiment 3-3, the same reference numerals are given to portions of FIG. 25 that correspond to FIG. 24 and overlapping description will be omitted.

[Description of Operation]

The operation of the solid-state imaging apparatus 1-4 according to embodiment 3-4 is the same as the description of 3-2 embodiment, and the magnetic force of the magnet 131-1 which acts on the magnetic film 133 of the imaging chip is variably controlled by controlling the magnetic force based on the electric current that flows through the coil 37 of the electromagnet 131-2. The curvature of the curved portion 11 (therefore, the imaging surface 4*a*) may be variably adjusted according to such a magnetic force. For example, if the magnetic force of the electromagnet 131-2 is zero, the curvature of the curved portion 11 maintains the curvature of FIG. 27B (shown in the drawing by a solid line). When the magnetic force is increased by an electric current flowing through the electromagnet 131-2, a pulling force is exerted by the action of the magnetic force and the curvature of the curved portion 11 becomes greater (shown in the drawing as a dotted line).

[Effects]

According to the solid-state imaging apparatus 1-4 according to the 3-4 embodiment, the initial curvature of the curved portion 11 is set by a combination of the curvature by the thermal expansion and cooling of the base 21 and the curvature by the active suction within the opening 23. In so doing, the curvature of the curved portion 11 may be set with greater precision. By variably controlling the magnetic force of the electromagnet 131-2 from the initial state, the curvature of the curved portion 11 (therefore, the imaging surface 4*a*) may be changed arbitrarily within a desired range.

Similarly to embodiment 3-1, the solid-state imaging apparatus 1-4 is suited to being applied to an electronic apparatus such as a camera that includes a zoom lens. Further, control of the focus at the center and the surroundings of the image is also possible, and imaging that is suited to the purpose is possible. Furthermore, since only the central portion of the imaging chip 2 is three-dimensionally curved, an imaging chip 2 that includes a three-dimensional curved portion 11 is obtained without causing damage such as cracks.

6. Embodiment 3-5

Configuration Example of Solid-State Imaging Apparatus

Figure 28:
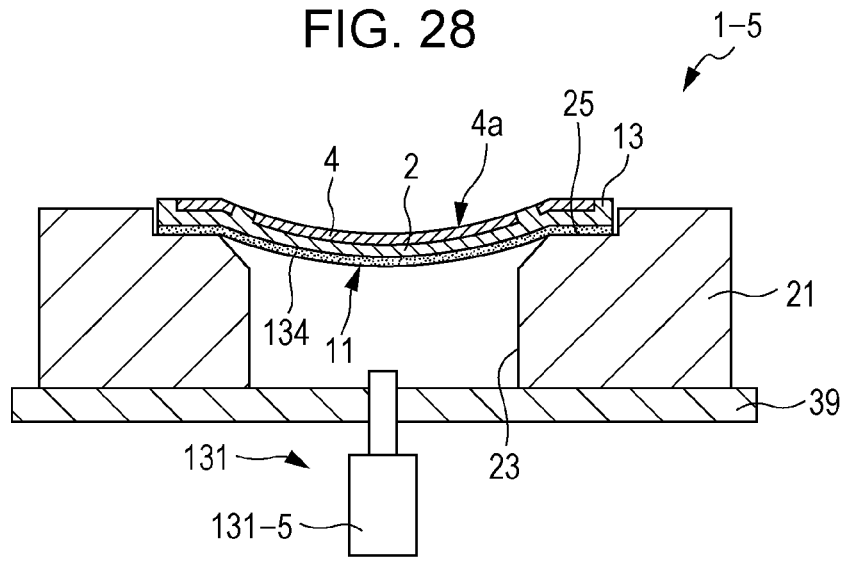
FIG. 28 is a schematic configuration diagram showing a solid-state imaging apparatus according to embodiment 3-5.

An outline configuration of embodiment 3-5 of the solid-state imaging apparatus according to the embodiments of the present technology is illustrated in FIG. 28. A solid-state imaging apparatus 1-5 according to the 3-5 embodiment is configured to include the above-described base 21, the bottom plate 39 that seals the opening 23 to the back surface of the base 21, the imaging chip 2 that is supported by the base 21, and the control unit 131 that variably controls the curvature of the imaging surface 4a of the imaging chip 2. The imaging chip 2 includes the imaging region 4 on which photoelectric conversion units are arranged and the peripheral circuits 5 to 8, and the imaging surface 4a includes a solid-state imaging element that has a concave curved surface by being curved three-dimensionally as an arc or the like.

As will be made clear in the method of manufacturing of FIGS. 30A to 30D described later, the curved portion 11 is formed on the imaging chip 2 by the central portion thereof being curved three-dimensionally as an arc or the like on the opening 23 side of the base 21, and the curved portion 11 is supported by the base 21 by fixing the flat portion 13 on the peripheral edge of the curved portion 11 on the flat surface 25 of the base 21 via the adhesive layer 134. The imaging region 4 that includes the imaging surface 4a exists in the central portion of the curved portion 11 of the imaging chip 2.

The control unit 131 is configured by a suction device 131-5 that variably controls the curvature of the curved portion 11 by suctioning the gas within the opening 23 that has been blocked in an airtight manner by the bottom plate 39 and controlling the atmospheric atmosphere (negative pressure) within the opening 23.

Since configurations other than the base 21 and the imaging chip 2 are the same as the description of embodiment 3-1, the same reference numerals are given to portions that correspond to FIGS. 19 and 21A to 21D in FIG. 22 and overlapping description will be omitted.

[Method of Manufacturing of Curving Imaging Region of Imaging Chip]

A method of manufacturing of the curved portion 11 of the imaging region 4 and the imaging chip 2 that includes the flat portion 13 of the peripheral edge of the curved portion 11 which are applied to embodiment 3-5 is illustrated in FIGS. 30A to 30D. The method of manufacturing of the imaging chip 2 illustrated in FIGS. 30A to 30D uses the base 21 described above.

Figure 30A:
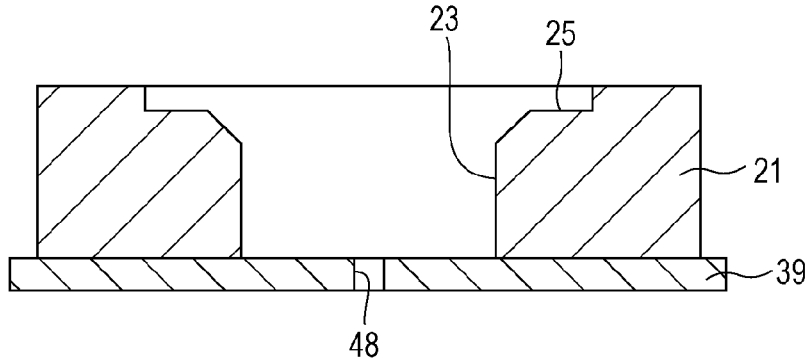
FIGS. 30A to 30D are manufacturing process diagrams showing a method of manufacturing the solid-state imaging apparatus according to embodiment 3-5.

First, as illustrated in FIG. 30A, the bottom plate 39 is arranged on the opposite side to the side on which the flat surface 25 is provided on the base 21. A through hole 48 that connects to the opening 23 is provided on the bottom plate 39. The bottom plate 39 substantially blocks the opening 23 in an airtight manner by the suction opening of the suction device 131-5 being finally inserted into the through hole 48. Here, the bottom plate 39 may be formed integrally with the base 21, or the base 21 may be formed separately. The bottom plate 39 may be formed by a metallic member of the same material as the base 21 or may be formed by a different member.

Figure 30B:
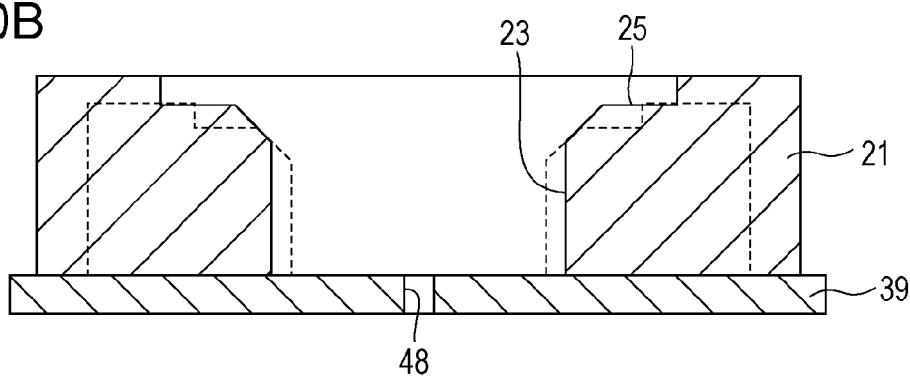

Next, as illustrated in FIG. 30B, the base 21 is expanded by heating. By further heating the bottom plate 39 as necessary, the bottom plate 39 is also expanded by the same degree as the base 21. In so doing, the base 21 is expanded, and the flat surface 25 is spread to the outside by enlarging the diameter of the opening 23. Similarly to the description above, the heating temperature at this time is equal to or greater than the curing temperature of the adhesive layer 134 that is provided on the back surface of the imaging chip 2, and is set to a range within which there is no influence on the imaging chip 2.

Figure 30C:
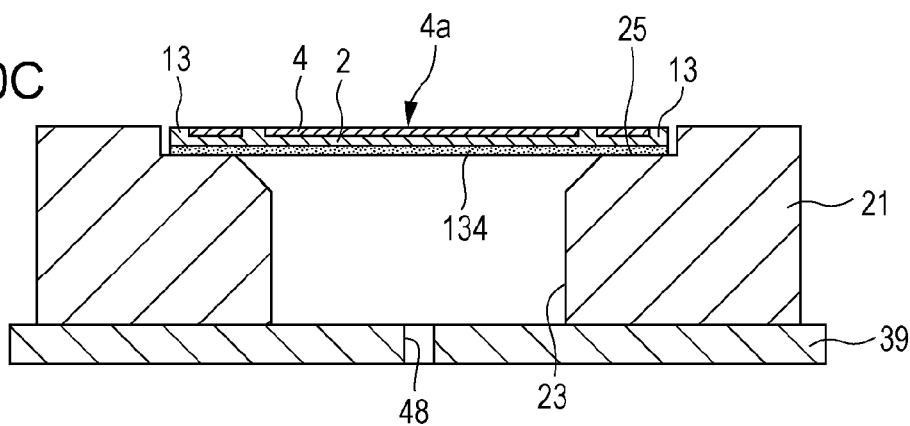

Next, as illustrated in FIG. 30C, the imaging surface 4a of the imaging region 4 of the imaging chip 2 is turned upward in a state in which the opening 23 of the base 21 is sealed in an airtight manner, and the imaging chip 2 is mounted on the flat surface 25 of the base 21. The adhesive layer 134 made of a thermosetting resin, for example, is arranged on the mounting surface (back surface) side of the base 21 of the imaging chip 2. As illustrated in the drawing, the adhesive layer 134 may be arranged across the entire surface of the back surface side of the imaging chip 2, or may be arranged on only the peripheral edge of the imaging chip 2 to correspond to the flat surface 25 of the base 21. However, it is important that the adhesive layer 134 be interposed between the flat surface 25 of the base 21 and the imaging chip 2 across the entire circumference that surrounds the opening 23.

Similarly to the description above, such a state is maintained until the adhesive layer 134 is cured, the flat portion 13 of the imaging chip 2 is fixed on the flat surface 25 of the base 21, and the imaging chip 2 is supported by the base 21.

Figure 30D:
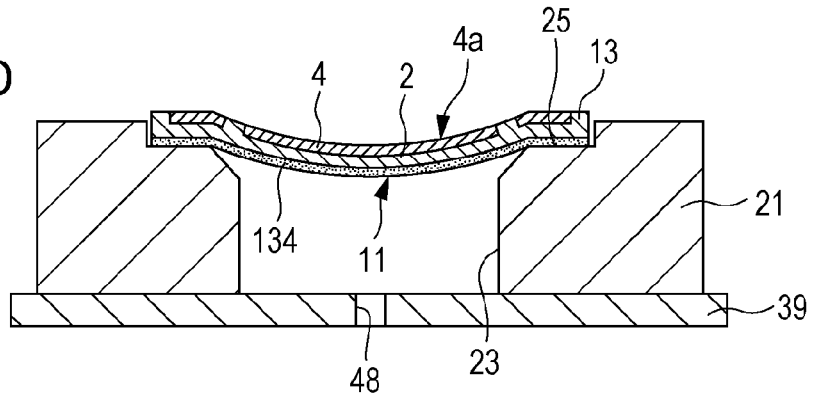

Next, as illustrated in FIG. 30D, the base 21 and the bottom plate 39 are cooled from a heated state to room temperature. The base 21 and the bottom plate 39 contract during such a cooling process. The base 21 and the bottom plate 39 contract to the size before heating. Similarly to the description above, the central portion of the imaging chip 2 which corresponds to the opening 23 of the base 21 is pulled to the inner side of the opening 23 due to the contraction in the volumes of the base 21 and the bottom plate 39, and the central portion is shaped as the curved portion 11 that is curved three-dimensionally. The curved portion 11 is curved as an arc or the like in the present example. The formation of such a curvature is the same as the description of FIGS. 21A to 21D.

The imaging chip 2 that includes the curved portion 11 is formed as described above. The solid-state imaging apparatus 1-5 of the present embodiment is configured by arranging the suction device 131-5 that connects within the opening 23 through the through hole 48 of the bottom plate 39 on the back surface of the base 21 to oppose the imaging chip 2 obtained in such a manner that includes the curved portion 11.

[Description of Operation]

Next, the operation of the solid-state imaging apparatus 1-5 according to embodiment 3-5 will be described. The through hole 48 of the bottom plate 39 is preferably provided at a position that corresponds to the center of the imaging region 4 of the curved portion 11, and the suction device 131-5 is arranged so that a suction opening exists on the through hole 48.

Figure 29:
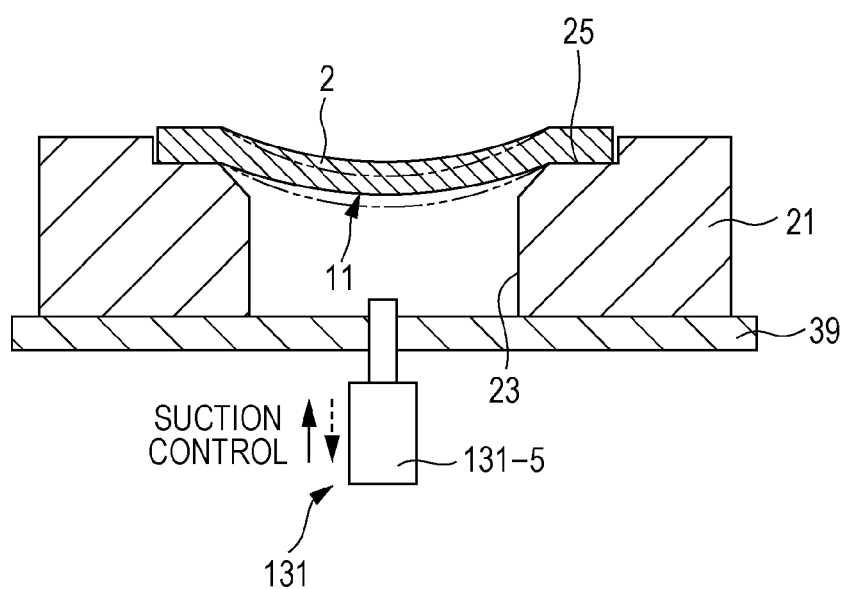
FIG. 29 is an explanatory diagram describing an operation of the solid-state imaging apparatus according to embodiment 3-5.

As illustrated in FIG. 29, when the suction device 131-5 is not activated, the curved portion 11 is maintained in the initial curvature state (shown in the drawing by a solid line). If the suction device 131-5 is activated to suction the gas within the opening 23 to make the atmospheric pressure within the opening 23 negative pressure, the curved portion 11 is pulled and curved more than the initial state (shown in the drawing by a dotted line). Therefore, by variably controlling the suction force by the suction device 131-5, the curvature of the curved portion 11 (therefore, the imaging surface 4a) may be variably controlled arbitrarily.

[Effects]

According to the solid-state imaging apparatus 1-5 according to embodiment 3-5, the atmospheric pressure (negative pressure) within the opening 23 of the base 21 is variably controlled by the suction device 131-5 in a state in which the imaging chip 2 that includes the curved portion 11 is supported by the base 21. In so doing, the curvature of the curved portion 11 (therefore, the imaging surface 4a) may be changed arbitrarily within a desired range.

Similarly to embodiment 3-1, the solid-state imaging apparatus 1-5 is suited to being applied to an electronic apparatus such as a camera that includes a zoom lens. Further, control of the focus at the center and the surroundings of the image is also possible, and imaging that is suited to the purpose is possible. Furthermore, since only the central portion of the imaging chip 2 is three-dimensionally curved, an imaging chip 2 that includes a three-dimensional curved portion 11 is obtained without causing damage such as cracks.

7. Embodiment 3-6

Configuration Example of Solid-State Imaging Apparatus

Figure 31:
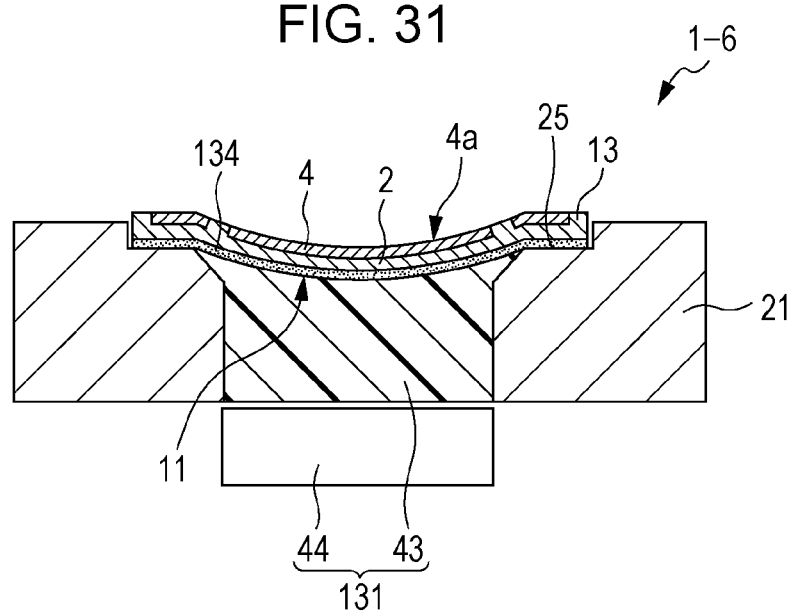
FIG. 31 is a schematic configuration diagram showing a solid-state imaging apparatus according to embodiment 3-6.

An outline configuration of embodiment 3-6 of the solid-state imaging apparatus according to the embodiment of the present technology is illustrated in FIG. 31. A solid-state imaging apparatus 1-6 according to embodiment 3-6 is configured to include the above-described base 21, the imaging chip 2 that is supported by the base 21, and the control unit 131 that variably controls the curvature of the imaging surface 4a of the imaging chip 2. The imaging chip 2 includes the imaging region 4 and the peripheral circuits 5 to 8, and includes a solid-state imaging element in which the imaging surface 4a is three-dimensionally curved as an arc or the like to create a concave curved surface.

As will be made clear in the method of manufacturing of FIGS. 33A to 33D described later, the curved portion 11 is formed on the imaging chip 2 by the central portion thereof being curved three-dimensionally as an arc or the like on the opening 23 side of the base 21, and the curved portion 11 is supported by the base 21 by fixing the flat portion 13 on the peripheral edge of the curved portion 11 on the flat surface 25 of the base 21 via the adhesive layer 134. The imaging region 4 that includes the imaging surface 4a exists in the central portion of the curved portion 11 of the imaging chip 2.

The control unit 131 is configured to include the adhesive agent 43 that is filled to be adhered to the imaging chip 2 within the opening 23 of the base 21, and a temperature control unit 44 that mainly controls the temperature of the adhesive agent 43. In particular, the adhesive agent 43 is an adhesive that thermally contracts, and for example, an adhesive using a thermosetting resin may be used.

Since configurations other than the base 21 and the imaging chip 2 are the same as the description of embodiment 3-1, the same reference numerals are given to portions that correspond to FIGS. 19 and 21A to 21D in FIG. 22 and overlapping description will be omitted.

[Method of Manufacturing of Curving Imaging Region of Imaging Chip]

A method of manufacturing of the curved portion 11 of the imaging region 4 and the imaging chip 2 that includes the flat portion 13 of the peripheral edge of the curved portion 11, which are applied to embodiment 3-6, is illustrated in FIGS. 33A to 33D. The method of manufacturing of the imaging chip 2 illustrated in FIGS. 33A to 33D uses the base 21 described above.

The present method of manufacturing is in essence the same as the method of manufacturing of FIGS. 21A to 21D except that a magnetic film is not formed on the back surface of the imaging chip 2 and only the adhesive layer 134 is formed.

Figure 33A:
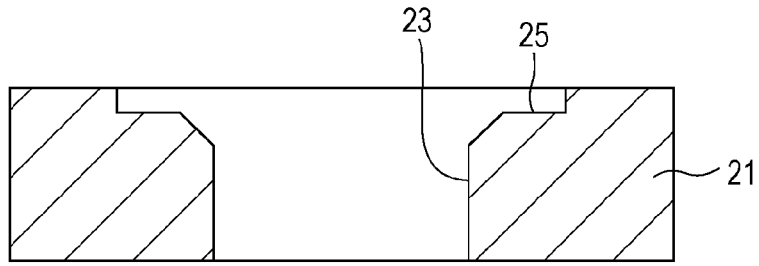
FIGS. 33A to 33D are manufacturing process diagrams showing a method of manufacturing the solid-state imaging apparatus according to embodiment 3-6.

That is, as illustrated in FIG. 33A, the base 21 with a side on which the flat surface 25 of the opening 23 is provided and in which the opposite side is not blocked is prepared.

Figure 33B:
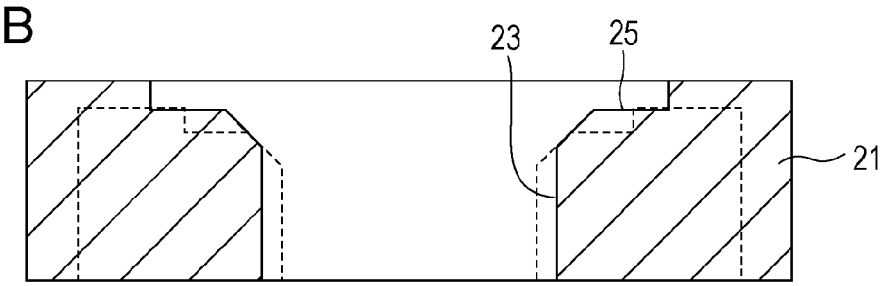

Next, as illustrated in FIG. 33B, the base 21 is expanded by heating, the diameter of the opening 23 is expanded accordingly, and the flat surface 25 is spread to the outside.

Figure 33C:
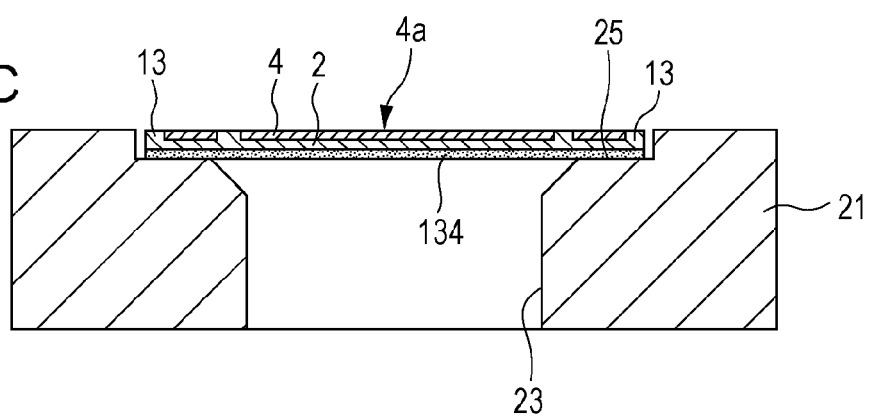

Next, as illustrated in FIG. 33C, the imaging chip 2 on the back surface of which is formed the adhesive layer 134 is placed on the base 21, and the imaging chip 2 is supported by being fixed on the base 21 via the adhesive layer 134. That is, the imaging chip 2 is placed so as to block the opening 23 of the base 21, and the flat surface 25 of the base 21 and the flat surface 13 of the peripheral edge of the imaging region 4 of the imaging chip 2 are fixed.

Figure 33D:
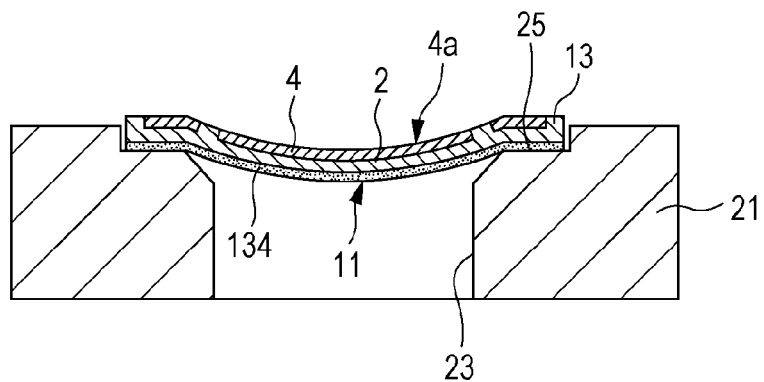

Next, as illustrated in FIG. 33D, the base 21 is contracted to the size before heating by cooling from a heated state to room temperature. Due to the volumetric contraction of the base 21, the central portion that includes the imaging region 4 of the imaging chip 2 is curved on the inside of the opening 23 and shaped as the three-dimensionally curved portion 11 of an arc or the like. The curved portion 11 is curved as an arc in the present example.

The imaging chip 2 that includes the curved portion 11 in which the imaging surface 4a is curved is formed as described above. The solid-state imaging apparatus 1-6 of the present embodiment is configured to fill the adhesive agent 43 that thermally contracts in volume in the opening 23 of the base 21 that supports the imaging chip 2 that is obtained in such a manner, and to further include the temperature control unit 44 that mainly controls the temperature of the adhesive agent 43 (refer to FIG. 31).

[Description of Operation]

Figure 32:
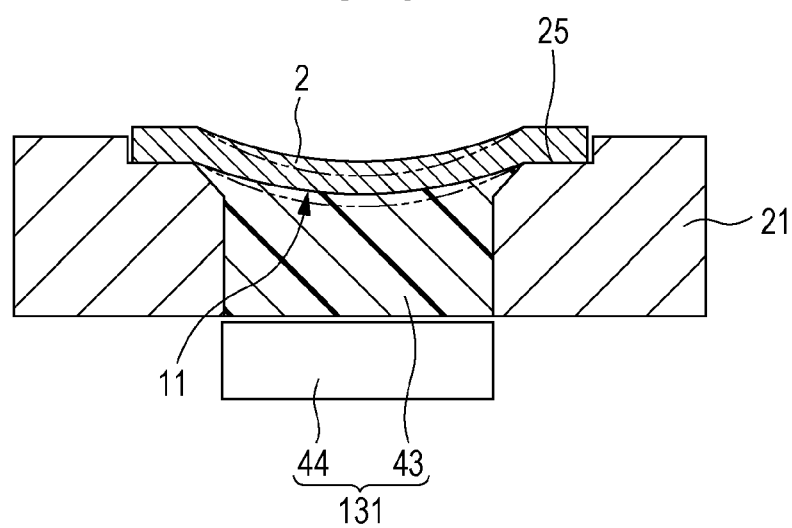
FIG. 32 is an explanatory diagram describing an operation of the solid-state imaging apparatus according to embodiment 3-6.

Next, the operation of the solid-state imaging apparatus 1-6 according to embodiment 3-6 will be described. As illustrated in FIG. 32, when the adhesive agent 43 within the opening 23 is at room temperature according to the temperature control unit 44, the curved portion 11 (therefore, the imaging surface 4a) has the curvature of the initial state (shown in the drawing by a solid line). When the adhesive agent 43 within the opening 23 is cooled by the temperature cooling unit 44, the volume of the adhesive agent 43 contracts and pulls the curved portion 11, enlarging the curvature of the curved portion 11 (therefore, the imaging surface 4a) (shown in the drawing by a dotted line). Therefore, by variably controlling the temperature from the temperature control unit 44, the curvature of the curved portion 11 (therefore, the imaging surface 4a) may be variably controlled arbitrarily.

[Effects]

The solid-state imaging apparatus 1-6 according to embodiment 3-6 includes the control unit 131 that is made of the adhesive agent 43 that fills in the opening 23 of the base 21 and volumetrically contracts and the temperature control unit 44 that mainly controls the temperature of the adhesive layer 43. By variably controlling the volumetric contraction of the adhesive agent 43 by controlling the temperature of the adhesive layer 43 of the control unit 131, the curvature of the curved portion 11 (therefore, the imaging surface 4a) may be changed arbitrarily within a desired range.

Similarly to embodiment 3-1, the solid-state imaging apparatus 1-6 is suited to being applied to an electronic apparatus such as a camera that includes a zoom lens. Further, control of the focus at the center and the surroundings of the image is also possible, and imaging that is suited to the purpose is possible. Furthermore, since only the central portion of the imaging chip 2 is three-dimensionally curved, an imaging chip 2 that includes a three-dimensional curved portion 11 is obtained without causing damage such as cracks.

8. Embodiment 3-7

Configuration Example of Solid-State Imaging Apparatus

Figure 34:
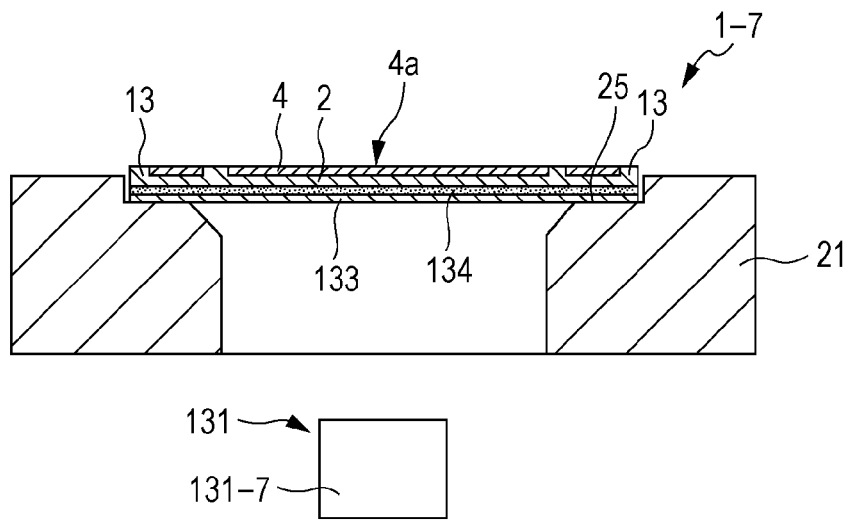
FIG. 34 is a schematic configuration diagram showing a solid-state imaging apparatus according to embodiment 3-7.

An outline configuration of a solid-state imaging apparatus 1-7 according to embodiment 3-7 according to the embodiment of the present technology is illustrated in FIG. 34. A solid-state imaging apparatus according to embodiment 3-7 is configured to include the above-described base 21, the imaging chip 2 that is supported by the base 21, and the control unit 131 that variably controls the curvature of the imaging surface 4a of the imaging chip 2.

Similarly to embodiment 3-1, a solid-state imaging apparatus that includes the imaging region 4 on which photoelectric conversion units are arranged and the peripheral circuits 5 to 8 is formed on the imaging chip 2, the magnetic film 133 is formed on the back surface on the opposite side to the imaging surface 4a of the imaging region 4, and the adhesive layer 134 is formed on the magnetic film 133. Further, the imaging chip 2 is supported by the base 21 by fixing the flat portion 13 of the imaging chip 2 being fixed to the flat surface 25 of the base 21 via the adhesive layer 134 so that the opening 23 of the base 21 is blocked by the central portion that includes the imaging region 4 in a flat state.

The control unit 131 may be configured by a magnetic force control unit 131-8 that is able to variably control the magnetic force. The magnetic force control unit 131-8 may be configured by the magnet 131-1, for example, used in embodiment 3-1. Further, the magnetic force control unit 131-8 is also able to be configured by the electromagnet 131-2 used in embodiment 3-2.

[Description of Operation]

Next, the operation of the solid-state imaging apparatus 1-7 according to embodiment 3-7 will be described. As illustrated in FIG. 34, when the magnetic force from the magnetic force control unit 131-8 does not substantially act on the magnetic film 133 on the back ace of the imaging chip 2, the central portion of the imaging chip 2 (therefore, the imaging surface 4a) is not substantially curved. That is, the curvature becomes infinitesimal and a flat state (shown in the drawing by a solid line). As the magnetic force of the magnetic force control unit 131-8 increases, the curvature of the central portion of the imaging chip 2 (therefore, the imaging surface 4a) increases, and the curvature of the curved portion 11 increases (shown in the drawing by a dotted line). Therefore, by variably controlling the action of the magnetic force on the magnetic film 133 of the imaging chip by the magnetic force control unit 131-8, the curvature of the imaging surface 4a of the imaging chip 2 is arbitrarily changeable from a flat state (curvature is infinitesimal) to a curved state in which the curvature is increased.

Since the operation when the magnet 131-1 is used as the magnetic force control unit 131-7 follows embodiment 3-1 and the operation when the electromagnet 131-2 is used follows embodiment 3-2, detailed description will be omitted.

[Effects]

According to the solid-state imaging apparatus 1-7 according to embodiment 3-7, by variably moving the magnetic force that is applied to the imaging chip by the magnetic force control unit 131-7 with respect to the imaging chip 2 that is supported by the base 21, the curvature of the imaging surface 4a (including an infinitesimal curvature) is arbitrarily changeable within a desired range.

Similarly to embodiment 3-1, the solid-state imaging apparatus 1-7 is suited to being applied to an electronic apparatus such as a camera that includes a zoom lens. Further, control of the focus at the center and the surroundings of the image is also possible, and imaging that is suited to the purpose is possible. Furthermore, since only the central portion of the imaging chip 2 is three-dimensionally curved, an imaging chip 2 that includes a three-dimensional curved portion 11 is obtained without causing damage such as cracks.

9. Embodiment 3-8

Configuration Example of Solid-State Imaging Apparatus

Figure 35:
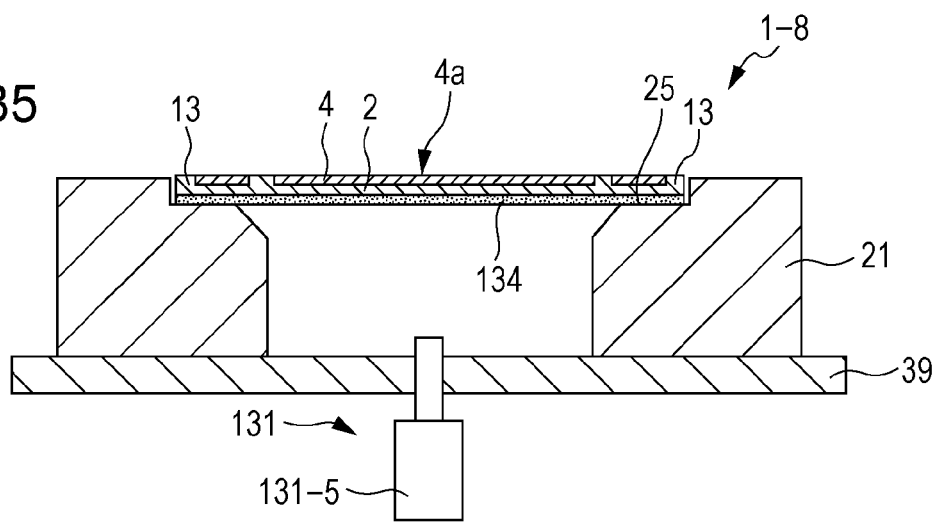
FIG. 35 is a schematic configuration diagram showing a solid-state imaging apparatus according to embodiment 3-8.

An outline configuration of a solid-state imaging apparatus according to embodiment 3-8 according to the embodiment of the present technology is illustrated in FIG. 35. A solid-state imaging apparatus 1-8 according to embodiment 3-8 is configured to include the above-described base 21, the imaging chip 2 that is supported by the base 21, and the control unit 131 that variably controls the curvature of the imaging surface 4a of the imaging chip 2.

The imaging region 4 on which photoelectric conversion units are arranged and a solid-state imaging element that includes the peripheral circuits 5 to 8 are formed on the imaging chip 2, and the adhesive layer 134 is formed on the back surface on the opposite side to the imaging surface 4a of the imaging region 4. Further, the imaging chip 2 is supported by the base 21 by the flat portion 13 of the imaging chip 2 being fixed to the flat surface 25 of the base 21 via the adhesive layer 134 so that the opening 23 of the base 21 is blocked at the central portion that includes the imaging region 4 in a flat state. The bottom plate 39 that blocks the opening is arranged on the back surface of the base 21.

The control unit 131 is configured by the same suction device 131-5 as embodiment 3-5. That is, the suction device 131-5 is configured to suction the gas within the opening 23 that is blocked in an air-tight manner at the bottom plate 39, and to curve the central portion that includes the imaging surface 4a of the imaging chip 2 that is supported by the base 21 to the opening 23 inside by controlling the atmospheric pressure (negative pressure) within the opening 23.

[Description of Operation]

Next, the operation of the solid-state imaging apparatus 1-8 according to embodiment 3-8 will be described. As illustrated in FIG. 35, when the suction device 131-5 does not perform a suction operation, the imaging chip 2 maintains a state in which the imaging surface 4a is flat (shown in the drawing by a solid line). When the suction device 131-5 performs a suction operation, negative pressure is created within the opening 23 of the base 21, the central portion of the imaging chip 2 (therefore, the imaging surface 4a) is curved according to the suction force, and the curved portion 11 with a target curvature is formed (shown in the drawing by a dotted line). Therefore, by variably controlling the suction device 131-5, the curvature of the imaging surface 4a of the imaging chip 2 is arbitrarily changeable from a flat state (curvature is infinitesimal) to a curved state with a large curvature.

[Effects]

According to the solid-state imaging apparatus 1-8 according to embodiment 3-8, by variably controlling the suction with respect to the imaging chip 2 that is supported by the base, the curvature of the imaging surface 4a (including infinitesimal curvature) is arbitrarily changeable within a desired range.

Similarly to embodiment 3-1, the solid-state imaging apparatus 1-8 is suited to being applied to an electronic apparatus such as a camera that includes a zoom lens. Further, control of the focus at the center and the surroundings of the image is also possible, and imaging that is suited to the purpose is possible. Furthermore, since only the central portion of the imaging chip 2 is three-dimensionally curved, an imaging chip 2 that includes a three-dimensional curved portion 11 is obtained without causing damage such as cracks.

10. Embodiment 3-9

Configuration Example of Solid-State Imaging Apparatus

Figure 36:
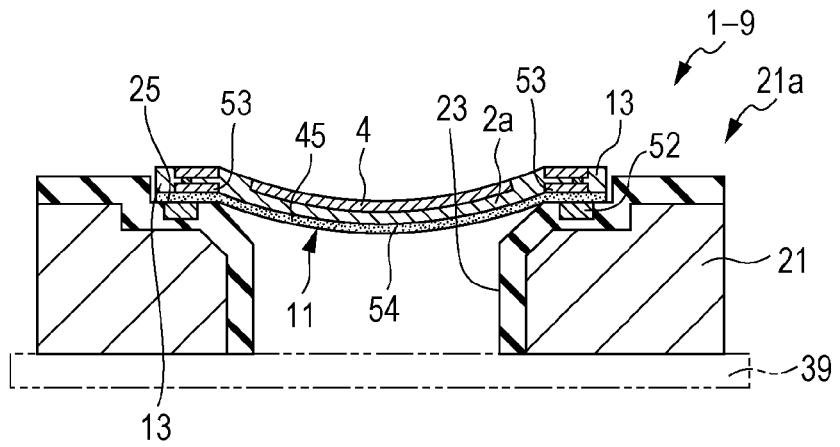
FIG. 36 is a schematic configuration diagram showing a solid-state imaging apparatus according to embodiment 3-9.

An outline configuration of a solid-state imaging apparatus according to embodiment 3-9 according to the embodiments of the present technology is illustrated in FIG. 36. A solid-state imaging apparatus 1-9 according to embodiment 3-9 configures the base to function as a package. The solid-state imaging apparatus 1-9 is configured to include a base 21a that also serves as a package, the imaging chip 2 that is supported by the base 21a, and the control unit 131 (not shown) that variably controls the curvature of the imaging surface 4a. The imaging chip 2 includes a solid-state imaging element that includes the imaging region 4 in which photoelectric conversion units are arranged and the peripheral circuits 5 to 8, and in which the imaging surface 4a is three-dimensionally curved as an arc or the like. The imaging surface 4a is curved as an arc in the present example.

Figure 37A:
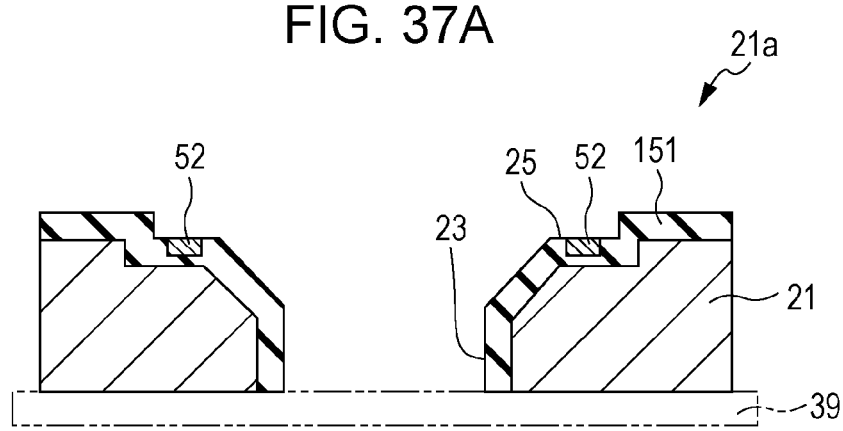
FIGS. 37A and 37B are a cross-sectional view and a plan view of a base combined with a package applied to embodiment 3-9.
Figure 37B:
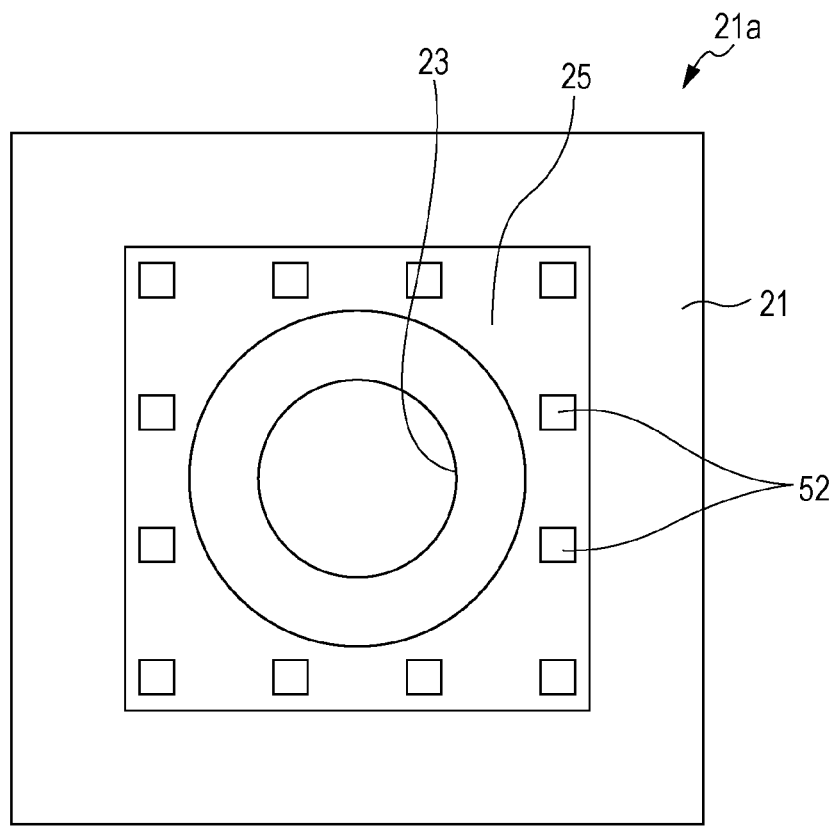

As illustrated in FIGS. 37A and 37B, the base 21a is configured so that the flat surface 25 side of the base 21 illustrated in FIGS. 18A and 18B described above is covered by an insulating film 151, and a base side electrode 52 is further arranged on the flat surface 25 that is covered by the insulating film 151. The insulating film 151 may also be formed to extend on an inner wall surface of the opening 23 from the flat surface 25 side. The bottom plate 39 that blocks the opening 23 may be arranged on the back surface of the base 21 to correspond to the configuration of the control unit 131.

The base side electrode 52 is arranged to correspond to a chip side electrode 53 described later that is provided on the imaging chip 2, and is arranged in a state of being embedded in the insulating film 151. That is, the base side electrode 52 configures a portion of the flat surface 25 of the base 21a. Such a base side electrode 52 has a configuration of protruding from the flat surface 25 of the base 21a and further being connected to an external member.

The control unit 131 (not shown) may be configured by an electromagnet, a suction device, an adhesive agent, a temperature control unit, and the like. A magnetic film and an anisotropic conductive adhesive layer or only an anisotropic conductive adhesive layer are formed on the back surface of the imaging chip 2 to correspond to the respective control units. FIG. 36 is an example in which only an anisotropic conductive adhesive layer 54 is formed. The chip side electrodes 53 that are connected one to one with the base side electrodes 52 are provided on the back surface of the imaging chip 2.

According to the present embodiment, similarly to FIGS. 21A to 21D described above, for example, the imaging chip 2 is mounted on the flat surface 25 to be fixed in a state in which the base 21a is heated and expanded, and when the base 21a is then cooled and returned to room temperature, the central portion that includes the imaging region 4 of the imaging chip 2 is curved to create the curved portion 11. The chip side electrode 53 and the base side electrode 52 are electrically connected by the anisotropic conductive adhesive layer 54 in a state in which the flat peripheral edge of the imaging chip 2 is fixed to the flat surface 25 of the base 21a.

[Effects]

According to the solid-state imaging apparatus 1-9 according to embodiment 3-9, similarly to each of the embodiments described above, the curvature of the curved portion 11 (therefore, the imaging surface 4a) of the imaging chip 2 may be variably controlled by the control unit 131. Therefore, the solid-state imaging apparatus 1-9 is suited to being applied to an electronic apparatus such as a camera that includes a zoom lens. Further, control of the focus to the center and the surroundings of the image also becomes possible, and imaging suited to the purpose becomes possible. Furthermore, only the central portion of the imaging chip 2 is three-dimensionally curved. Therefore, the imaging chip 2 that includes the three-dimensionally curved portion 11 is obtained without causing damage such as cracks.

Furthermore, according to embodiment 3-9, by using the base 21a as a package, it is possible to reduce the process of assembling a package that includes the imaging chip 2 and an external terminal. Further, terminals that protrude from the peripheral circuits 5 to 8 may be provided on both sides of where the imaging region 4 is arranged on the flat portion 13 of the imaging chip 2, and connection with an external circuit may be made using such terminals. At this time, by providing the terminals in the flat portion 13, favorable operability is secured for obtaining a bonding-like connection to external circuits.

The embodiments 3-1 to 3-8 described above were configured such that the imaging chips 2 were fixed to the base 21 via the adhesive layer 134. On the other hand, as illustrated in FIGS. 38A and 38B, a configuration in which the imaging chip 2 is fixed to the base 21b by vacuum contact is also possible.

Figure 38A:
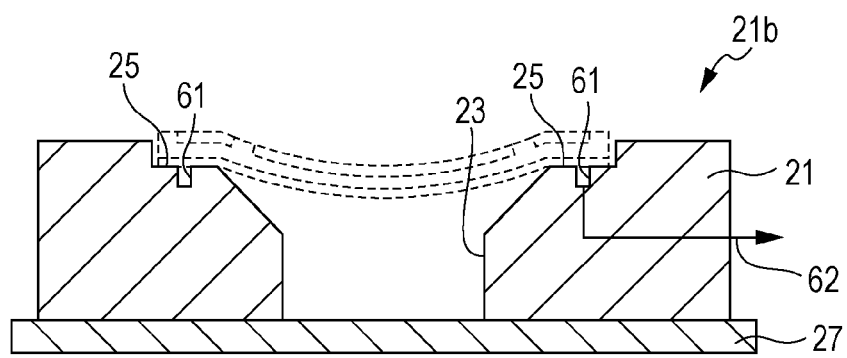
FIGS. 38A and 38B are a cross-sectional view and a plan view showing another example of a base applied to the embodiments.
Figure 38B:
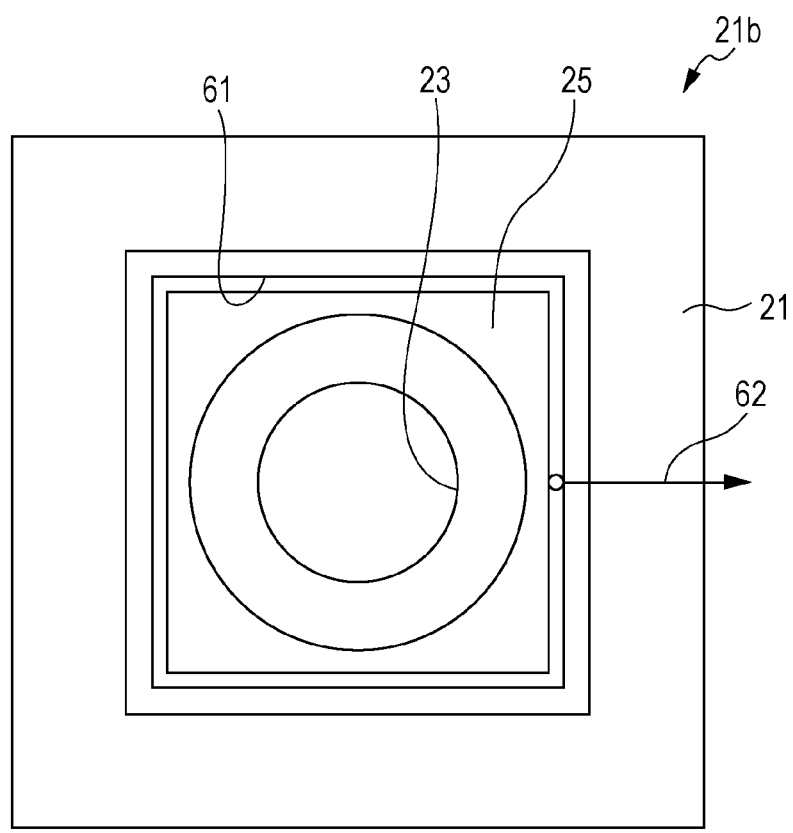

As illustrated in FIGS. 38A and 38B, the base 21b has the base 21 described above as the base main body, and includes an exhaust groove 61 on the flat surface 25 thereof. The exhaust groove 61 is provided in a state of surrounding the entire circumference of the opening 23 of the base 21b. An exhaust system 62 is connected to the exhaust groove 61, and has a configuration of discharging the gas within the exhaust groove 61. After placing the imaging chip 2 on the flat surface 25 in order to block the opening with respect to the base 21a, the imaging chip 2 discharges the gas within the exhaust groove 61 by the exhaust system 62, and is fixed by vacuum contact by reducing the pressure within the exhaust groove 61.

11. Embodiment 3-10

Configuration Example of Solid-State Imaging Apparatus

An outline configuration of a solid-state imaging apparatus according to embodiment 3-10 according to the embodiments of the present technology is illustrated in FIGS. 39 to 42B. A solid-state imaging apparatus according to embodiment 3-10 is configured so that when the control unit 131 is configured in principle so that when the control unit 131 is coiled as a coil, the control unit 131 is configured to be curved in a desired shape by changing one or both of the manner in which the coil is coiled and the density of the coiling. Even in such a case, the magnetic force that is generated changes according to the electric current that flows through the coil.

[Configuration of First Example]

Figure 39:
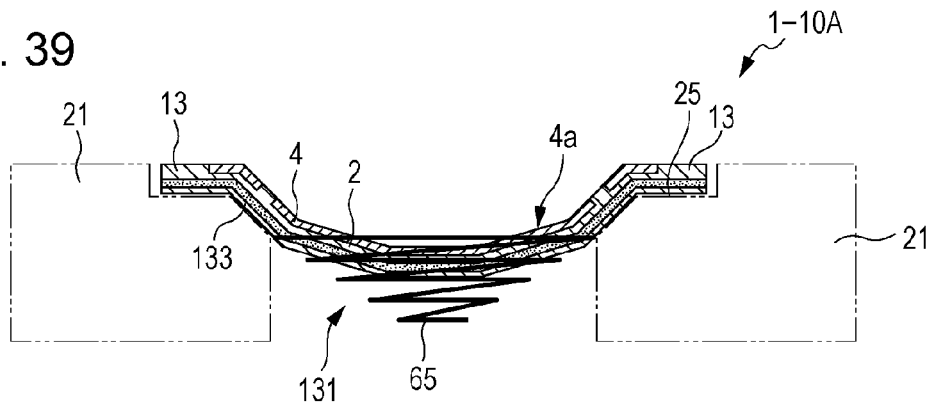
FIG. 39 is a schematic configuration diagram showing a first example of a solid-state imaging apparatus according to embodiment 3-10.

A first example of a solid-state imaging apparatus according to embodiment 3-10 is illustrated in FIG. 39. A solid-state imaging apparatus 1-10A is configured to include the above-described base 21, the imaging chip 2 that is supported by the base 21 and that includes a solid-state imaging element in which the imaging surface 4a is curved as an arc or the like, and a coil 65 that curves the imaging surface 4a in a desired shape and that controls the curvature rate (equivalent to the curvature). The coil 65 is also configured as the control unit 131 described above that variably controls the curvature rate.

Similarly to embodiment 3-1, a solid-state imaging apparatus that includes the imaging region 4 in which photoelectric conversion units are arranged and peripheral circuits are formed on the imaging chip 2, and the magnetic film 133 is formed on the back surface on the opposite side to the imaging surface 4a of the imaging region 4. The curved portion 11 of which the central portion is three-dimensionally curved as an arc or the like on the opening 23 side of the base 21 is formed on the imaging chip 2. The curved portion 11 is formed as an arc in the present example. The imaging region 4 in which photoelectric conversion units are arranged exists within the curved portion 11, and the concave curved surface of the curved portion 11 is the imaging surface 4a. The imaging chip 2 is supported by the base 21 by the flat surface 13 that extends from the peripheral edge of the curved portion 11 being fixed to the flat surface 25 of the base 21 by the adhesive layer described above or by vacuum contact.

The coil 65 is configured by a desired manner of coiling. In the present example, the coil 65 is configured by being coiled in a mortar shape, for example, and to have the curved portion 11 inserted therein. The mortar-shaped contour becomes a desired shape by which the curved portion 11 of a desired shape may be obtained when magnetic force is generated.

[Description of Operation]

Next, the operation of the solid-state imaging apparatus 1-10A will be described. An arc-like curved portion 11 that is curved in advance is formed using the difference in the thermal expansion coefficient between the imaging chip 2 and the base 21. A magnetic force is generated by running a desired electric current through the coil 65. At this time, the magnetic force that acts on each portion of the curved portion 11 differs according to the distance between each portion of the curved portion 11 after the curved portion 11 is formed and the coil 65. That is, if the distance is short, the magnetic force acts strongly and the curvature is increased, and if the distance is long, the magnetic force acts weakly and the degree of the curvature is decreased. For example, the shape of the curved portion 11 may be transformed to an elliptical shape or another desired shape other than an arc by increasing the curvature of the central portion of the curved portion compared to the surrounding portions, increasing the curvature of the surrounding portions of the curved portion 11 compared to the central portion, or the like. Therefore, by controlling how the magnetic force acts on each portion of the curved portion 11 using the manner in which the coil 65 is coiled, the curved portion 11 of a desired shape that is suited to the purpose is obtained.

Furthermore, when the electric current that flows through the coil 65 is controlled in a state in which the curved portion 11 of a desired shape is obtained, the curvature rate (equivalent to the curvature) of the curved portion 11 (therefore, the imaging surface 4a) may be arbitrarily changeable.

[Effects]

According to the solid-state imaging apparatus 1-10A of the first example according to embodiment 3-10, by selecting the manner of coiling the coil 65 (including the arrangement position of the coil 65) which acts on the curved portion 11 of the imaging chip 2, the curved portion 11 (therefore, the imaging surface 4a) may have the desired shape of curvature. The shape of curvature may, for example, be an ellipse or another shape other than an arc. Moreover, when the electric current that flows through the coil 65 is controlled, the curvature rate (equivalent to the curvature) of the curved portion 11 may be arbitrarily variably controlled to be within a desired range.

Similarly to embodiment 3-1, the solid-state imaging apparatus 1-10A is suited to being applied to an electronic apparatus such as a camera that includes a zoom lens. Further, control of the focus at the center and the surroundings of the image is also possible, and imaging that is suited to the purpose is possible. Furthermore, since only the central portion of the imaging chip 2 is three-dimensionally curved, an imaging chip 2 that includes a three-dimensional curved portion 11 is obtained without causing damage such as cracks.

[Configuration of Second Example]

Figure 40:
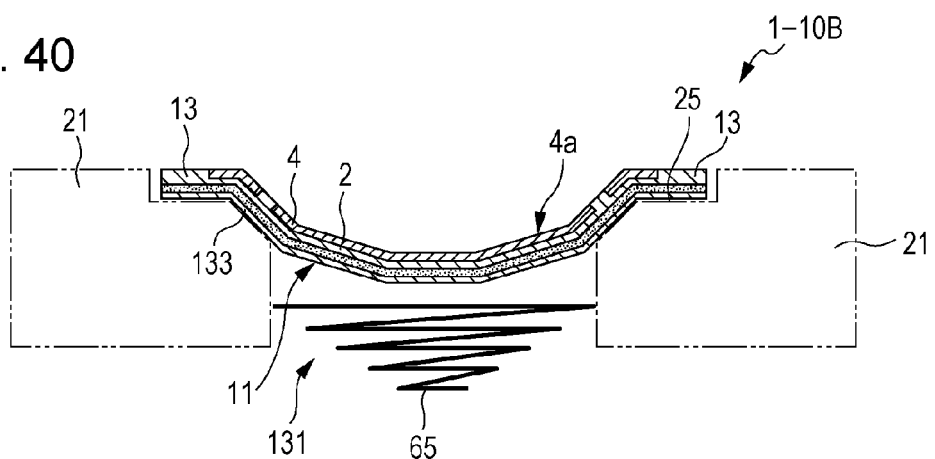
FIG. 40 is a schematic configuration diagram showing a second example of a solid-state imaging apparatus according to embodiment 3-10.

A solid-state imaging apparatus of a second example according to embodiment 3-10 is illustrated in FIG. 40. A solid-state imaging apparatus 1-10B is configured by the same mortar-shaped coil 65 as the first example being arranged at a position apart from the curved portion 11 of the imaging chip 2.

Since other configurations are the same as the solid-state imaging apparatus 1-10A of the first example, the same reference numerals are given to portions that correspond to FIG. 39 in FIG. 40 and overlapping description will be omitted.

[Description of Operation]

Since the operation of the solid-state imaging apparatus 1-10B of the second example is the same as the description of the solid-state imaging apparatus 1-10A of the first example described above, overlapping description will be omitted.

[Effects]

According to the solid-state imaging apparatus 1-10B of the second example according to embodiment 3-10, similarly to the first example, the curved portion 11 (imaging surface 4a) is able to have a desired shape of curvature by selecting the manner in which the coil 65 is coiled (including the arrangement position of the coil) which acts on the curved portion 11 of the imaging chip 2. The shape of the curvature may be, for example, an ellipse or another shape other than an arc. When the electric current that flows through the coil 65 is moreover controlled, the curvature rate (equivalent to the curvature) of the curved portion 11 may be arbitrarily controlled variably within a desired range.

Similarly to embodiment 3-1, the solid-state imaging apparatus 1-10B is suited to being applied to an electronic apparatus such as a camera that includes a zoom lens. Further, control of the focus at the center and the surroundings of the image is also possible, and imaging that is suited to the purpose is possible. Furthermore, since only the central portion of the imaging chip 2 is three-dimensionally curved, an imaging chip 2 that includes a three-dimensional curved portion 11 is obtained without causing damage such as cracks.

[Configuration of Third Example]

Figure 41:
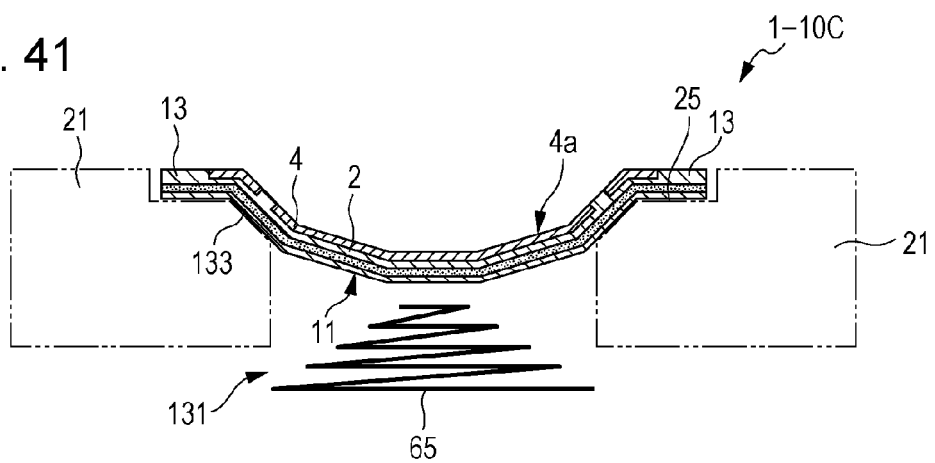
FIG. 41 is a schematic configuration diagram showing a third example of a solid-state imaging apparatus according to embodiment 3-10.

A solid-state imaging apparatus of a third example according to embodiment 3-10 is illustrated in FIG. 41. A solid-state imaging apparatus 1-10C is configured by making the manner in which the coil 65 is coiled a reverse mortar shape and arranging the coil 65 at a position that opposes the curved portion 11 of the imaging chip 2. The contour of the reverse mortar shape is a shape by which the curved portion 11 of a desired shape may be obtained when a magnetic force is generated.

Since other configurations are the same as the description of the first example, the same reference numerals are given to portions that correspond to FIG. 39 in FIG. 41 and overlapping description will be omitted.

[Description of Operation]

The operation of the solid-state imaging apparatus 1-10C of the third example is the same as the description of the solid-state imaging apparatus 1-10A of the first example described above. That is, by the magnetic force that acts on each portion of the curved portion 11 differing according to the distances between each corresponding portion of the curved portion 11 and the coil 65, the curved portion 11 of a desired shape that is suited to the purpose is obtained.

Furthermore, when the electric current that flows through the coil 65 is controlled in a state in which the curved portion 11 of a desired shape is obtained, the curvature rate (equivalent to the curvature) of the curved portion 11 (therefore, the imaging surface 4a) is arbitrarily changeable.

[Effects]

According to the solid-state imaging apparatus 1-10C of the third example according to embodiment 3-10, similarly to the first example, by selecting the manner of coiling the coil 65 (including the arrangement position of the coil) which acts on the curved portion 11 of the imaging chip 2, the curved portion 11 (imaging surface 4a) is able to have a desired shape of curvature. The shape of curvature may be an ellipse or another shape other than an arc. Moreover, when the electric current that flows through the coil 65 is controlled, the curvature rate (equivalent to the curvature) of the curved portion 11 is arbitrarily controlled variably within a desired range.

Similarly to embodiment 3-1, the solid-state imaging apparatus 1-10C is suited to being applied to an electronic apparatus such as a camera that includes a zoom lens. Further, control of the focus at the center and the surroundings of the image is also possible, and imaging that is suited to the purpose is possible. Furthermore, since only the central portion of the imaging chip 2 is three-dimensionally curved, an imaging chip 2 that includes a three-dimensional curved portion 11 is obtained without causing damage such as cracks.

[Configuration of Fourth Example]

Figure 42A:
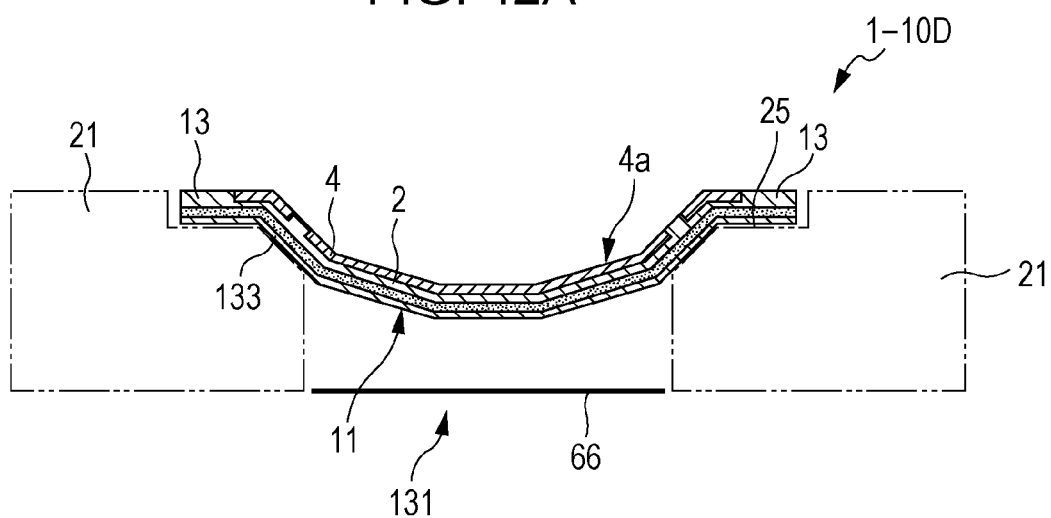
FIGS. 42A and 42B are a schematic configuration diagram and an upper surface view of a coil showing a fourth example of a solid-state imaging apparatus according to embodiment 3-10.
Figure 42B:
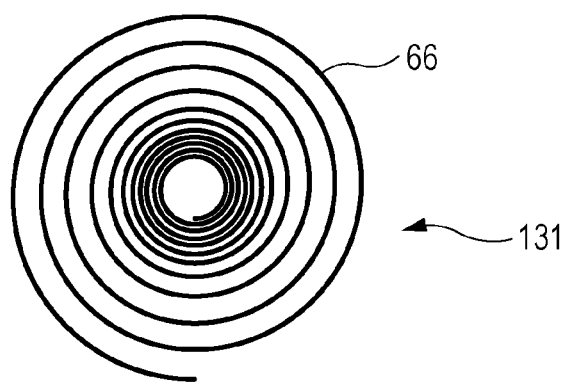

A solid-state imaging apparatus 1-10D of a fourth example according to embodiment 3-10 is illustrated in FIGS. 42A and 42B. A solid-state imaging apparatus 1-10D is configured by arranging a coil 66 that is coiled on a flat surface to oppose the curved portion 11 of the imaging chip 2. The coil 66 is configured to control the curvature rate (equivalent to the curvature) by curving the imaging surface 4a to a desired shape by coiling the coil 66 on a flat surface so that the coiling density becomes a desired density distribution. In FIG. 42B, the coil 66 is formed so that the coiling density at the center is large and the coiling density becomes smaller toward the surroundings. The distribution of the coiling density is not limited to the coiling distribution illustrated in FIG. 42B, and may be a desired coiling density distribution that is suited to the purpose. The coil 66 is also configured as the control unit 131 that variably controls the curvature rate described above.

Since other configurations are the same as the description of the first example, the same reference numerals are given to portions of FIG. 39 in FIGS. 42A and 42B and overlapping description will be omitted.

[Description of Operation]

Next, the operation of the solid-state imaging apparatus 1-10D will be described. An arc-like curved portion 11 that is curved in advance is formed using the difference in the thermal expansion coefficient between the imaging chip 2 and the base 21. A magnetic force is generated by running a desired electric current through the coil 66. At this time, the magnetic force that acts on each portion of the curved portion 11 differs according to the coiling density distribution of the coil 66, and the magnetic force is strong at portions with a high coiling density and weak at portions with a low coiling density. Therefore, the curvature of a desired shape is obtained for the curved portion 11 as a whole by the curvature of portions on which a strong magnetic force acts being increased and the degree of curvature of portions on which a weak magnetic force acts being weakened. For example, in FIGS. 42A and 42B, the curved portion 11 is curved to have a shape in which the degree of curvature at the central portion becomes high compared to the surroundings of the curved portion 11. The shape of the curved portion 11 may be transformed into an ellipse or another desired shape other than an arc. Therefore, by controlling how the magnetic force acts on each portion of the curved portion 11 by changing the density of the manner in which the coil 65 is coiled, that is, by configuring the coil 66 with the desired coiling density distribution, the curved portion 11 of a desired shape that is suited to the purpose is obtained.

Furthermore, when the electric current that flows through the coil 66 is controlled in a state in which the curved portion 11 of a desired shape is obtained, the curvature rate (equivalent to the curvature) of the curved portion 11 (therefore, the imaging surface 4a) is arbitrarily changeable.

[Effects]

According to the solid-state imaging apparatus 1-10D of the first example according to embodiment 3-10, by selecting a coiling density distribution of the coil 65 which acts on the curved portion 11 of the imaging chip 2, the curved portion 11 (therefore, the imaging surface 4a) is able to have a desired shape of curvature. The shape of curvature may be an ellipse or another shape other than an arc. Moreover, when the electric current that flows through the coil 66 is controlled, the curvature rate (equivalent to the curvature) of the curved portion 11 is arbitrarily controlled variably within a desired range.

Similarly to embodiment 3-1, the solid-state imaging apparatus 1-10D is suited to being applied to an electronic apparatus such as a camera that includes a zoom lens. Further, control of the focus at the center and the surroundings of the image is also possible, and imaging that is suited to the purpose is possible. Furthermore, since only the central portion of the imaging chip 2 is three-dimensionally curved, an imaging chip 2 that includes a three-dimensional curved portion 11 is obtained without causing damage such as cracks.

[Configuration of Fifth Example]

Although not shown, a solid-state imaging apparatus of a fifth example according to embodiment 3-10 is configured to use a coil in which the mortar shape described in the first to third examples and the configuration of the coil having a coiling density distribution as described in the fourth example are combined. According to the solid-state imaging apparatus of the fifth example, the shape of curvature of the curved portion 11 may be controlled with greater detail.

Next, with a solid-state imaging apparatus that controls the shape of the curvature of the curved portion 11 by a magnetic force (magnetic field) and that variably controls the curvature rate (equivalent to the curvature) using the magnetic force, it is desirable that the magnetic field not influence a silicon region in which the imaging region 4 and the peripheral circuits are formed.

Figure 43A:
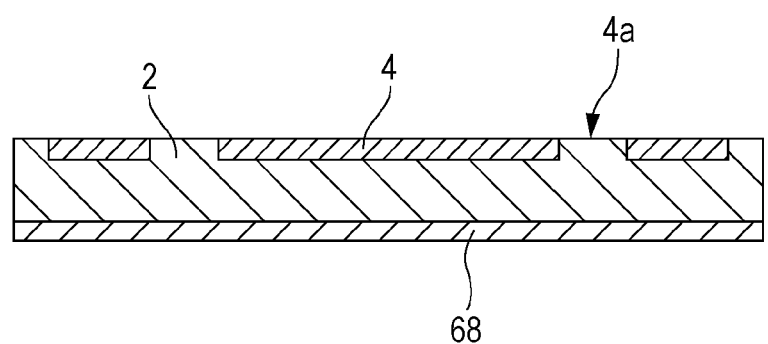
FIGS. 43A and 43B are schematic configuration diagrams showing another example of an imaging chip relating to the present embodiment.
Figure 43B:
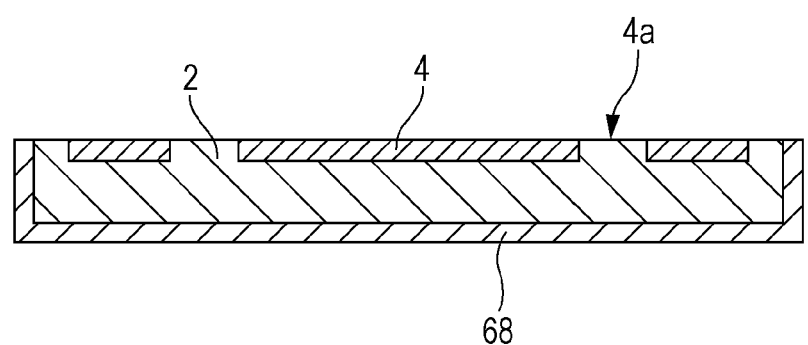

According to the present embodiment, as illustrated in FIG. 43A, a substrate back surface of the imaging chip 2 to the near side from the silicon region when viewed from at least the coils 65 and 66, the magnet 131-1, or the electromagnet 131-2 is configured to be covered by a metallic film 68.

Further, according to the present embodiment, as illustrated in FIG. 43A, a substrate back surface and a substrate side surface of the imaging chip 2 to the near side from the silicon region when viewed from at least the coils 65 and 66, the magnet 131-1, or the electromagnet 131-2 are configured to be covered by the metallic film 68.

Aluminum (Al), copper (Cu), tungsten (W), titanium (Ti), or another metallic film may be used as the metallic film 68.

By covering the back surface or the back surface and the side surface of the imaging chip 2 by the metallic film 68 in such a manner, it is possible to prevent the imaging chip from malfunctioning by the magnetic field from the coils 65 and 66, the magnet 131-1, or the electromagnet 131-2 not reaching the silicon region.

An imaging chip that includes an MOS type solid-state imaging element was applied in each of the embodiments described above. Otherwise, an imaging chip that includes a CCD type solid-state imaging element may also be applied. An imaging chip that includes a back surface irradiation type MOS solid-state imaging element is preferable as a large light receiving area may be secured and sensitivity is improved.

Embodiment

Embodiment of Electronic Apparatus

The solid-state imaging element according to an embodiment of the present disclosure described in each of the above embodiments may be applied to electronic apparatus such as camera systems such as digital cameras and video cameras, mobile phones having imaging functions, or other devices provided with imaging functions, for example.

Figure 44:
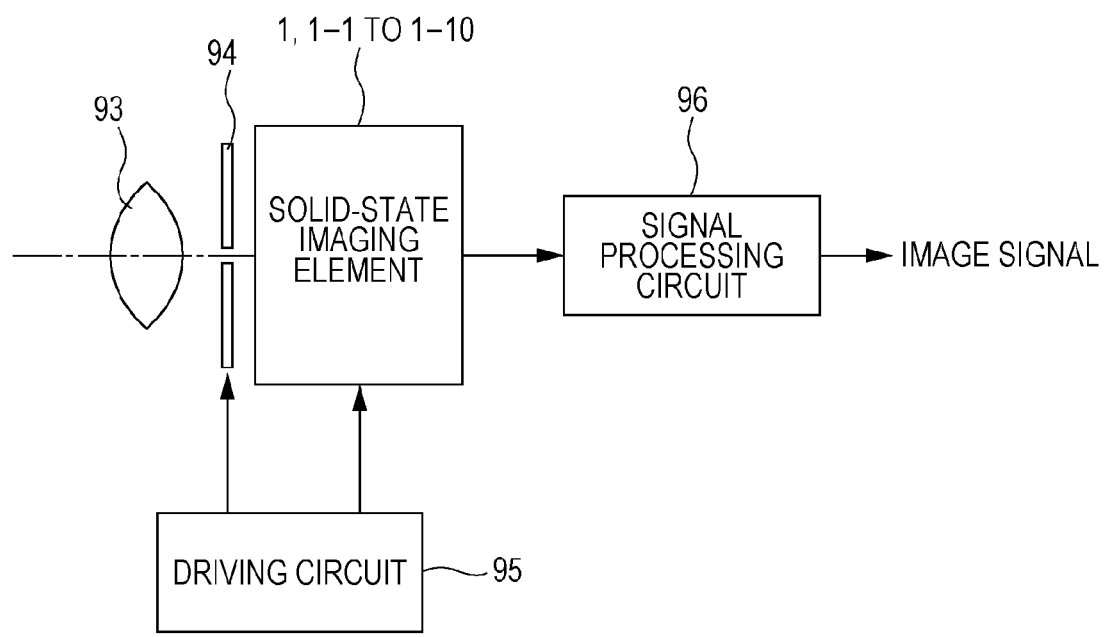
FIG. 44 is a configuration diagram of the electronic apparatus of the present disclosure.

FIG. 44 is a configurational diagram of a camera using a solid-state imaging element as an example of the electronic apparatus related to the present disclosure. The camera related to the example embodiment is exemplified as a video camera capable of capturing still images and moving images. The camera 91 of the embodiment example has a solid-state imaging element 1, an optical system 93 which guides incident light to a light-receiving sensor unit of the solid-state imaging element 1, a shutter device 94, a driving circuit 95 to drive the solid-state imaging element 1, and a signal processing circuit 96 to process an output signal of the solid-state imaging element 1.

Figure 45A:
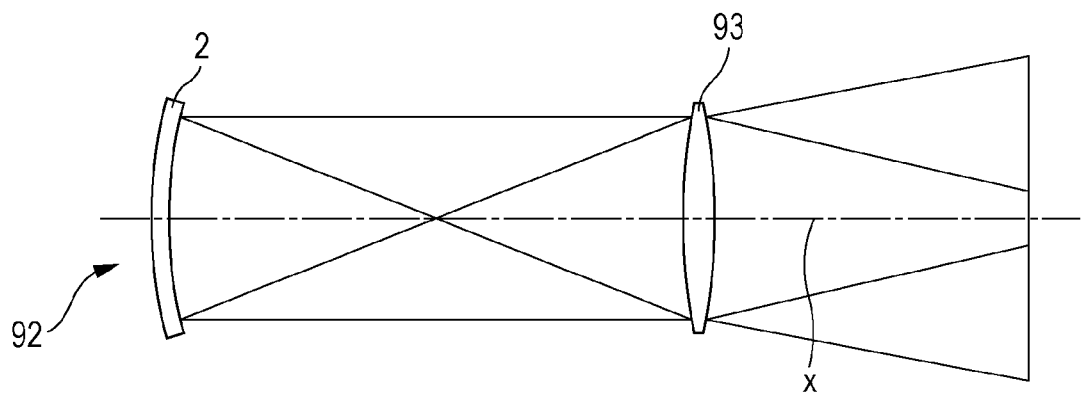
FIGS. 45A and 45B are explanatory diagrams of a zoom operation of the electronic apparatus relating to the present embodiment.
Figure 45B:
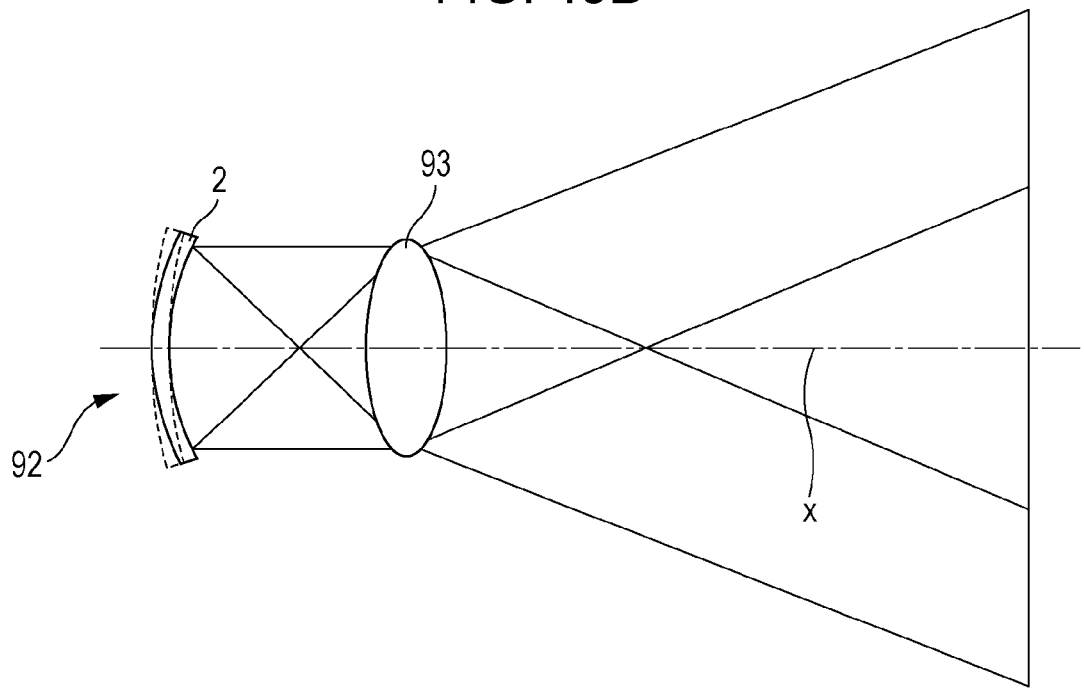

Regarding the solid-state imaging element 1, the solid-state imaging elements (1, 1-1 to 1-10 [1-10A to 1-10D]) provided with the three-dimensional curved portion described in each of the above-described embodiments are applied. The optical system 93 may be an optical lens system configured from a single lens or a plurality of lenses. Here, since the solid-state imaging elements (1, 1-1 to 1-10 [1-10A to 1-10D]) having the three-dimensional curved portion along the field curvature of the optical system 93 are used as the solid-state imaging element 1, the optical lenses configuring the optical system 93 may be few in number. The zoom action of the electronic apparatus according to the present embodiment will be described using FIGS. 45A and 45B. An optical system 73 is a so-called imaging lens, and may be configured by a zoom lens. In the solid-state imaging element 1, the optical system 93 is arranged at the concave surface side of the curved portion of the element chip provided with the imaging region, and has a configuration in which the concave surface of the curved portion of the element chip is arranged along the field curvature of the optical system 93. In this manner, the image light (incident light) from the subject is imaged on the imaging surface (imaging region) of the solid-state imaging element 1, and a signal charge of a set period is stored in the solid-state imaging element 1. The zoom lens is therefore able to be configured by a small number of optical lenses. Here, the optical lens system 73 may be configured by a zoom lens by a common lens group.

The shutter device 94 controls the light exposure period and light-shielded period in regard to the solid-state imaging element 1. The driving circuit 95 supplies a driving signal for controlling the transmission operation of the solid-state imaging element 1 and the shutter operation of the shutter device 94. The solid-state imaging element 1 performs signal transmission according to the driving signal (timing signal) supplied from the driving circuit 95. The signal processing circuit 96 performs various kinds of signal processing. The imaging signals upon which the signal processing is performed are stored in a storage medium such as a memory, or output to a monitor.

[Description of Operation]

The operation of the camera using a zoom lens as the optical lens system 73 will be described. As illustrated in FIG. 44, a desired optical lens 73a of the optical system 73 moves along an optical axis x according to wide angle capturing or telephotographic capturing. Here, a telephotographic lens (long focus distance) is represented by a thin lens since the incidence angle of the off-axis luminous flux of the subject light which is incident on the optical lens 73a is small (refractive index angle is small). A wide angle lens (short focus distance) is represented by a thick lens since the incidence angle of the off-axis luminous flux of the subject which is incident on an optical lens 93a is large (refractive index angle is large).

As illustrated in FIG. 44A, when the telephotographic lens is used with the desired optical lens apart from the imaging surface, since the incident angle of the subject light on an optical lens 93a is small, the field curvature is small. Therefore, the curvature of the imaging surface 4a is variably controlled to decrease to correspond to the field curvature of the optical lens system 93 via the control unit 131 for a solid-state imaging apparatus 92 in conjunction with the position of the optical lens 93a that has moved in a direction away from the imaging surface 4a. In so doing, the entirety of the imaging surface is imaged in a state of being in focus.

Further, as illustrated in FIG. 44B, when the desired optical lens 93a is brought near the imaging surface 4a and a wide angle lens is used, since the incident angle of the subject light on the optical lens 93a increases, the field curvature increases. Therefore, the curvature of the imaging surface 4a is variably controlled to increase (shown in the drawing by a solid line) to correspond to the field curvature of the optical lens system 93 via the control unit 131 for the solid-state imaging apparatus 92 in conjunction with the position of the optical lens 93a that has moved in a direction toward the imaging surface 4a. In so doing, the entirety of the imaging surface is imaged in a state of being in focus.

Further, for example, even when it is desired to performing image capturing such that an in-focus image is imaged at the center of the imaging surface and an out-of-focus image is imaged at the periphery, it is possible to do so by controlling the curvature of the imaging surface via the control unit. In so doing, capturing according to preferences is possible.

According to the electronic apparatus according to the embodiment described above, as described in the above embodiments 1-1 to 3-11, by the use of a solid-state imaging elements in which, even when a three-dimensional curved portion is provided, cracks are not generated, it is possible to promote an improvement in the reliability of the electronic apparatus using the solid-state imaging element.

[Effects]

Further, according to the electronic apparatus according to the embodiments, in a case when zoom capturing is made possible by including a zoom lens, imaging that is in focus across the entire imaging surface is possible particularly with a wide angle lens, and a high quality electronic apparatus may be provided. For example, it is possible to provide a camera in which image quality is improved.

In addition, the present disclosure may adopt the following configurations.

(1)

A method of manufacturing a solid-state imaging element including: manufacturing an element chip in which photoelectric conversion units are arranged on a main surface side; preparing a base configured using a material with an expansion coefficient greater than the element chip and having an opening of which the periphery of the opening is shaped as a flat surface; expanding the base by heating, mounting the element chip on the flat surface of the base in a state where the opening of the base is covered; and three-dimensionally curving a portion corresponding to the opening in the element chip by cooling and contracting the base in a state where the element chip is fixed to the flat surface of the expanded base.

(2)

The method of manufacturing a solid-state imaging element according to (1), in which fixing of the element chip corresponding to the flat surface of the expanded base is performed along an entire circumference of the opening.

(3)

The method of manufacturing a solid-state imaging element according to (1) or (2), in which, in the opening of the base, an opening shape of the flat surface side is circular.

(4)

The method of manufacturing a solid-state imaging element according to any one of (1) to (3), further including, on a main surface of the element chip, providing peripheral circuits at the periphery of an imaging region provided with the photoelectric conversion units, in which the imaging region is arranged within a range of the opening in the mounting of the element chip.

(5)

The method of manufacturing a solid-state imaging element according to any one of (1) to (4), further including: before the mounting of the element chip, filling uncured resin inside the opening, in which when the element chip is mounted on the flat surface of the base, the main surface side on which the photoelectric conversion units are arranged faces upward, and when the base is cooled and made to contract, the element chip is curved toward the opening side by volumetric contraction of the resin due to cooling.

(6)

The method of manufacturing a solid-state imaging element according to any one of (1) to (4), in which when the element chip is mounted on the flat surface of the base, the main surface side on which the photoelectric conversion units are arranged faces upward, and when the base is cooled and made to contract, the inside of the opening is sealed, gas inside the opening is cooled and made to volumetrically contract, whereby the element chip is curved toward the opening side.

(7)

The method of manufacturing a solid-state imaging element according to any one of (1) to (6), in which an opening of the base has a shape of which an opening diameter is widened toward a flat surface side on which the element chip is to be mounted.

(8)

The method of manufacturing a solid-state imaging element according to any one of (1) to (7), in which a flat surface of the base and the element chip are fixed by an adhesive agent interposed between the flat surface of the base and the element chip.

(9)

The method of manufacturing a solid-state imaging element according to any one of (1) to (7), in which a discharge groove communicating with an outside of the base is provided on a flat surface of the base, and in which when the element chip is fixed on the flat surface of the base, the element chip is vacuum-adsorbed to the flat surface of the base by suction from the discharge groove.

(10)

The method of manufacturing a solid-state imaging element according to any one of (1) to (7), further including, in the element chip, arranging a chip side electrode on a surface facing the base; and arranging a base side electrode on a flat surface of the base, in which when the element chip is fixed on the flat surface of the base, the chip side electrode and the base side electrode are connected by interposing an anisotropic conductive adhesive agent between the flat surface of the base and the element chip.

(11)

A solid-state imaging element including an element chip having a curved portion curved three-dimensionally and a flat portion extended from a peripheral edge of the curved portion; and photoelectric conversion units arranged on a concave surface side of the curved portion in the element chip.

(12)

The solid-state imaging element according to (11), in which the flat portion in the element chip is arranged on an entire circumference of the curved portion in the element chip and has a coplanar configuration.

(13)

The solid-state imaging element according to (11) or (12), in which the bottom surface of the curved portion is circular.

(14)

The solid-state imaging element according to any one of (11) to (13), in which, in the element chip, peripheral circuits are arranged at the periphery of the imaging region in which photoelectric conversion units are arranged.

(15)

The solid-state imaging element according to any one of (11) to (14), further including a base configured using a material with an expansion coefficient greater than the element chip, and having an opening in which the periphery of the opening is shaped as a flat surface, in which in a state where a curved portion of the element chip is inserted in the opening of the base, the flat portion of the element chip is fixed to the flat surface of the base.

(16)

The solid-state imaging element according to (15), in which resin is filled in the opening of the base.

(17)

The solid-state imaging element according to (15) or (16), in which the opening of the base has a shape in which an opening diameter is widened toward a flat surface side on which the element chip is to be mounted.

(18)

The solid-state imaging element according to any one of (15) to (17), in which an adhesive agent is interposed between the flat surface of the base and the element chip.

(19)

The solid-state imaging element according to any one of (15) to (17), further including, in the element chip, a chip side electrode arranged on a surface facing the base; and a base side electrode arranged on the flat surface of the base, in which an anisotropic conductive adhesive agent which connects the chip side electrode and the base side electrode is interposed between the flat surface of the base and the element chip.

(20)

An electronic apparatus including: an element chip having a curved portion curved three-dimensionally and a flat portion extended from a peripheral edge of the curved portion; photoelectric conversion units arranged on a concave surface side of the curved portion in the element chip; and an optical system guiding incident light to the photoelectric conversion units.

Here, the present technique may adopt the following configurations.

(1)

A method of manufacturing a solid-state imaging element including: manufacturing an element chip in which photoelectric conversion units are arranged on a main surface side; preparing a base having an opening of which the periphery of the opening is shaped as a flat surface; mounting the element chip on the flat surface of the base in a state where the opening of the base is covered and the main surface in which the photoelectric conversion units are arranged faces upward; and three-dimensionally curving the element chip toward the opening side by volumetrically contracting the inside of the opening of the base covered by the element chip in a state where the element chip is fixed to the flat surface of the base.

(2)

The method of manufacturing a solid-state imaging element according to (1), in which fixing of the element chip corresponding to the flat surface of the expanded base is performed along an entire circumference of the opening.

(3)

The method of manufacturing a solid-state imaging element according to (1) or (2), in which, in the opening of the base, an opening shape of the flat surface side is circular.

(4)

The method of manufacturing a solid-state imaging element according to any one of (1) to (3), further including, on a main surface of the element chip, providing peripheral circuits at the periphery of an imaging region provided with the photoelectric conversion units, in which the imaging region is arranged within a range of the opening in the mounting of the element chip.

(5)

The method of manufacturing a solid-state imaging element according to any one of (1) to (4), further including: filling uncured resin inside the opening before the mounting of the element chip on the flat surface of the base, and making the uncured resin filled inside the opening contract by curing when the inside of the opening is made to volumetrically contract.

(6)

The method of manufacturing a solid-state imaging element according to any one of (1) to (4), in which gas from inside the opening is discharged when the inside of the opening is made to volumetrically contract.

(7)

The method of manufacturing a solid-state imaging element according to (6), in which the inner wall of the opening is formed as a three-dimensionally curved concave curved surface and the element chip three-dimensionally curved toward the opening side is fixed to the concave curved surface by an adhesive agent interposed between the element chip and the concave curved surface.

(8)

The method of manufacturing a solid-state imaging element according to any one of (1) to (7), in which the opening of the base has a shape in which the opening diameter is widened toward the flat surface side on which the element chip is mounted.

(9)

The method of manufacturing a solid-state imaging element according to any one of (1) to (8), further including: on a flat surface of the base, providing a discharge groove communicating with an outside of the base, in which when the element chip is fixed on the flat surface of the base, the element chip is vacuum-adsorbed to the flat surface of the base by suction from the discharge groove.

(10)

The method of manufacturing a solid-state imaging element according to any one of (1) to (8), further including, in the element chip, arranging a chip side electrode on a surface facing the base; and arranging a base side electrode on a flat surface of the base, in which when the element chip is fixed on the flat surface of the base, the chip side electrode and the base side electrode are connected by interposing an anisotropic conductive adhesive agent between the flat surface of the base and the element chip.

(11)

A solid-state imaging element including: a base having an opening and in which the periphery of the opening is shaped as a flat surface, an element chip having a curved portion in which the portion corresponding to the opening is curved three-dimensionally toward the opening side and a flat portion extended from a peripheral edge of the curved portion and supported by the flat surface of the base; and photoelectric conversion units arranged on a concave surface side of the curved portion in the element chip.

(12)

The solid-state imaging element according to (11), in which the flat portion in the element chip is arranged on an entire circumference of the curved portion in the element chip and has a coplanar configuration.

(13)

The solid-state imaging element according to (11) or (12), in which the bottom surface of the curved portion is circular.

(14)

The solid-state imaging element according to any one of (11) to (13), in which, in the element chip, peripheral circuits are arranged at the periphery of the imaging region in which photoelectric conversion units are arranged.

(15)

The solid-state imaging element according to any one of (11) to (14), in which resin is filled into the opening of the base.

(16)

The solid-state imaging element according to any one of (11) to (15), in which the opening of the base has a shape in which an opening diameter is widened toward a flat surface side on which the element chip is to be mounted.

(17)

The solid-state imaging element according to any one of (11) to (16), in which the inner wall of the opening in the base is formed as a concave curved surface curved three-dimensionally and the element chip made to curve three-dimensionally toward the opening side is fixed to the concave curved surface by an adhesive agent interposed between the element chip and the concave curved surface.

(18)

The solid-state imaging element according to any one of (11) to (16), further including, in the element chip, a chip side electrode arranged on a surface facing the base; and a base side electrode arranged on the flat surface of the base, in which an anisotropic conductive adhesive agent which connects the chip side electrode and the base side electrode is interposed between the flat surface of the base and the element chip.

(19)

An electronic apparatus including: a base having an opening and in which the periphery of the opening is shaped as a flat surface; an element chip having a curved portion in which the portion corresponding to the opening is curved three-dimensionally toward the opening side and a flat portion extended from a peripheral edge of the curved portion and supported by the flat surface of the base; photoelectric conversion units arranged on a concave surface side of the curved portion in the element chip; and an optical system guiding incident light to the photoelectric conversion units.

(1)

A solid-state imaging apparatus including: a solid-state imaging chip having a curved portion which is curved, an imaging region in which an imaging surface in the curved portion is set as a concave curved surface and photoelectric conversion units are arranged, and a fixed flat portion extending from the peripheral edge of the curved portion; and a control unit variably controlling the curvature of the imaging surface.

(2)

The solid-state imaging apparatus according to (1), in which the flat portion in the solid-state imaging chip is arranged on a whole circumference of the curved portion in the element chip and has a coplanar configuration.

(3)

The solid-state imaging apparatus according to (2), in which, in the solid-state imaging chip, peripheral circuits are arranged in the periphery of the imaging region in which photoelectric conversion units are arranged.

(4)

The solid-state imaging apparatus according to (3) further including: a base supporting the solid-state imaging chip having an opening toward which a curved portion bulges in the solid-state imaging chip, and a flat surface to which the flat portion extending from the curved portion is fixed.

(5)

The solid-state imaging apparatus according to (4) further including: a magnetic film formed on the surface of the opposite side to the imaging surface of the solid-state imaging chip; and a control unit using a magnetic force generation apparatus arranged opposite the curved portion facing the opening of the base, in which the curvature of the imaging surface is controlled by controlling the magnetic force given to the magnetic film from the control unit.

(6)

The solid-state imaging apparatus according to (4) further including: a control unit using a suction apparatus arranged in communication with the opening of the base, in which the curvature of the imaging surface is controlled by controlling the suction force from the control unit.

(7)

The solid-state imaging apparatus according to (4) further including: an adhesive poured inside the opening and having a contracting property for adhering the solid-state imaging chip; and a control unit using a heating apparatus, in which the curvature of the imaging surface is controlled by controlling the volumetric contraction of the adhesive according to control of the heating temperature of the control unit.

(8)

A solid-state imaging apparatus including: a solid-state imaging chip having an imaging region which has an imaging surface controlled to curve and in which photoelectric conversion units are arranged, and a fixed flat portion extending from the peripheral edge of a region that becomes a curved portion controlled to curve; and a control unit variably controlling the curvature (including an infinitesimal curvature) of the imaging region, in which the imaging region is variably controlled by the control unit from a flat state to a curved state having a target curvature.

(9)

An electronic apparatus including: a solid-state imaging apparatus; an optical lens system guiding incident light to photoelectric conversion units of the solid-state imaging apparatus; and a signal processing circuit processing an output signal of the solid-state imaging apparatus, in which the solid-state imaging apparatus is configured to include a solid-state imaging chip having a curved portion which is curved, an imaging surface of a concave curved surface inside the curved portion, and a flat portion extending from the peripheral edge of the curved portion, and a control unit variably controlling the curvature of the imaging surface, and the curvature of the imaging surface is variably controlled together with the variable movement of a target optical lens in the optical lens system.

(10)

The electronic apparatus according to (9), in which the flat portion of the solid-state imaging chip is arranged at the entire circumference of the curved portion and has a coplanar configuration.

(11)

The electronic apparatus according to (10), in which, in the solid-state imaging chip, peripheral circuits are arranged at the periphery of the imaging region having the imaging surface and in which photoelectric conversion units are arranged.

(12)

The electronic apparatus according to (11), further including: a base supporting the solid-state imaging chip having an opening toward which a curved portion bulges in the solid-state imaging chip, and a flat surface to which the flat portion extending from the curved portion is fixed.

(13)

The electronic apparatus according to (12), further including: a magnetic film formed on the surface of the opposite side to the imaging surface of the solid-state imaging chip; and a control unit using a magnetic force generation apparatus arranged opposite the curved portion facing the opening of the base, in which the curvature of the imaging surface is controlled by controlling the magnetic force given to the magnetic film from the control unit.

(14)

The electronic apparatus according to (12), further including: a control unit using a suction apparatus arranged in communication with the opening of the base, in which the curvature of the imaging surface is controlled by controlling the suction force from the control unit.

(15)

The electronic apparatus according to (12), further including: an adhesive poured inside the opening and having a contracting property for adhering the solid-state imaging chip; and a control unit using a heating apparatus, in which the curvature of the imaging surface is controlled by controlling the volumetric contraction of the adhesive according to control of the heating temperature of the control unit.

(16)

An electronic apparatus including: a solid-state imaging apparatus; an optical lens system guiding incident light to photoelectric conversion units of the solid-state imaging apparatus; and a signal processing circuit processing an output signal of the solid-state imaging apparatus, in which the solid-state imaging apparatus is configured so as to include a solid-state imaging chip having an imaging region which has an imaging surface controlled to curve and in which photoelectric conversion units are arranged, and a fixed flat portion extending from the peripheral edge of a region that becomes a curved portion controlled to curve; and a control unit variably controlling the curvature (including an infinitesimal curvature) of the imaging region, and so that the imaging region is variably controlled by the control unit from a flat state to a curved state having a target curvature, and in which the curvature of the imaging surface is variably controlled together with the variable movement of a target optical lens in the optical lens system.

The present disclosure contains subject matter related to that disclosed in Japanese Priority Patent Application JP 2011-043015 filed in the Japan Patent Office on Feb. 28, 2011, Japanese Priority Patent Application JP 2011-042447 filed in the Japan Patent Office on Feb. 28, 2011, and Japanese Priority Patent Application JP 2011-043014 filed in the Japan Patent Office on Feb. 28, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a solid-state imaging element comprising:
    manufacturing an element chip in which photoelectric conversion units are arranged on a main surface side;
    preparing a base configured using a material with an expansion coefficient greater than the element chip and having an opening of which a periphery of the opening is shaped as a flat surface;
    mounting the element chip on the flat surface of the base in a state where the opening of the base is covered; and
    three-dimensionally curving a portion corresponding to the opening in the element chip by cooling and contracting the base in a state where the element chip is fixed to the flat surface of the expanded base.

2. The method of manufacturing a solid-state imaging element according to claim 1, further comprising:
    expanding the base by heating.

3. The method of manufacturing a solid-state imaging element according to claim 2, further comprising:
    before the mounting of the element chip, filling uncured resin inside the opening,
    wherein when the element chip is mounted on the flat surface of the base, the main surface side on which the photoelectric conversion units are arranged faces upward, and
    when the base is cooled and made to contract, the element chip is curved toward the opening side by curing and contraction of the resin.

4. The method of manufacturing a solid-state imaging element according to claim 2, wherein
    when the element chip is mounted on the flat surface of the base, the main surface side on which the photoelectric conversion units are arranged faces upward, and
    when the base is cooled and made to contract, the inside of the opening is sealed, gas inside the opening is cooled and made to volumetrically contract, whereby the element chip is curved toward the opening side.

5. The method of manufacturing a solid-state imaging element according to claim 1, further comprising:
    on a flat surface of the base, providing a discharge groove communicating with an outside of the base,
    wherein when the element chip is fixed on the flat surface of the base, the element chip is vacuum-adsorbed to the flat surface of the base by suction from the discharge groove.

6. The method of manufacturing a solid-state imaging element according to claim 1, further comprising:
    three-dimensionally curving the element chip toward the opening side by volumetrically contracting the inside of the opening of the base blocked by the element chip in a state where the element chip is fixed to the flat surface of the base.

7. The method of manufacturing a solid-state imaging element according to claim 1, wherein gas from inside the opening is discharged when the inside of the opening is made to volumetrically contract.

8. The method of manufacturing a solid-state imaging element according to claim 6, wherein the inner wall of the opening is formed as a concave curved surface curved three-dimensionally and the element chip made to curve three-dimensionally toward the opening side is fixed to the concave curved surface by an adhesive agent interposed between the element chip and the concave curved surface.

9. The method of manufacturing a solid-state imaging element according to claim 1,
    wherein a discharge groove communicating with an outside of the base is provided on a flat surface of the base, and
    when the element chip is fixed on the flat surface of the base, the element chip is vacuum-adsorbed to the flat surface of the base by suction from the discharge groove.

10. The solid-state imaging element according to claim 1, further comprising:
    a control unit using a suction apparatus arranged in communication with the opening of the base,
    wherein the curvature of the imaging surface is controlled by controlling the suction force from the control unit.

* * * * *